(12) United States Patent
Gardner et al.

(10) Patent No.: US 11,610,993 B2
(45) Date of Patent: Mar. 21, 2023

(54) 3D SEMICONDUCTOR APPARATUS MANUFACTURED WITH A PLURALITY OF SUBSTRATES AND METHOD OF MANUFACTURE THEREOF

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 181 days.

(21) Appl. No.: 17/062,142

(22) Filed: Oct. 2, 2020

(65) Prior Publication Data

US 2021/0175358 A1 Jun. 10, 2021

Related U.S. Application Data

(60) Provisional application No. 62/944,950, filed on Dec. 6, 2019.

(51) Int. Cl.
*H01L 29/78* (2006.01)
*H01L 29/66* (2006.01)
*H01L 23/00* (2006.01)

(52) U.S. Cl.
CPC .......... *H01L 29/7848* (2013.01); *H01L 24/20* (2013.01); *H01L 29/66053* (2013.01)

(58) Field of Classification Search
CPC . H01L 24/20; H01L 21/823871; H01L 25/50; H01L 21/8221; H01L 27/0688
See application file for complete search history.

(56) References Cited

U.S. PATENT DOCUMENTS 6,506,664 B1 * 1/2003 Beyne ................. H01L 23/5385
438/458
8,461,017 B2 6/2013 Sadaka et al.
(Continued)

FOREIGN PATENT DOCUMENTS

KR 10-2016-0134471 A 11/2016

OTHER PUBLICATIONS

International Search Report and Written Opinion dated Mar. 3, 2021 in PCT/US2020/059862, 11 pages.

*Primary Examiner* — Didarul A Mazumder
*Assistant Examiner* — Wasiul Haider
(74) *Attorney, Agent, or Firm* — Oblon, McClelland, Maier & Neustadt, L.L.P.

(57) ABSTRACT

Aspects of the disclosure provide a method of forming a semiconductor apparatus including a first portion and a second portion. The first portion is formed on a first substrate and includes at least one first semiconductor device. The second portion is formed on a second substrate including a bulk substrate material and includes at least one second semiconductor device. A carrier substrate is attached to the second portion. The bulk substrate material is removed from the second substrate. The first portion and the second portion are bonded to form the semiconductor apparatus where the at least one second semiconductor device is stacked above the at least one first semiconductor device along a Z direction substantially perpendicular to a substrate plane of the first substrate. The at least one first semiconductor device and the at least one second semiconductor device are positioned between the carrier substrate and the first substrate.

20 Claims, 60 Drawing Sheets

(56) References Cited

U.S. PATENT DOCUMENTS

| | | |
|---|---|---|
| 8,525,342 B2 | 9/2013 | Chandrasekaran et al. |
| 8,802,538 B1 | 8/2014 | Liu et al. |
| 8,912,043 B2 | 12/2014 | Chandrasekaran et al. |
| 9,041,214 B2 | 5/2015 | Sadaka et al. |
| 9,553,014 B2 | 1/2017 | Sadaka et al. |
| 9,728,453 B2 | 8/2017 | Tseng et al. |
| 9,962,919 B2 | 5/2018 | Tang et al. |
| 9,991,150 B2 | 6/2018 | Tang |
| 10,510,597 B2 | 12/2019 | Tseng et al. |
| 10,734,412 B2 | 8/2020 | Glass et al. |
| 2011/0248403 A1 | 10/2011 | Chandrasekaran et al. |
| 2012/0013013 A1 | 1/2012 | Sadaka et al. |
| 2013/0119469 A1* | 5/2013 | Iwamatsu ............ H01L 27/1116 257/E27.06 |
| 2013/0256907 A1 | 10/2013 | Sadaka et al. |
| 2013/0302943 A1 | 11/2013 | Chandrasekaran et al. |
| 2014/0273347 A1 | 9/2014 | Tseng et al. |
| 2015/0228535 A1 | 8/2015 | Sadaka et al. |
| 2016/0167358 A1 | 6/2016 | Tang et al. |
| 2016/0332436 A1 | 11/2016 | Tang et al. |
| 2017/0018450 A1 | 1/2017 | Tang |
| 2017/0338150 A1 | 11/2017 | Tseng et al. |
| 2018/0040649 A1* | 2/2018 | Dayeh .................... H01L 31/042 |
| 2019/0015731 A1 | 5/2019 | Glass et al. |
| 2019/0287868 A1* | 9/2019 | Zelikson ............. H01L 23/5286 |

\* cited by examiner

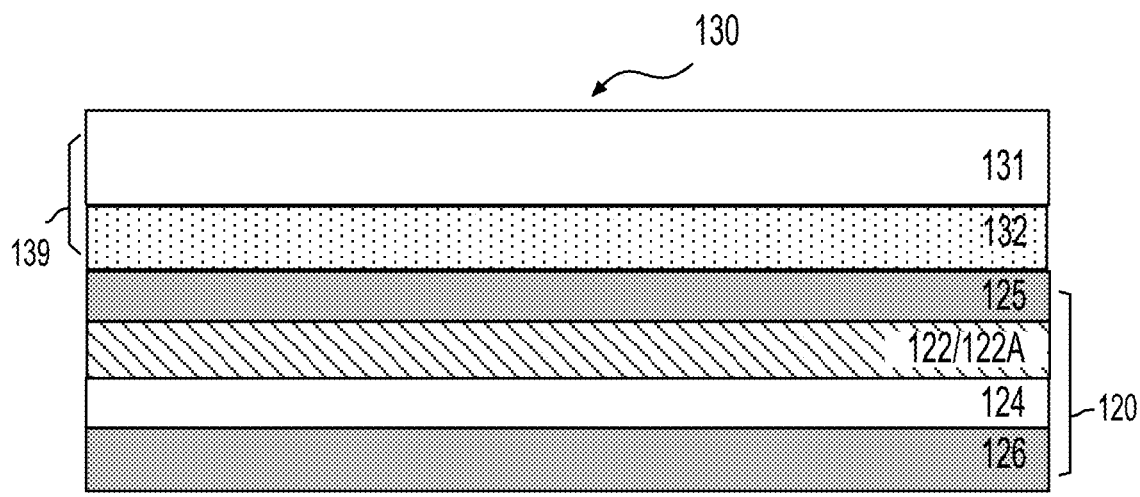
FIG. 9
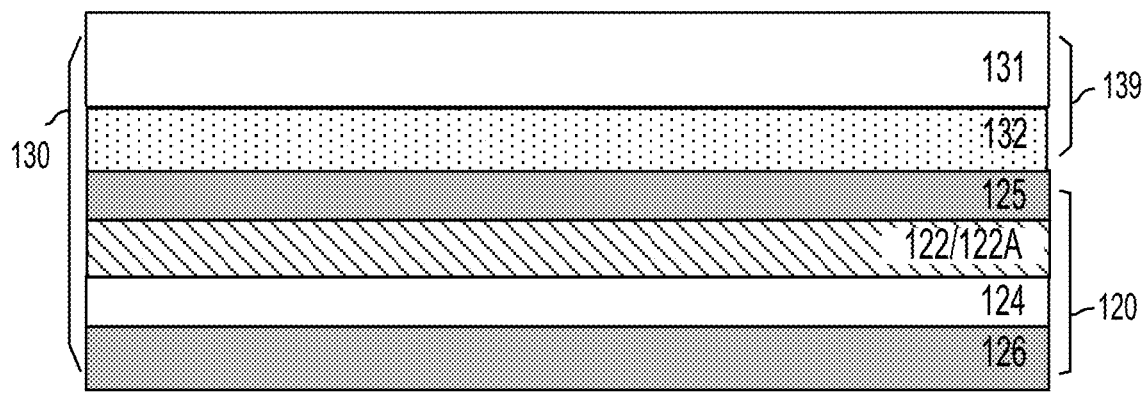
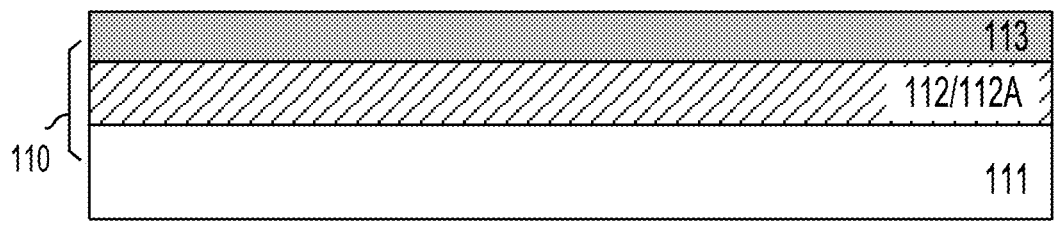
FIG. 10

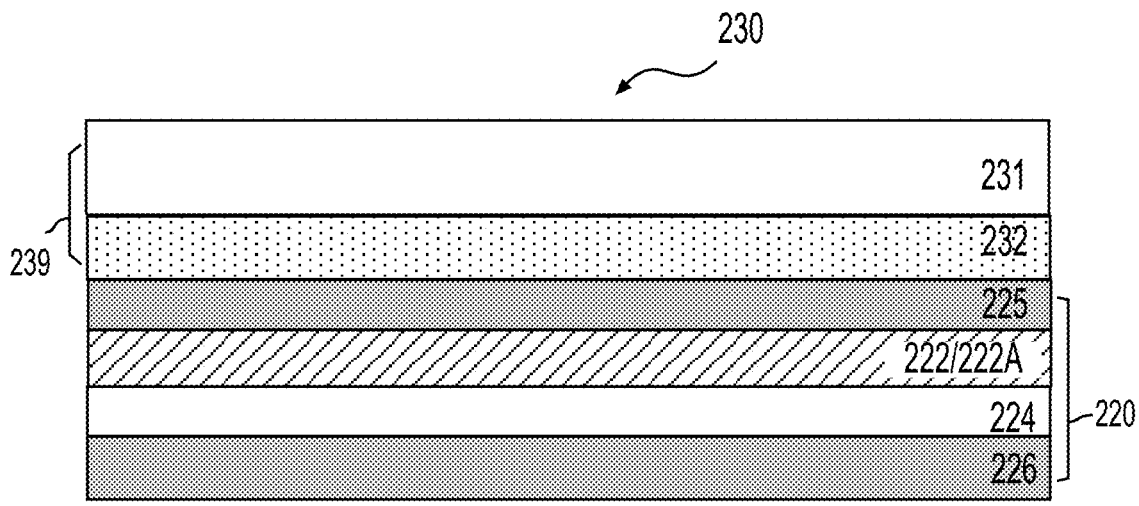
FIG. 23
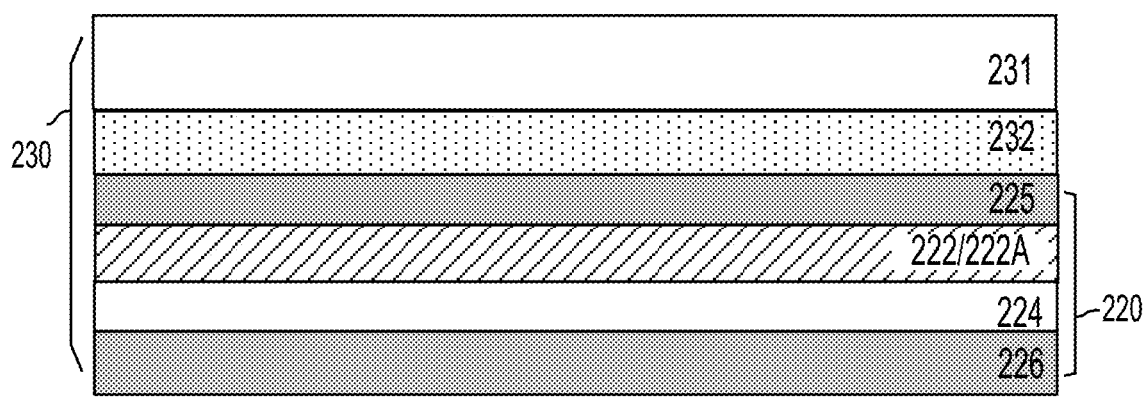
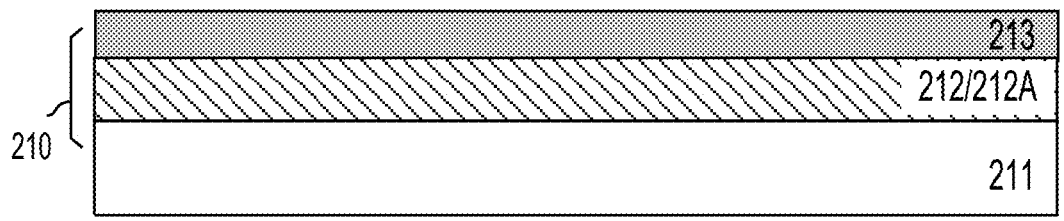
FIG. 24

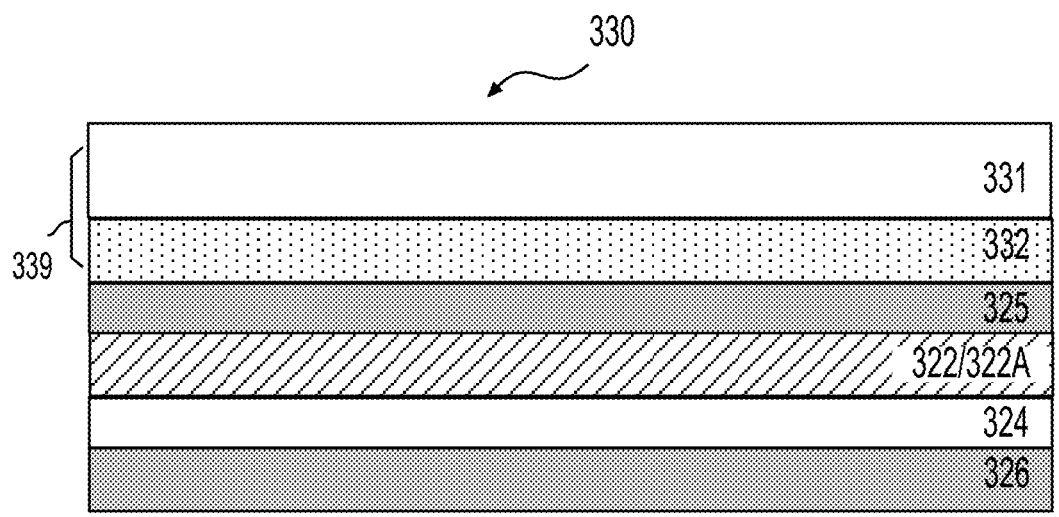
FIG. 36
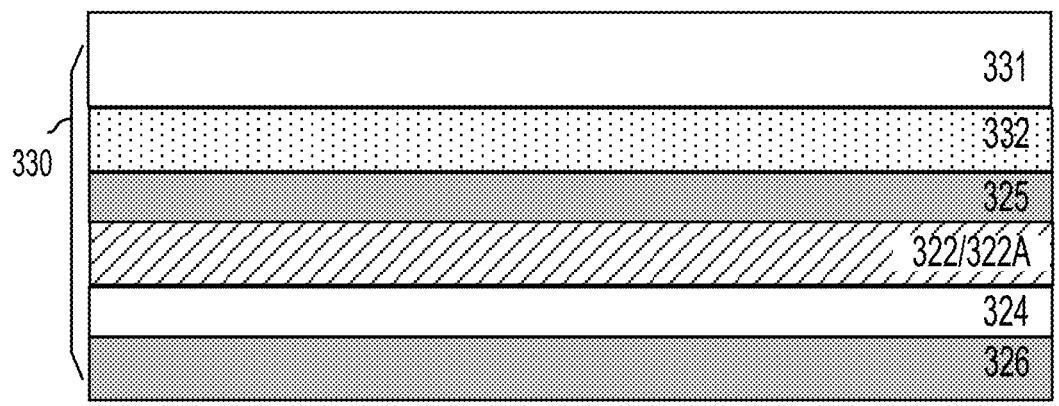
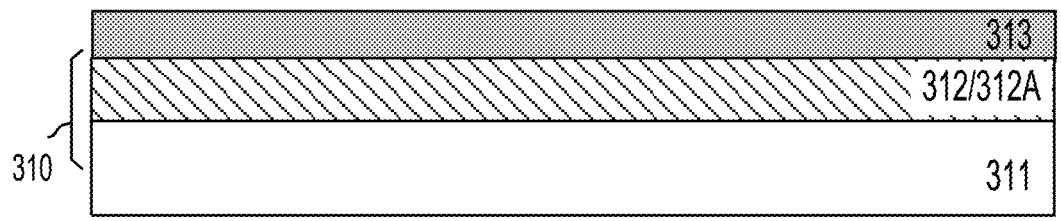
FIG. 37

3D SEMICONDUCTOR APPARATUS MANUFACTURED WITH A PLURALITY OF SUBSTRATES AND METHOD OF MANUFACTURE THEREOF

INCORPORATION BY REFERENCE

This present disclosure claims the benefit of U.S. Provisional Application No. 62/944,950, "High Performance 3D CMOS Device Architecture Using a Plurality of High-Mobility Substrates and Nano Sheets" filed on Dec. 6, 2019, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor devices are widely used in various electronic apparatuses, such as smart phones, computers, and the like. In general, a semiconductor device can include a substrate having active devices such as transistors, capacitors, inductors and other components. There is an ever increasing demand for smaller and faster semiconductor devices which are simultaneously able to support a greater number of increasingly complex and sophisticated functions. This scaling down process generally provides benefits by increasing production efficiency and lowering associated costs. Nevertheless, such scaling down has also increased the complexity of processing and manufacturing of the semiconductor devices. As dimensions of semiconductor devices scale to smaller sub-micron sizes in advanced technology nodes, it becomes more challenging to increase the density of semiconductor devices. Improved structures and methods for manufacturing same are desired.

This disclosure relates to integrated circuits and the fabrication of microelectronic devices. In the manufacture of a semiconductor device (especially on a microscopic scale), various fabrication processes (e.g., film-forming depositions, etch mask creation, patterning, material etching and removal, and doping treatments) can be executed. The fabrication processes can be performed repeatedly to form desired semiconductor device elements on a substrate. In some embodiments, with microfabrication, transistors can be created in one plane (e.g., an active device plane), with wiring/metallization formed above the active device plane, and thus can be characterized as two-dimensional (2D) circuits and the fabrication process can be characterized as a 2D fabrication. Scaling efforts have increased a number of transistors per unit area in 2D circuits. As dimensions of semiconductor devices scale to smaller sub-micron sizes in advanced technology nodes, improved structures and methods for manufacturing same are desired.

SUMMARY

Aspects of the disclosure provide a method of forming a semiconductor apparatus. A first portion of the semiconductor apparatus can be formed on a first substrate where the first portion can include at least one first semiconductor device. A second portion of the semiconductor apparatus can be formed on a second substrate where the second portion can include at least one second semiconductor device and the second substrate can include a bulk substrate material. A carrier substrate can be attached to the second portion of the semiconductor apparatus where the at least one second semiconductor device can be positioned between the carrier substrate and the second substrate. The bulk substrate material can be removed from the second substrate. The first portion and the second portion can be bonded to form the semiconductor apparatus where the at least one second semiconductor device can be stacked above the at least one first semiconductor device along a Z direction that is substantially perpendicular to a substrate plane of the first substrate. The at least one first semiconductor device and the at least one second semiconductor device can be positioned between the carrier substrate and the first substrate.

In an embodiment, the first portion is formed on the first substrate of a first wafer and the second portion is formed on the second substrate of a second wafer where the second wafer is different from the first wafer and the second substrate is different from the first substrate. In an example, the at least one first semiconductor device includes a first stack of one of NMOS devices and PMOS devices stacked along the Z direction and first channel regions in the first stack are formed by a first epitaxial growth. The at least one second semiconductor device includes a second stack of another one of the NMOS devices and the PMOS devices stacked along the Z direction. Second channel regions in the second stack are formed by a second epitaxial growth that is different from the first epitaxial growth.

In an embodiment, the carrier substrate further includes a dielectric layer. The dielectric layer in the carrier substrate is attached to the second portion.

In an embodiment, a first wiring layer is formed over the at least one second semiconductor device where the at least one second semiconductor device is positioned between the second substrate and the first wiring layer. The carrier substrate is attached to the first wiring layer in the second portion.

In an embodiment, the second substrate further includes a dielectric layer stacked on the bulk substrate material. A second wiring layer is formed from the dielectric layer in the second substrate. After bonding the first portion and the second portion to form the semiconductor apparatus, the carrier substrate is removed. In an example, a third wiring layer is formed over the at least one first semiconductor device where the at least one first semiconductor device is between the third wiring layer and the first substrate. The second wiring layer and the third wiring layer are bonded. In an example, one of the second wiring layer and the third wiring layer includes a power rail.

In an embodiment, the first substrate includes a first layer of a first single crystal semiconductor material stacked on a dielectric layer. The at least one first semiconductor device is formed over the first layer of the first single crystal semiconductor material that is silicon (Si) or silicon carbide (SiC).

In an embodiment, the second substrate further includes a second layer of a second single crystal semiconductor material stacked on a dielectric layer that is on the bulk substrate material. The at least one second semiconductor device is formed over the second layer of the second single crystal semiconductor material that is Si, SiC, germanium (Ge), or silicone germanium (SiGe).

In an embodiment, the at least one first semiconductor device includes one of a NMOS device and a PMOS device. The at least one second semiconductor device includes another one of the NMOS device and the PMOS device. A first channel region in the at least one first semiconductor device is formed by a first epitaxial growth. A second channel region in the at least one second semiconductor device is formed by a second epitaxial growth that is different from the first epitaxial growth.

In an embodiment, the at least one first semiconductor device includes a NMOS device. The at least one second semiconductor device includes a PMOS device. The carrier substrate further includes a dielectric layer. A first channel region in the at least one first semiconductor device is formed by a first epitaxial growth. A third wiring layer is formed over the at least one first semiconductor device where the at least one first semiconductor device is positioned between the third wiring layer and the first substrate. A second channel region in the at least one second semiconductor device is formed by a second epitaxial growth that is different from the first epitaxial growth. A first wiring layer is formed over the at least one second semiconductor device where the at least one second semiconductor device is positioned between the second substrate and the first wiring layer. The dielectric layer in the carrier substrate is attached to the first wiring layer in the second portion. The second wiring layer is positioned in contact with the third wiring layer to align the at least one first semiconductor device with the at least one second semiconductor device. The first portion and the second portion are bonded at an interface between the second wiring layer and the third wiring layer.

In an example, the first substrate includes a bulk substrate material that is Si. The at least one second semiconductor device is formed over a layer of single crystal Si where the second substrate further includes the layer of the single crystal Si stacked over the dielectric layer in the second substrate.

In an example, the first substrate includes a bulk substrate material that is Si. The at least one second semiconductor device is formed over a layer of a single crystal semiconductor material that is Ge or SiGe where the second substrate further includes the layer of the single crystal semiconductor material stacked over the dielectric layer in the second substrate.

In an example, the at least one first semiconductor device is formed over a layer of a first single crystal semiconductor material that is Si or SiC where the first substrate includes the layer of the first single crystal semiconductor material stacked over a dielectric layer. The at least one second semiconductor device is formed over a layer of a second single crystal semiconductor material that is Ge or SiGe where the second substrate includes the layer of the second single crystal semiconductor material stacked over the dielectric layer in the second substrate.

In an embodiment, the at least one first semiconductor device includes a PMOS device. The at least one second semiconductor device includes a NMOS device. The carrier substrate further includes a dielectric layer. A first channel region in the at least one first semiconductor device is formed by a first epitaxial growth. The at least one second semiconductor device is formed over a layer of a single crystal semiconductor material that is Si or SiC. The second substrate includes the layer of the single crystal semiconductor material stacked over the dielectric layer in the second substrate. A second channel region in the at least one second semiconductor device is formed by a second epitaxial growth that is different from the first epitaxial growth. A first wiring layer is formed over the at least one second semiconductor device where the at least one second semiconductor device is positioned between the first wiring layer and the second substrate. The dielectric layer in the carrier substrate is attached to the first wiring layer in the second portion. In an example, a third wiring layer is formed over the at least one first semiconductor device and the at least one first semiconductor device is positioned between the third wiring layer and the first substrate. The second wiring layer is positioned in contact with the third wiring layer to align the at least one first semiconductor device with the at least one second semiconductor device. The first portion and the second portion are bonded at an interface between the second wiring layer and the third wiring layer.

In an example, the at least one first semiconductor device includes a first stack of devices stacked along the Z direction. First channel regions in the first stack can be formed by a first epitaxial growth. The first stack of device can be one of: (a) a stack of NMOS devices, (b) a stack of PMOS devices, and (c) a stack of NMOS and PMOS devices. The at least one second semiconductor device includes a second stack of devices stacked along the Z direction. The second stack of device can be one of: (a) a stack of NMOS devices, (b) a stack of PMOS devices, and (c) a stack of NMOS and PMOS devices. Second channel regions in the second stack can be formed by a second epitaxial growth that is different from the first epitaxial growth.

In an example, forming the first portion of the semiconductor apparatus includes forming the first portion on the first substrate of a first wafer and forming the second portion of the semiconductor apparatus includes forming the second portion on the second substrate of a second wafer where the second wafer can be different from the first wafer. In an example, the at least one first semiconductor device includes a first stack of one of NMOS devices and PMOS devices stacked along the Z direction. First channel regions in the first stack can be formed by a first epitaxial growth. The at least one second semiconductor device includes a second stack of another one of the NMOS devices and the PMOS devices stacked along the Z direction. Second channel regions in the second stack can be formed by a second epitaxial growth that is different from the first epitaxial growth.

BRIEF DESCRIPTION OF THE DRAWINGS

Various embodiments of this disclosure that are proposed as examples will be described in detail with reference to the following figures, wherein like numerals reference like elements, and wherein:

FIGS. 1-12, 13A, and 13B show exemplary cross sectional views of a semiconductor apparatus 100 in various steps of a process flow according to some embodiments of the disclosure;

FIGS. 15-27 show exemplary cross sectional views of a semiconductor apparatus 200 in various steps of a process flow according to some embodiments of the disclosure;

FIGS. 28-40 show exemplary cross sectional views of a semiconductor apparatus 300 in various steps of a process flow according to some embodiments of the disclosure;

DETAILED DESCRIPTION OF EMBODIMENTS

Figure 1:
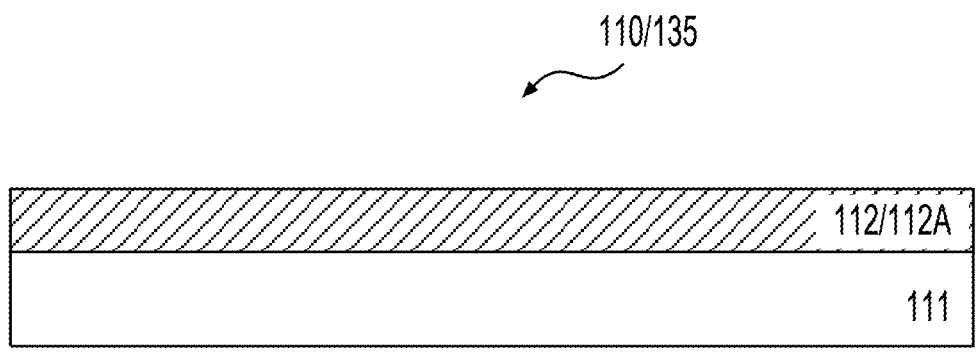

A three-dimensional (3D) semiconductor apparatus (e.g., a 3D semiconductor circuit) where devices (e.g., transistors) are stacked on top of each other can increase a device density (e.g., a number of devices per unit area), for example, as scaling enters single digit nanometer semiconductor device fabrication nodes. Semiconductor devices (e.g., transistors) can be stacked along a Z direction that is substantially perpendicular to a substrate plane (also referred to as a working plane) of the 3D semiconductor apparatus to increase the device density (e.g., a number of semiconductor devices per unit area of the substrate plane). The substrate plane can be a planar working surface of a substrate of the 3D semiconductor apparatus.

3D integration, such as a vertical stacking of multiple devices, can be a viable approach to continue semiconductor scaling in critical dimension scaling. As a contacted gate pitch reaches a scaling limit due to manufacturing variability and electrostatic device limitations, two-dimensional (2D) transistor density scaling can be challenging. Transistor designs, such as vertical channel gate-all-around (GAA) transistors, may overcome the contacted gate pitch scaling limits. However, in some examples, wire pitch scaling may be limited by resistance, capacitance, and/or reliability, and thus limiting the device density, such as a transistor density with which transistors can be wired into circuits.

3D integration can overcome the scaling limitations by increasing a transistor density, such as demonstrated in the flash memory industry by implementing 3D NAND. A number of transistors in a volume can be significantly larger than a number of transistors over an area when an area occupied by the volume on a 2D plane is identical to the area. In some embodiments, complementary metal-oxide semiconductor (MOS) (CMOS) VLSI scaling, as used for example in CPU or GPU products, may adopt 3D integration as an important means of moving the semiconductor roadmap forward.

According to aspects of the disclosure, techniques herein include high performance 3D semiconductor apparatus or device architecture (e.g., 3D MOS device architecture, 3D CMOS device architecture) and process flow(s) to fabricate a high performance 3D semiconductor apparatus that can include 3D stacking of wafers with high mobility channels using optimum substrates and nano plane materials. By combining wafers and nano planes with elements that are optimized (e.g., best suited) for n-type MOS (NMOS) device(s) and p-type MOS (PMOS) device(s), respectively, the high performance 3D semiconductor apparatus including high performance 3D circuits can be achieved. In an example, the high performance 3D CMOS device architecture uses a plurality of high mobility substrates and nano sheets. In an example, a buried power rail is included between bonded wafers.

An order of discussion of different steps and/or methods as described herein is presented for clarity sake. In general, the steps and/or methods can be performed in any suitable order. Additionally, although each of the different features, techniques, configurations, and/or the like herein may be discussed in different places of the disclosure, it is intended that each of the concepts can be executed independently of each other or in any suitable combination with each other. Accordingly, the present disclosure can be embodied and viewed in many different ways.

According to aspects of the disclosure, a first portion of a semiconductor apparatus (e.g., a high performance 3D semiconductor apparatus) can be formed on a first substrate where the first portion can include at least one first semiconductor device. A second portion of the semiconductor apparatus can be formed on a second substrate where the second portion can include at least one second semiconductor device, and the second substrate can include a bulk substrate material. A carrier substrate can be attached to the second portion of the semiconductor apparatus where the at least one second semiconductor device can be positioned between the carrier substrate and the second substrate. Subsequently, the bulk substrate material can be removed from the second substrate. The first portion and the second portion can be bonded to form the semiconductor apparatus where the at least one second semiconductor device is stacked above the at least one first semiconductor device along a Z direction that is substantially perpendicular to a substrate plane of the first substrate. The at least one first semiconductor device and the at least one second semiconductor device can be positioned between the carrier substrate and the first substrate.

In an embodiment, the first portion can be formed on the first substrate of a first wafer. The second portion can be formed on the second substrate of a second wafer where the second wafer is different from the first wafer and the second substrate is different from the first substrate.

In an embodiment, the at least one first semiconductor device can include a first stack of one of NMOS devices and PMOS devices stacked along the Z direction where first channel regions in the first stack are formed by a first epitaxial growth. The at least one second semiconductor device includes a second stack of another one of the NMOS devices and the PMOS devices stacked along the Z direction where second channel regions in the second stack are formed by a second epitaxial growth that is different from the first epitaxial growth.

In an embodiment, the carrier substrate further includes a dielectric layer and the dielectric layer in the carrier substrate is attached to the second portion.

A first wiring layer can be formed over the at least one second semiconductor device where the at least one second semiconductor device can be positioned between the second substrate and the first wiring layer. The carrier substrate can be attached to the first wiring layer in the second portion.

In an example, the second substrate further includes a dielectric layer stacked on the bulk substrate material. A second wiring layer is formed from the dielectric layer in the second substrate. After bonding the first portion and the second portion to form the semiconductor apparatus, the carrier substrate can be removed.

A third wiring layer can be formed over the at least one first semiconductor device where the at least one first semiconductor device is between the third wiring layer and the first substrate. The second wiring layer and the third wiring layer can be bonded.

In an example, one of the second wiring layer and the third wiring layer includes a power rail.

In an example, the first substrate includes a first layer of a first single crystal semiconductor material stacked on a dielectric layer. The at least one first semiconductor device is formed over the first layer of the first single crystal semiconductor material that is silicon (Si) or silicon carbide (SiC).

The second substrate further includes a second layer of a second single crystal semiconductor material stacked on a dielectric layer that is on the bulk substrate material. The at least one second semiconductor device can be formed over the second layer of the second single crystal semiconductor material that is Si, SiC, germanium (Ge), or silicone germanium (SiGe).

In an example, the at least one first semiconductor device includes one of a NMOS device and a PMOS device. The at least one second semiconductor device includes another one of the NMOS device and the PMOS device. A first channel region in the at least one first semiconductor device is formed by a first epitaxial growth. A second channel region in the at least one second semiconductor device is formed by a second epitaxial growth that is different from the first epitaxial growth.

Various embodiments are described herein. The at least one first semiconductor device can include one or more NMOS devices, the at least one second MOS device can include one or more PMOS devices. A substrate (or a wafer), such as the first substrate or the first wafer having the at least one first device (i.e., the one or more NMOS devices), can be combined (e.g., bonded) with another substrate (or another wafer), such as the carrier substrate or the carrier wafer that is attached to the second portion having the at least one second device (i.e., the one or more PMOS devices). Any suitable types of substrates can be used as the first substrate and the second substrate for fabrications of the one or more NMOS devices and the one or more PMOS devices, respectively. In various embodiments, 3D NMOS nano sheets, PMOS nano sheets, and/or CMOS nano sheets can be formed. For example, a CMOS device is formed on a same wafer.

In an example, the first substrate is different from the second substrate. In an example, the first substrate is identical to the substrate. The at least one first semiconductor device can include a first stack of devices stacked along the Z direction where first channel regions in the first stack can be formed by the first epitaxial growth. The first stack of device can be one of: (a) a stack of NMOS devices, (b) a stack of PMOS devices, (c) a stack of NMOS and PMOS devices, and (d) a stack of CMOS devices. The at least one second semiconductor device can include a second stack of devices stacked along the Z direction where second channel regions in the second stack can be formed by the second epitaxial growth. The second stack of device can be one of: (a) a stack of NMOS devices, (b) a stack of PMOS devices, (c) a stack of NMOS and PMOS devices, and (d) a stack of CMOS devices.

In an example, a NMOS wafer (e.g., a wafer including NMOS device(s)) and a PMOS wafer (e.g., a wafer including PMOS device(s)) are combined (e.g., bonded). In an example, a portion (e.g., a die) of the NMOS wafer can be combined (e.g., bonded) with a portion (e.g., a die) of the PMOS wafer. The NMOS wafer and the portion of the NMOS wafer can include the NMOS device(s). The PMOS wafer and the portion of the PMOS wafer can include the PMOS device(s).

In general, the NMOS wafer and the PMOS wafer can include any suitable substrates, such as a substrate formed from a single bulk material (e.g., a Si substrate formed from single crystal Si), a substrate including one or more layers (e.g., a dielectric layer, a semiconductor layer) on a single bulk material, and/or the like. The dielectric layer can include any suitable dielectric material(s), such as an oxide layer. The semiconductor layer can include any suitable semiconductor materials and any suitable number of sublayers. In an example, the semiconductor layer includes a single crystal semiconductor material, such as Si, Ge, SiGe, or the like.

Figure 13:
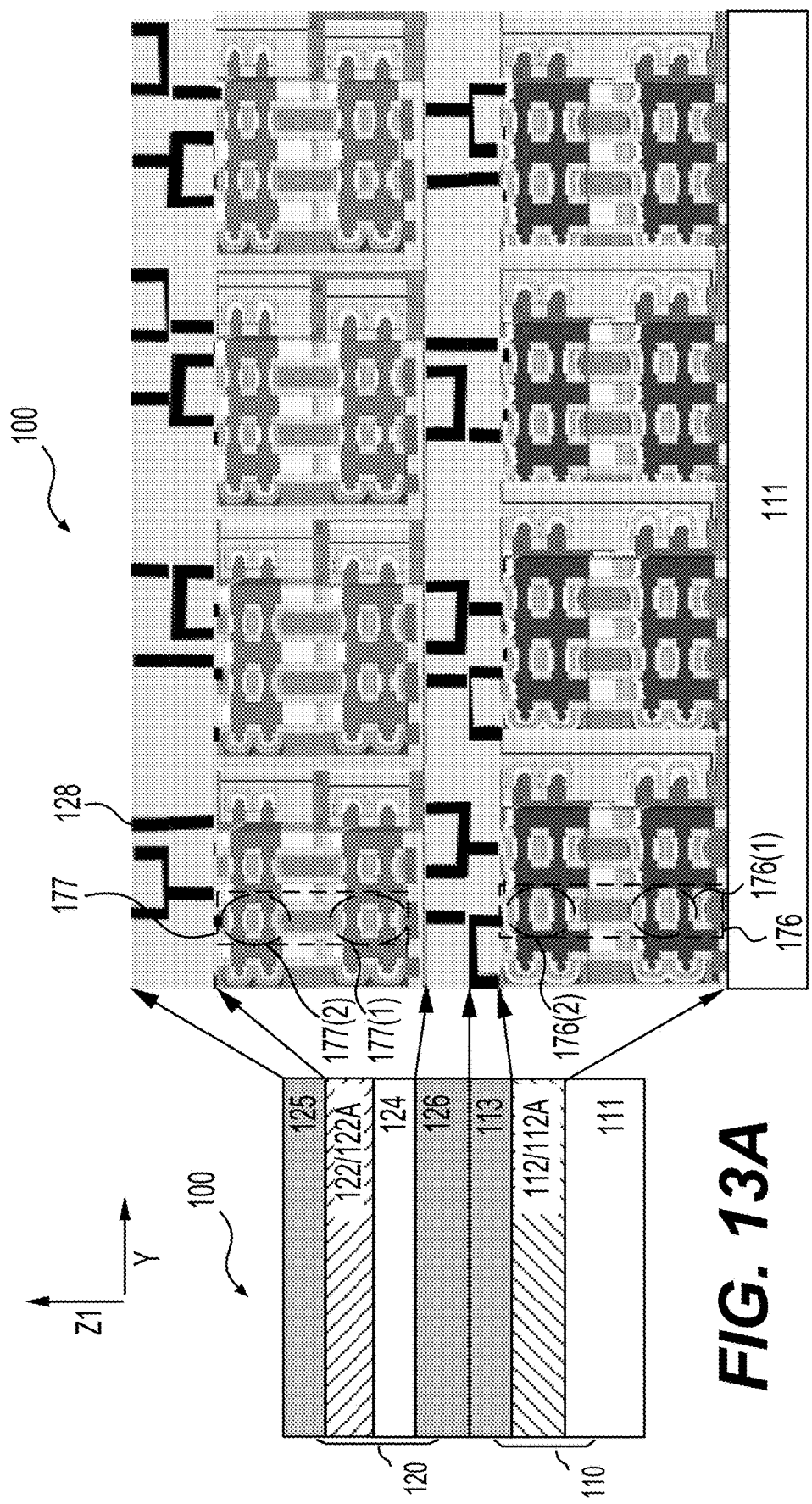
Figure 14:
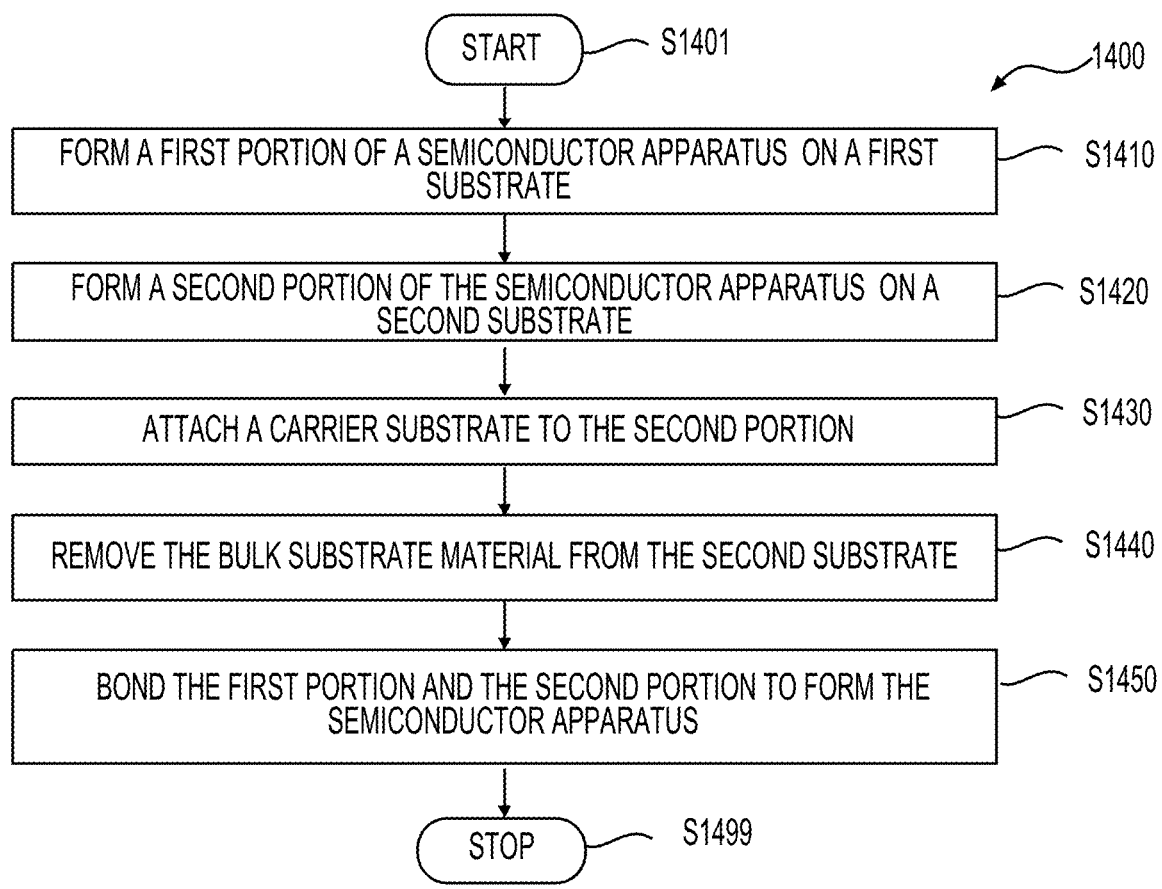
FIG. 14 shows an exemplary process flow to form a semiconductor apparatus according to an embodiment of the disclosure.

FIG. 14 shows an exemplary process flow 1400 to form a semiconductor apparatus (e.g., a 3D semiconductor apparatus) according to an embodiment of the disclosure. The process flow (also referred to as a process, a flow) 1400 can be used to fabricate or manufacture semiconductor apparatuses in FIGS. 1-12, 13A, and 13B and 15-54.

For purposes of clarity, the process flow 1400 can be referred to as a first flow when the process flow 1400 is used to manufacture a semiconductor apparatus 100 in FIGS. 1-12, 13A, and 13B. In an embodiment, the NMOS wafer (e.g., a second wafer 136 in FIG. 3) includes a Si or SiC single crystal layer on an oxide layer that is on a Si substrate, and the PMOS wafer (e.g., a first wafer 135 in FIG. 3) has a Si substrate.

The process flow 1400 can be referred to as a second flow when the process flow 1400 is used to manufacture a semiconductor apparatus 200 in FIGS. 15-27. In an embodiment, the NMOS wafer (e.g., a first wafer 235 in FIG. 15) includes a Si substrate and the PMOS wafer (e.g., a second wafer 236 in FIG. 17) includes a single crystal Si layer on an oxide layer that is on a Si substrate.

The process flow 1400 can be referred to as a third flow when the process flow 1400 is used to manufacture a semiconductor apparatus 300 in FIGS. 28-40. In an embodiment, the NMOS wafer (e.g., a first wafer 335 in FIG. 28) includes a Si substrate and the PMOS wafer (e.g., a second wafer 336 in FIG. 30) includes a single crystal Ge or SiGe layer on an oxide layer that is on a Si substrate.

The process flow 1400 can be referred to as a fourth flow when the process flow 1400 is used to manufacture a semiconductor apparatus 400 in FIGS. 41-54. In an embodiment, the NMOS wafer (e.g., a first wafer 435 in FIG. 41) includes a single crystal Si or SiC layer on an oxide layer that is on a Si substrate and the PMOS wafer (e.g., a second wafer 436 in FIG. 44) includes a single crystal Ge or SiGe layer on an oxide layer that is on a Si substrate.

The first flow is described with reference to FIGS. 1-12, 13A, 13B, and 14 and can be used to form the semiconductor apparatus 100. The process flow 1400 starts at S1401 and proceeds to S1410.

Figure 2:
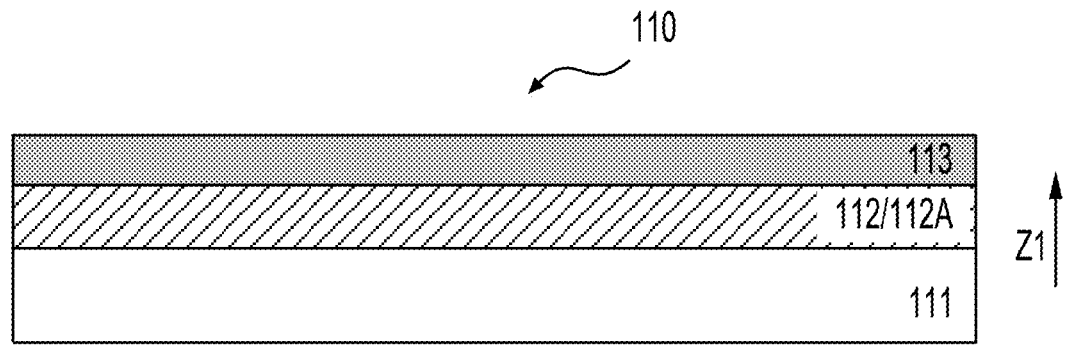

Referring to FIGS. 1, 2, and 14, at S1410, a first portion 110 of the semiconductor apparatus 100 can be formed on a first substrate 111. The first portion 110 can include at least one first semiconductor device (e.g., MOS device) 112, such as one of NMOS device(s) and PMOS device(s). The at least one first semiconductor device 112 can be formed on the first substrate 111 (FIG. 1). The at least one first semiconductor device 112 can include first channel region(s) formed by a first epitaxial growth. In an example, the at least one first semiconductor device 112 includes one or more PMOS devices (e.g., a stack of PMOS devices stacked along a Z1 direction that is substantially perpendicular to a substrate plane of the first substrate 111), and the first substrate 111 is a Si substrate. In an example, the first portion 110 including the first substrate 111 is formed on a first wafer 135.

In some examples, the first portion 110 includes a sub-portion 112A having the at least one first semiconductor device 112. In an example, the at least one first semiconductor device 112 includes multiple first MOS devices 112 and the sub-portion 112A includes one or more local interconnects (LIs) that connect the multiple first MOS devices 112.

In an example, a wiring layer (also referred to as a wiring plane) 113 is formed over the at least one first semiconductor device 112 where the at least one first semiconductor device 112 is positioned between the wiring layer 113 and the first substrate 111, and thus the first portion 110 further includes the wiring layer 113 (FIG. 2). In an example, the wiring layer 113 is formed over the sub-portion 112A. Metal X (e.g., metal 0 (M0), metal 1 (M1), metal 2 (M2), or the like) routing can be formed in the wiring layer 113. Alternatively, no wiring layer is formed over the first semiconductor device 112, and thus the first portion 110 includes no wiring layer.

Figure 3:
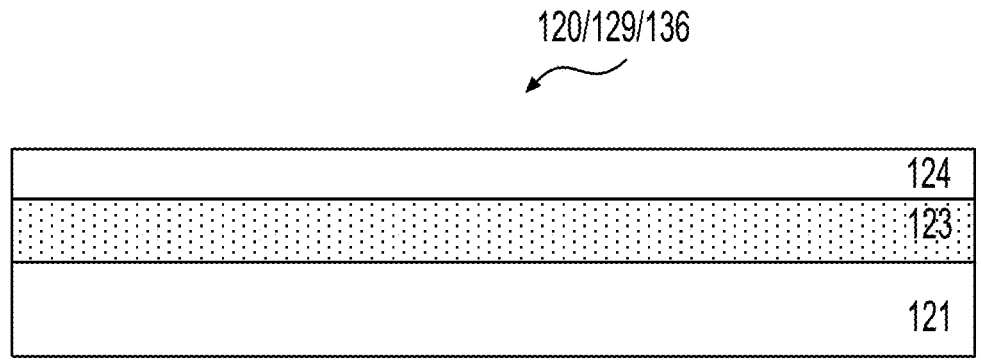

Referring to FIGS. 3-5 and 14, at S1420, a second portion 120 of the semiconductor apparatus 100 can be formed on a second substrate 129. The second portion 120 can include at least one second semiconductor device (e.g., MOS device) 122 that can be one of NMOS device(s) and PMOS device(s). In an example, the at least one second semiconductor device 122 includes one or more NMOS devices (e.g., a stack of NMOS devices stacked along a Z2 direction that is substantially perpendicular to a substrate plane of the second substrate 129). The second substrate 129 can include a bulk substrate material (e.g., Si) 121. Referring to FIG. 3, the second substrate 129 can further include a dielectric layer (e.g., an oxide layer) 123 stacked over the bulk substrate material 121, and a layer 124 of single crystal semiconductor material (e.g., Si or SiC) stacked over the dielectric layer 123.

The at least one first semiconductor device 112 and the at least one second semiconductor device 122 can include GAA nano sheets.

Figure 4:
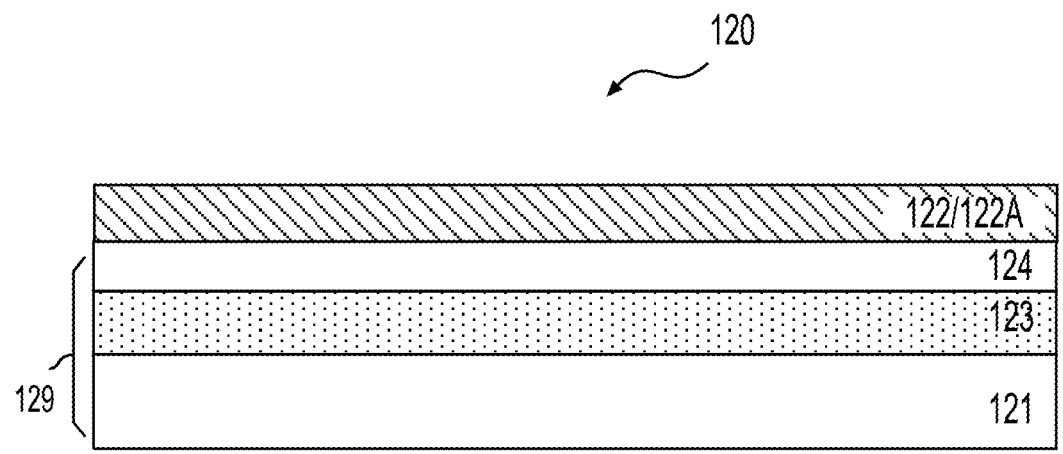
Figure 5:
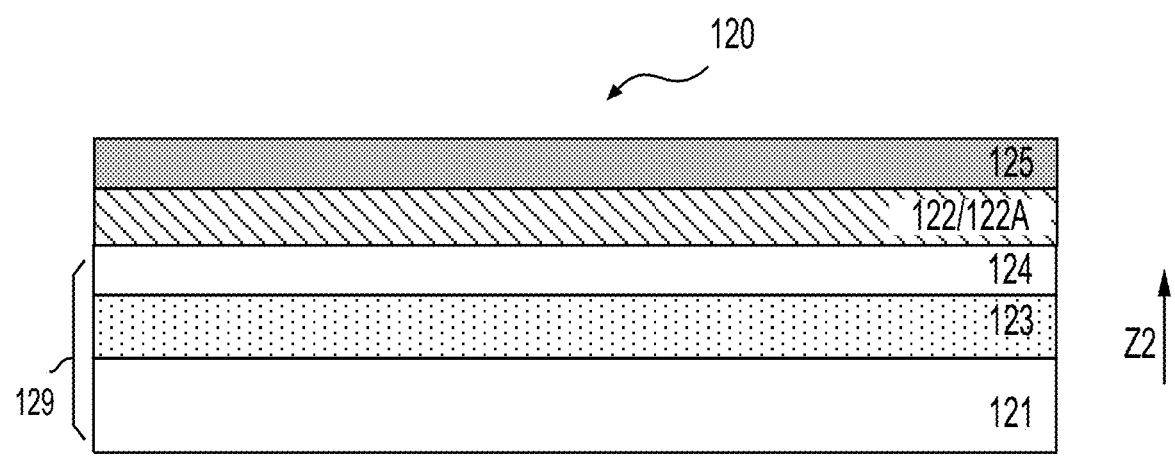

The at least one second semiconductor device 122 can be formed over the layer 124 (FIG. 4). The at least one second semiconductor device 122 can include second channel regions(s) formed by a second epitaxial growth that is different from the first epitaxial growth in FIG. 1. In some examples, the second portion 120 includes a sub-portion 122A having the at least one second semiconductor device 122. In an example, the at least one second semiconductor device 122 includes multiple second MOS devices 122 and the sub-portion 122A includes one or more LIs that connect the multiple second MOS devices 122.

In an example, a wiring layer (or a wiring plane) 125 is formed over the at least one second semiconductor device 122 (FIG. 5), and thus the at least one second semiconductor device 122 is positioned between the second substrate 129 and the wiring layer 125. In an example, the wiring layer 125 is formed over the sub-portion 122A. Metal X (e.g., M0, M1, M2, or the like) routing can be formed in the wiring layer 125.

Figure 6:
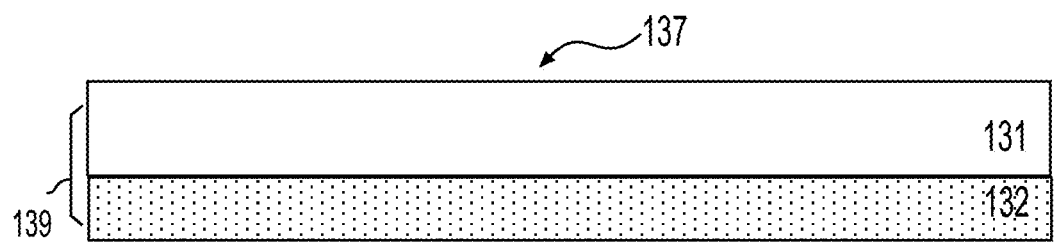
Figure 7:
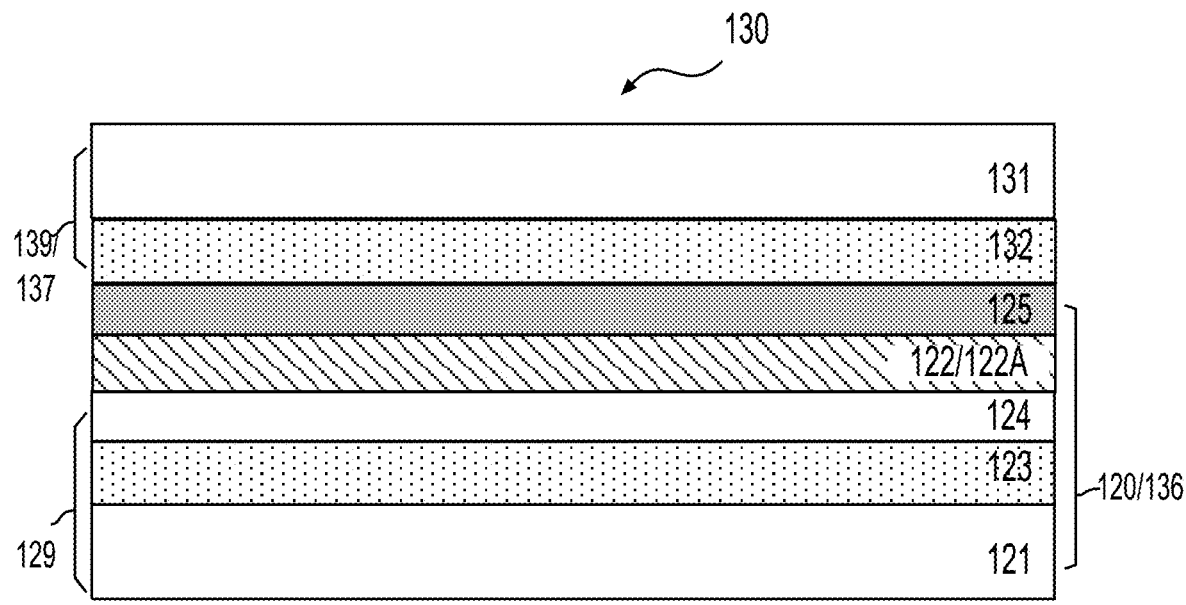

Referring to FIGS. 6-7 and 14, at S1430, a carrier substrate 139 can be attached to the second portion 120 of the semiconductor apparatus 100 where the at least one second semiconductor device 122 can be positioned between the carrier substrate 139 and the second substrate 129.

Referring to FIG. 6, the carrier substrate 139 can include a bulk carrier substrate material (e.g., Si) 131. In an example, the carrier substrate 139 further includes a dielectric layer (e.g., an oxide layer) 132.

Referring to FIG. 7, the carrier substrate 139 can be attached to the second portion 120. In an embodiment, the dielectric layer 132 is attached to the second portion 120. In an embodiment, the carrier substrate 139 is attached to the wiring layer 125. In an example, the dielectric layer 132 is attached to the wiring layer 125 of the second portion 120. The at least one second semiconductor device 122 can be positioned between the carrier substrate 139 and the second substrate 129. Thus, a structure 130 can include the carrier substrate 139 and the second portion 120.

Referring back to FIGS. 3 and 6, in an example, the second substrate 129 is on a second wafer 136, and the carrier substrate 139 is on a carrier wafer 137 that is different from the second wafer 136. Referring to FIG. 7, the carrier wafer 137 including the carrier substrate 139 can be attached to the second wafer 136 including the second portion 120. Thus, the structure 130 can include the carrier wafer 137 and the second wafer 136.

Figure 8:
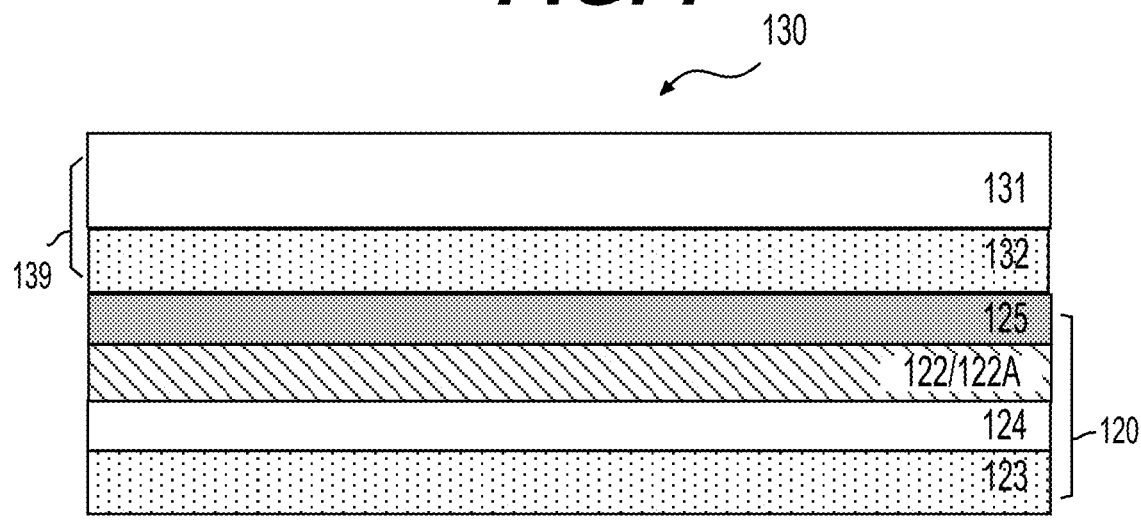

Referring to FIGS. 8 and 14, at S1440, the bulk substrate material 121 can be removed from the second substrate 129.

At S1450, the first portion 110 and the second portion 120 can be bonded to form the semiconductor apparatus 100 where the at least one first semiconductor device 112 and the at least one second semiconductor device 122 are positioned between the carrier substrate 139 and the first substrate 111. The at least one second semiconductor device 122 can be stacked above the at least one first semiconductor device 112 along a Z direction that is substantially perpendicular to a substrate plane of the first substrate 111.

In an example, referring to FIG. 9, a wiring layer (or a wiring plane) 126 is formed from the dielectric layer 123 in the second portion 120. Metal X (e.g., M0, M1, M2, or the like) routing can be formed in the wiring layer 126.

Referring to FIG. 10, the first portion 110 and the second portion 120 are aligned prior to being bonded. Referring back to FIGS. 1 and 3, the first portion 110 can be fabricated on the first wafer 135, and the second portion 120 can be fabricated on the second wafer 136 that is different from the first wafer 135. The second substrate 129 is different from the first substrate 111. In some examples, such as shown in FIG. 7, the second portion 120 can be attached to the carrier wafer 137 and form the structure 130. In an example, the first wafer 135 including the first portion 110 and the structure 130 including the second portion 120 and the carrier wafer 137 are aligned such that the first portion 110 and the second portion 120 are aligned. Alternatively, the first wafer 135 can be divided (e.g., cut) into a first plurality of smaller portions (e.g., dies), and the structure 130 can be divided (e.g., cut) into a second plurality of smaller portions (e.g., dies). One of the first plurality of dies including the first portion 110 can be aligned to one of the second plurality of dies including the second portion 120 such that the first portion 110 and the second portion 120 are aligned. In an example, the first portion 110 and the second portion 120 are aligned such that the at least one first semiconductor device 112 is aligned with the at least one second semiconductor device 122.

Figure 11:
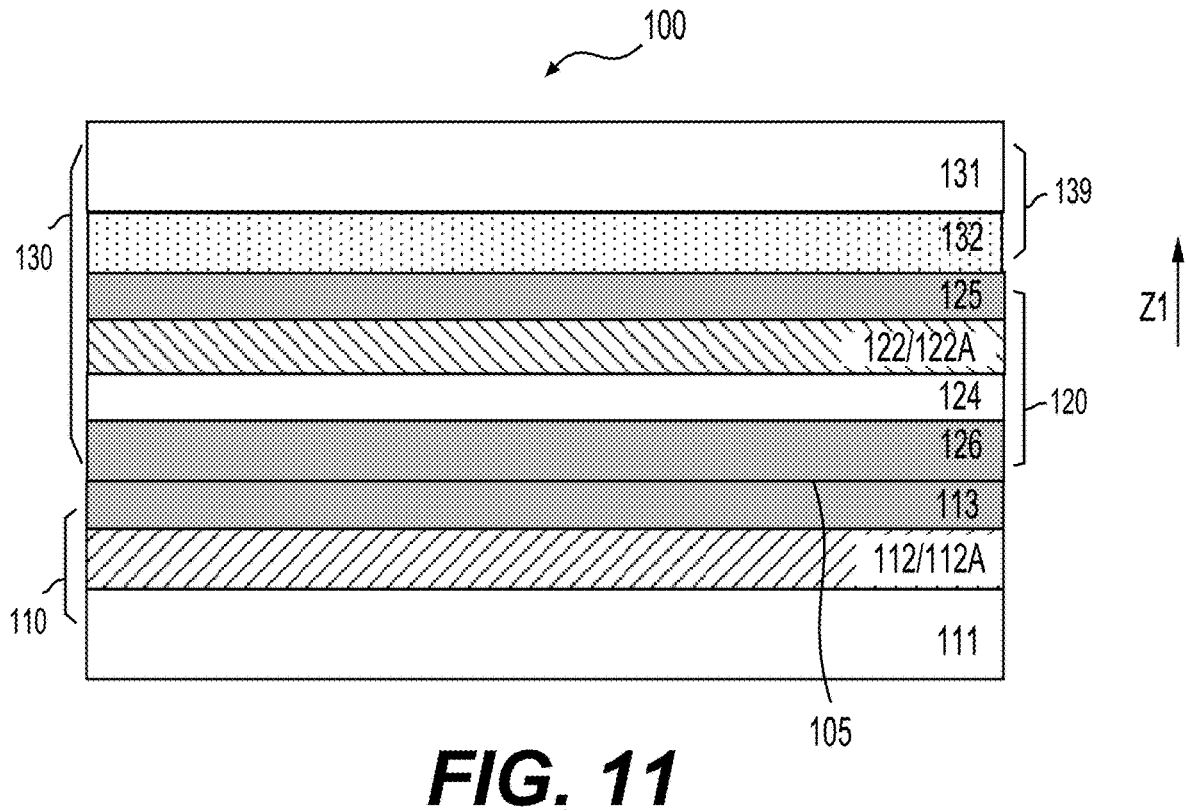

Referring to FIG. 11, the first portion 110 and the second portion 120 can be bonded after being aligned. In an example, the wiring layer 126 and the wiring layer 113 are bonded using any suitable technique, such as techniques described in U.S. patent application Ser. No. 16/854,340, filed on Apr. 21, 2020 and entitled "Method for Fabrication of High Density Logic and Memory for Advanced Circuit Architecture" which is incorporated by reference in its entirety. Accordingly, the wiring layer 126 can be positioned between the at least one first semiconductor device 112 and the at least one second semiconductor device 122.

Various techniques can be used for bonding wafers or substrates together. For example, bonding techniques described in U.S. patent application Ser. No. 16/854,340, filed on Apr. 21, 2020 and entitled "Method for Fabrication of High Density Logic and Memory for Advanced Circuit Architecture" which is incorporated by reference in its entirety, can be used. Moreover, metal layers can include pads or enlarged connection points to assist with alignment and connection of two or more wafers.

In an example, the first wafer 135 and the second wafer 136 are aligned and bonded. Accordingly, the first portion 110 and the second portion 120 are bonded. In an example, the one of the first plurality of dies including the first portion 110 can be bonded to the one of the second plurality of dies including the second portion 120, and thus the first portion 110 and the second portion 120 are bonded.

In an example, the wiring layer 126 is positioned in contact with the wiring layer 113 to align the at least one first semiconductor device 112 with the at least one second semiconductor device 122. The first portion 110 and the second portion 120 can be bonded at an interface 105 between the wiring layer 126 and the wiring layer 113.

The process flow 1400 can be suitably adapted to manufacture the semiconductor apparatus 100. For example, steps in the process flow 1400 can be suitably combined, modified, and/or omitted. Any suitable order can be used to implement the process flow 1400. Additional step(s) can be added to the process flow 1400.

Figure 12:
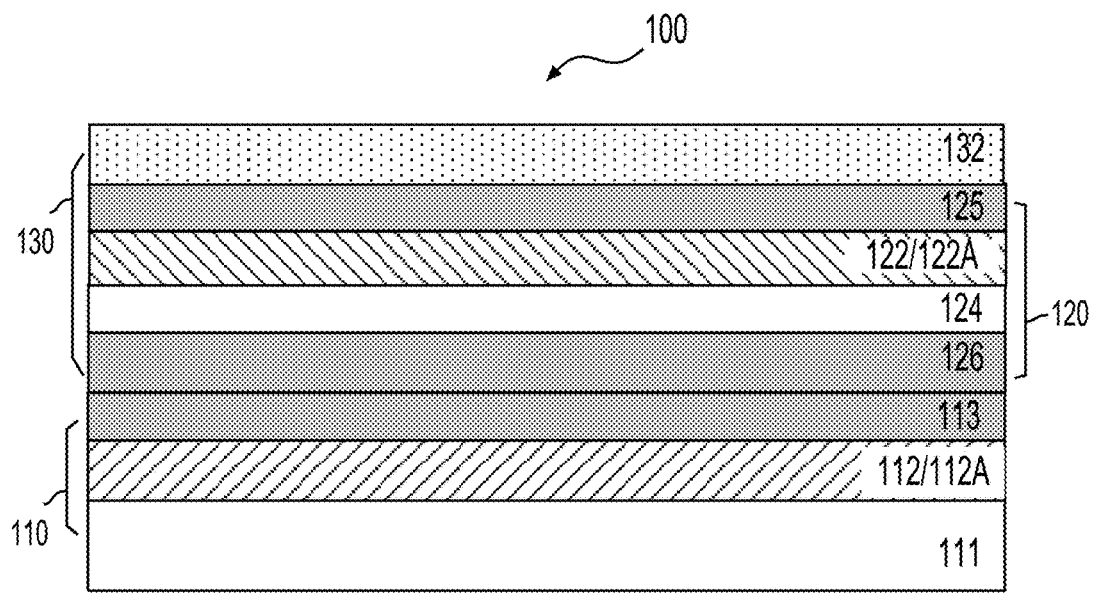

In an example, after bonding the first portion 110 and the second portion 120, a portion of the carrier substrate 139 or the carrier substrate 139 can be removed. Referring to FIG. 12, the bulk carrier substrate material (e.g., Si) 131 can be removed. Referring to FIG. 13A-13B, the dielectric layer 132 can be removed.

FIG. 13A shows an example of the semiconductor apparatus 100 that includes the second portion 120 stacked on the first portion 110. The first portion 110 includes the wiring layer 113, the at least one first semiconductor device 112 being PMOS device(s), and the first substrate 111 (e.g., Si substrate). The second portion 120 includes the wiring layer 125, the at least one second MOS device 122 being NMOS device(s), the layer 124 (e.g., Si layer or SiC layer), and the wiring layer 126. In an example, the at least one first semiconductor device 112 and the at least one second MOS device 122 are aligned. The first portion 110 can include the sub-portion 112A and the second portion 120 can include the sub-portion 122A.

FIG. 13B shows an example of the semiconductor apparatus 100. Referring to FIG. 13B, the sub-portion 112A can include multiple stacks 176 of the at least one first semiconductor device 112. Each of the multiple stacks 176 can further include a sub-stack 176(1) and a sub-stack 176(2) that is stacked over the sub-stack 176(1) along the Z direction. In general, any suitable number (e.g., 2) of the at least one first semiconductor device 112 can be included in the sub-stacks 176(1)-(2), and thus any suitable number (e.g., 4) of the at least one first semiconductor device 112 can be included in the stack 176. In FIG. 13B, two PMOS devices in the sub-stack 176(2) are stacked above two PMOS devices in the sub-stack 176(1) along the Z direction. As described above, a local interconnect (LI) can connect the sub-stacks 176(1)-(2) in the stack 176. One of the multiple stacks 176 can be displaced from another of the multiple stacks 176 along any suitable direction (e.g., a Y direction) that is perpendicular to the Z direction.

Referring to FIG. 13B, the sub-portion 122A can include multiple stacks 177 of the at least one second semiconductor device 122. Each of the multiple stacks 177 can further include a sub-stack 177(1) and a sub-stack 177(2) that is stacked over the sub-stack 177(1) along the Z direction. In general, any suitable number (e.g., 2) of the at least one second semiconductor device 122 can be included in the sub-stacks 177(1)-(2), and thus any suitable number (e.g., 4) of the at least one second semiconductor device 122 can be included in the stack 177. In FIG. 13B, two NMOS devices in the sub-stack 177(2) are stacked above two NMOS devices in the sub-stack 177(1) along the Z direction. As described above, an LI can connect the sub-stacks 177(1)-(2) in the stack 177. One of the multiple stacks 177 can be displaced from another of the multiple stacks 177 along any suitable direction (e.g., the Y direction) that is perpendicular to the Z direction.

In an example shown in FIG. 13B, the multiple stacks 176 are aligned with the respective multiple stacks 177. The wiring layer 126, the wiring layer 125, and third wiring layer 113 in the semiconductor apparatus 100 can include respective metal X routings 128 where X can be 0, 1, 2, or the like. In an example, one of the wiring layer 113 and the wiring layer 126 includes a power rail (or buried power rail).

The second flow is described with reference to FIGS. 15-27 and 14 and can be used to form the semiconductor apparatus 200. The process flow 1400 starts at S1401 and proceeds to S1410.

Figure 15:
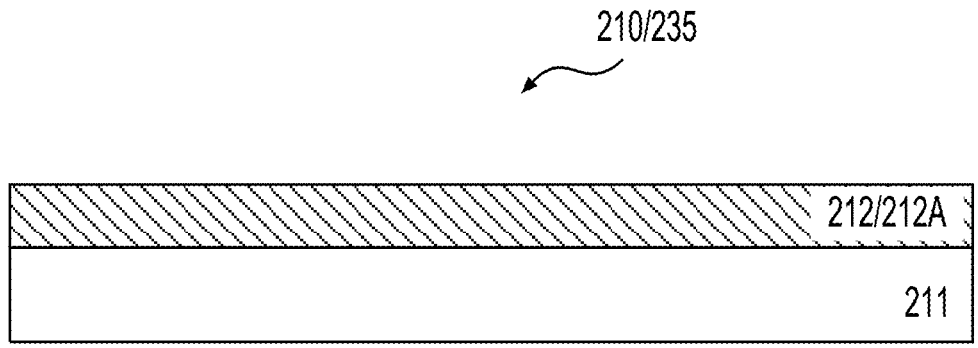
Figure 16:
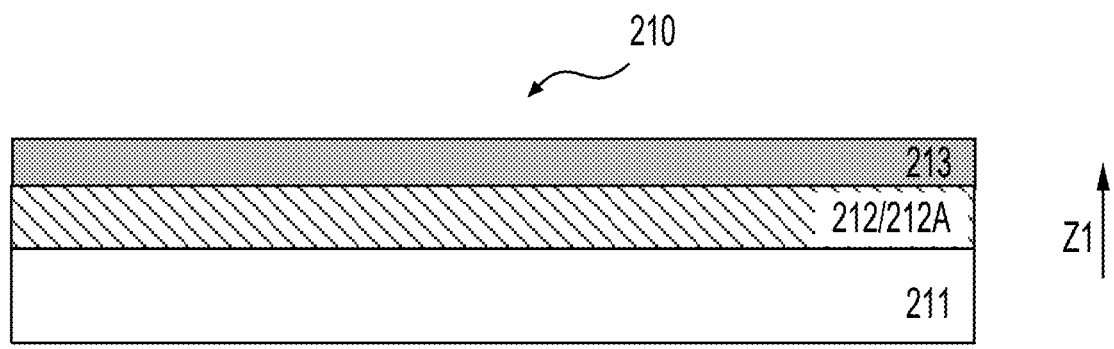

Referring to FIGS. 14-16, at S1410, a first portion 210 of the semiconductor apparatus 200 can be formed on a first substrate 211. The first portion 210 can include at least one first semiconductor device 212 that can be one of NMOS device(s) and PMOS device(s). The at least one first semiconductor device 212 can be formed on the first substrate 211 (FIG. 15). The at least one first semiconductor device 212 can include first channel region(s) formed by a first epitaxial growth. In an example, the at least one first semiconductor device 212 includes one or more NMOS devices (e.g., a stack of NMOS devices stacked along a Z1 direction that is substantially perpendicular to a substrate plane of the first substrate 211) and the first substrate 211 is a Si substrate. In an example, the first portion 210 including the first substrate 211 is on a first wafer 235.

In some examples, the first portion 210 includes a sub-portion 212A having the at least one first semiconductor device 212. In an example, the at least one first semiconductor device 212 includes multiple first MOS devices 212 and the sub-portion 212A includes one or more LIs that connect the multiple first MOS devices 212.

In an example, a wiring layer 213 is formed over the at least one first semiconductor device 212 where the at least one first semiconductor device 212 is positioned between the wiring layer 213 and the first substrate 211, and thus the first portion 210 further includes the wiring layer 213 (FIG. 16). In an example, the wiring layer 213 is formed over the sub-portion 212A. Metal X (e.g., M0, M1, M2, or the like) routing can be formed in the wiring layer 213. Alternatively, no wiring layer is formed over the first semiconductor device 212, and thus the first portion 210 includes no wiring layer.

Figure 17:
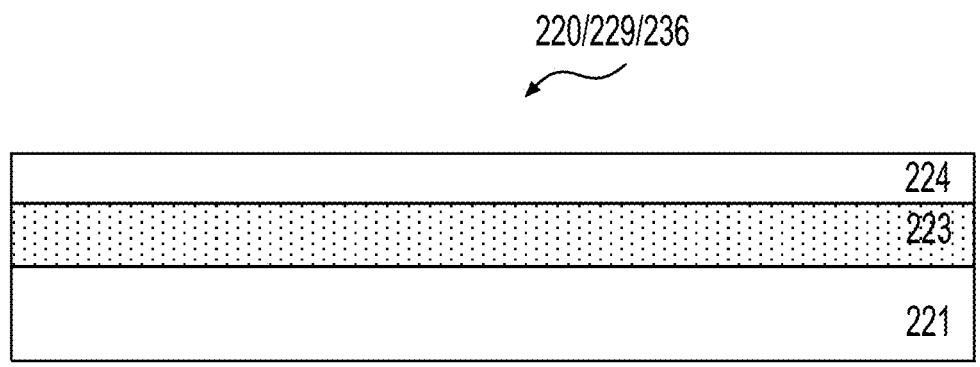

Referring to FIGS. 14 and 17-19, at S1420, a second portion 220 of the semiconductor apparatus 200 can be formed on a second substrate 229. The second portion 220 can include at least one second semiconductor device (e.g., MOS device) 222 that can be one of NMOS device(s) and PMOS device(s). In an example, the at least one second semiconductor device 222 includes one or more PMOS devices (e.g., a stack of NMOS devices stacked along a Z2 direction that is substantially perpendicular to a substrate plane of the second substrate 229). The second substrate 229 can include a bulk substrate material (e.g., Si) 221. Referring to FIG. 17, the second substrate 229 can further include a dielectric layer (e.g., an oxide layer) 223 stacked over the bulk substrate material 221, and a layer 224 of a single crystal semiconductor material (e.g., Si) stacked over the dielectric layer 223.

The at least one first semiconductor device 212 and the at least one second semiconductor device 222 can include GAA nano sheets.

Figure 18:
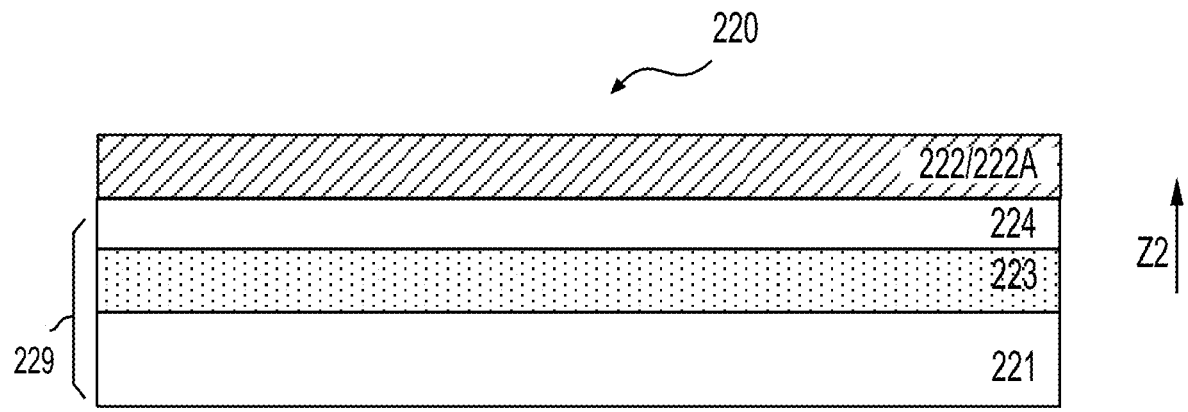
Figure 19:
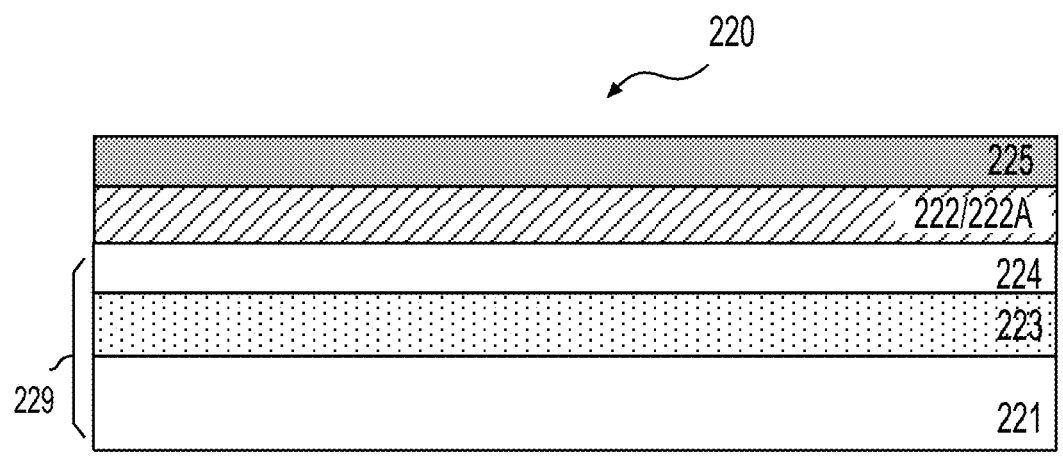

The at least one second semiconductor device 222 can be formed over the layer 224 (FIG. 18). The at least one second semiconductor device 222 can include second channel region(s) formed by a second epitaxial growth that is different from the first epitaxial growth in FIG. 15.

In some examples, the second portion 220 includes a sub-portion 222A having the at least one second semiconductor device 222. In an example, the at least one second semiconductor device 222 includes multiple second MOS devices 222 and the sub-portion 222A includes one or more LIs that connect the multiple second MOS devices 222.

In an example, a wiring layer 225 is formed over the at least one second semiconductor device 222 (FIG. 19), and thus the at least one second semiconductor device 222 is positioned between the second substrate 229 and the wiring layer 225. In an example, the wiring layer 225 is formed over the sub-portion 222A. Metal X (e.g., M0, M1, M2, or the like) routing can be formed in the wiring layer 225.

Figure 20:
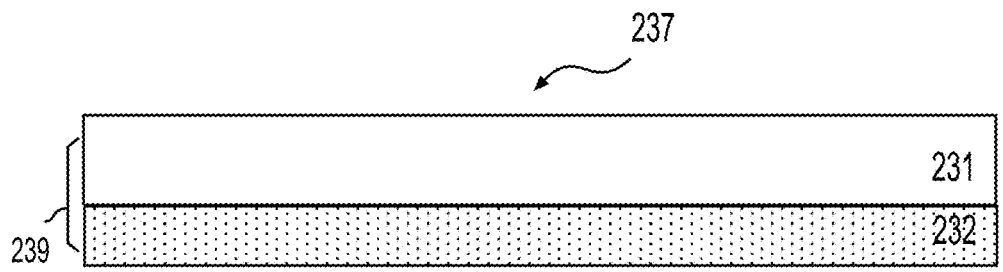
Figure 21:
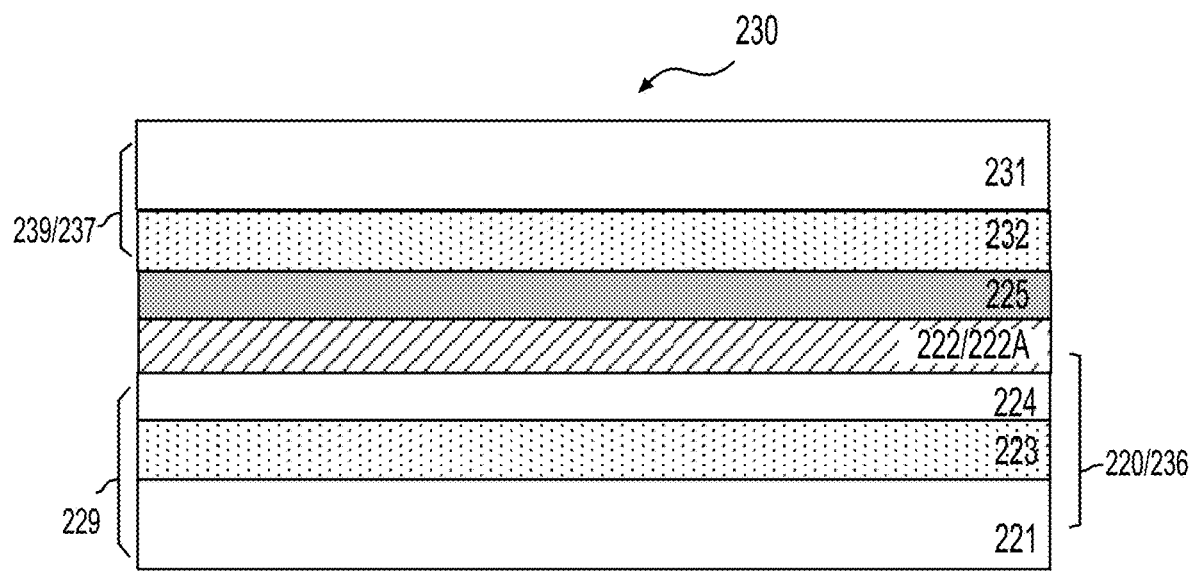

Referring to FIGS. 14 and 20-21, at S1430, a carrier substrate 239 can be attached to the second portion 220 of the semiconductor apparatus 200 where the at least one second semiconductor device 222 can be positioned between the carrier substrate 239 and the second substrate 229.

Referring to FIG. 20, the carrier substrate 239 can include a bulk carrier substrate material (e.g., Si) 231. In an example, the carrier substrate 239 further includes a dielectric layer (e.g., an oxide layer) 232.

Referring to FIG. 21, the carrier substrate 239 can be attached to the second portion 220. In an embodiment, the dielectric layer 232 is attached to the second portion 220. In an embodiment, the carrier substrate 239 is attached to the wiring layer 225. In an example, the dielectric layer 232 is attached to the wiring layer 225 of the second portion 220. The at least one second semiconductor device 222 can be positioned between the carrier substrate 239 and the second substrate 229. Thus, a structure 230 can include the carrier substrate 239 and the second portion 220.

Referring back to FIGS. 17 and 20, in an example, the second substrate 229 is on a second wafer 236, and the carrier substrate 239 is on a carrier wafer 237 that is different from the second wafer 236. Referring to FIG. 21, the carrier wafer 237 including the carrier substrate 239 can be attached to the second wafer 236 including the second portion 220. The structure 230 can include the carrier wafer 237 and the second wafer 236.

Figure 22:
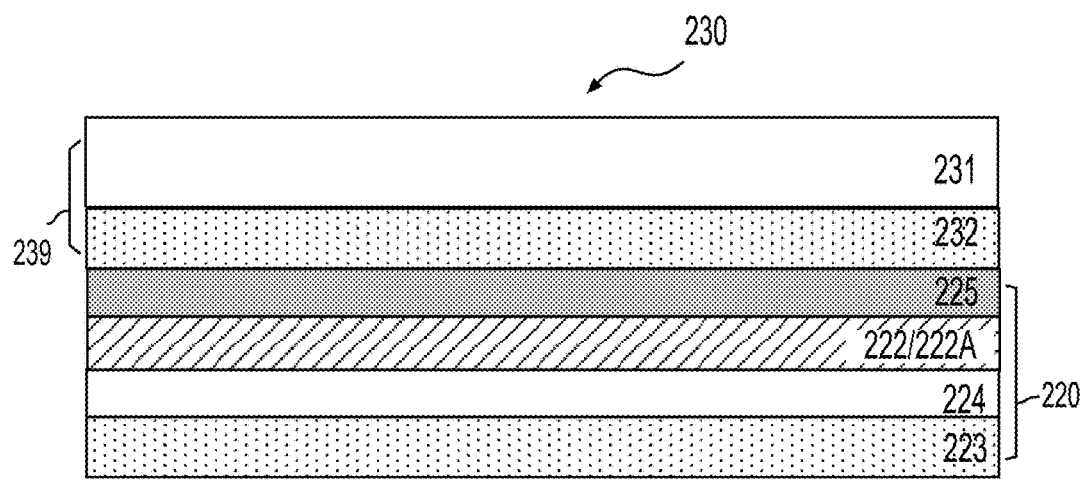

Referring to FIGS. 14 and 22, at S1440, the bulk substrate material 221 can be removed from the second substrate 229.

At S1450, the first portion 210 and the second portion 220 can be bonded to form the semiconductor apparatus 200 where the at least one first semiconductor device 212 and the at least one second semiconductor device 222 are positioned between the carrier substrate 239 and the first substrate 211. The at least one second semiconductor device 222 can be stacked above the at least one first semiconductor device 212 along a Z direction that is substantially perpendicular to a substrate plane of the first substrate 211.

In an example, referring to FIG. 23, a wiring layer 226 is formed from the dielectric layer 223 in the second portion 220. Metal X (e.g., M0, M1, M2, or the like) routing can be formed in the wiring layer 226.

Referring to FIG. 24, the first portion 210 and the second portion 220 are aligned prior to being bonded. Referring back to FIGS. 15 and 17, the first portion 110 can be fabricated on the first wafer 235, and the second portion 220 can be fabricated on the second wafer 236 that is different from the first wafer 235. The second substrate 229 is different from the first substrate 211. In an example, the first wafer 235 including the first portion 210 and the second wafer 236 including the second portion 220 are aligned such that the first portion 210 and the second portion 220 are aligned. Alternatively, the first wafer 235 can be divided (e.g., cut) into a first plurality of smaller portions (e.g., dies), and the second wafer 236 can be divided (e.g., cut) into a second plurality of smaller portions (e.g., dies). One of the first plurality of dies including the first portion 210 can be aligned to one of the second plurality of dies including the second portion 220 such that the first portion 210 and the second portion 220 are aligned. In an example, the first portion 210 and the second portion 220 are aligned such that the at least one first semiconductor device 212 is aligned with the at least one second semiconductor device 222.

Figure 25:
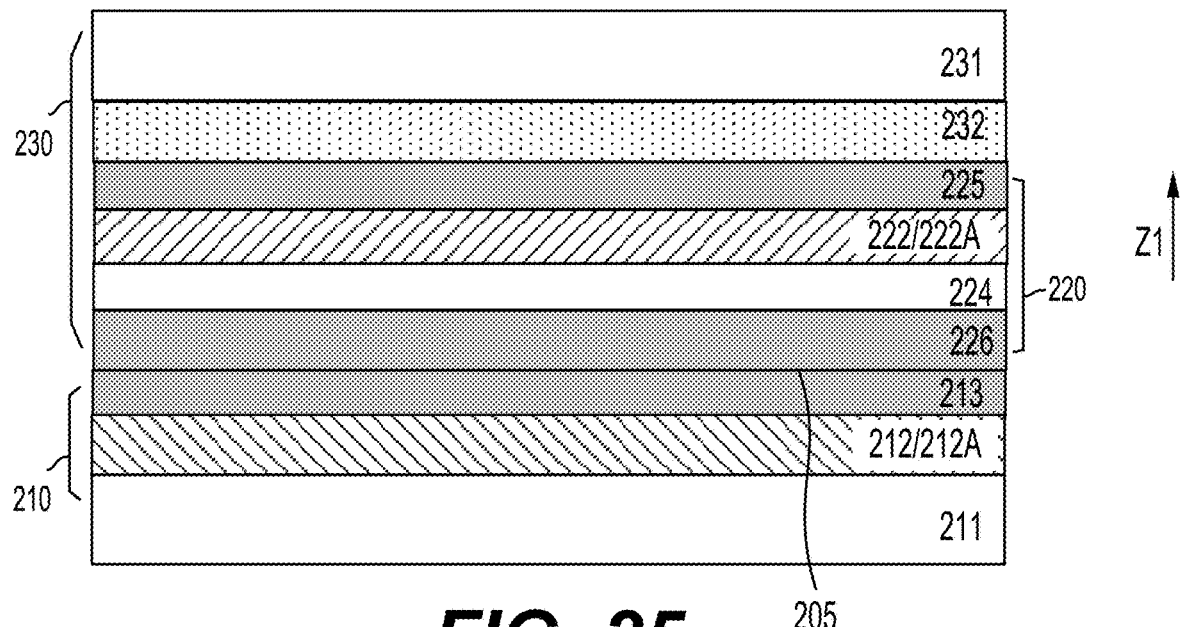

Referring to FIG. 25, the first portion 210 and the second portion 220 can be bonded after being aligned. In an example, the wiring layer 226 and the wiring layer 213 are bonded. Accordingly, the wiring layer 226 can be positioned between the at least one first semiconductor device 212 and the at least one second semiconductor device 222.

In an example, the first wafer 235 and the second wafer 236 are aligned and bonded. Accordingly, the first portion 210 and the second portion 220 are bonded. In an example, the one of the first plurality of dies including the first portion 210 can be bonded to the one of the second plurality of dies including the second portion 220, and thus the first portion 210 and the second portion 220 are bonded.

In an example, the wiring layer 226 is positioned in contact with the wiring layer 213 to align the at least one first semiconductor device 212 with the at least one second semiconductor device 222. The first portion 210 and the second portion 220 can be bonded at an interface 205 between the wiring layer 226 and the wiring layer 213.

The process flow 1400 can be suitably adapted to manufacture the semiconductor apparatus 200. For example, steps in the process flow 1400 can be suitably combined, modified, and/or omitted. Any suitable order can be used to implement the process flow 1400. Additional step(s) can be added to the process flow 1400.

Figure 26:
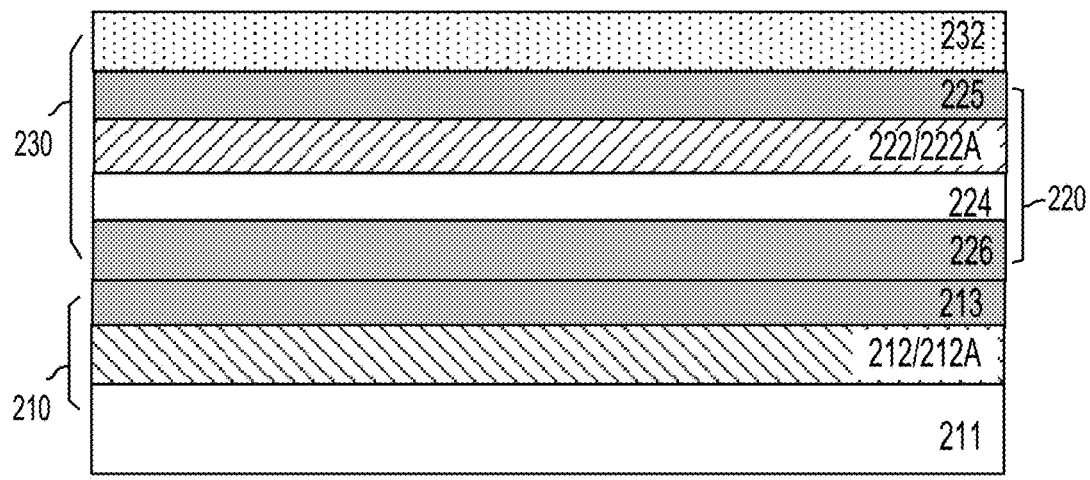
Figure 27:
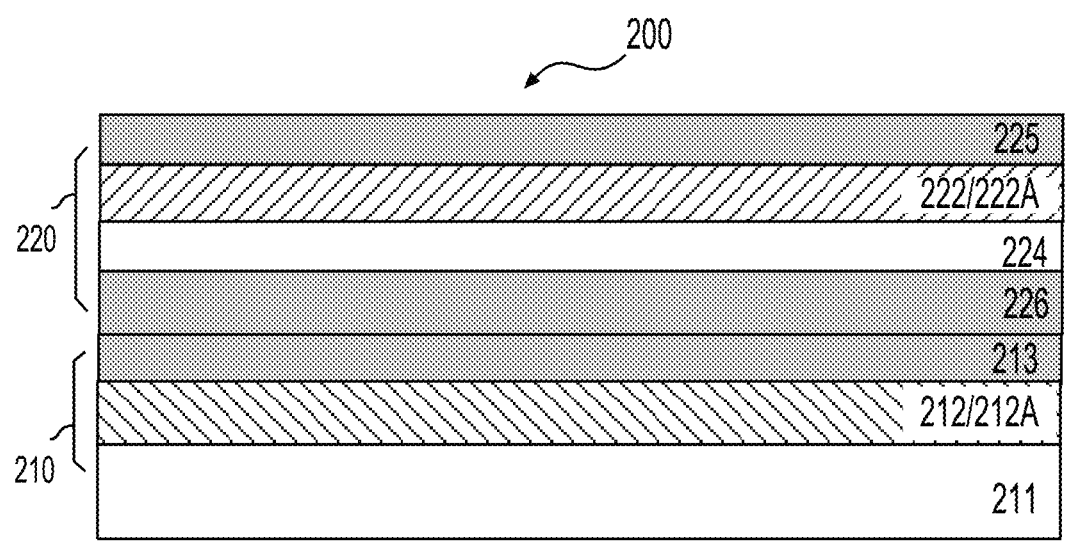

In an example, after bonding the first portion 210 and the second portion 220, a portion of the carrier substrate 239 or the carrier substrate 239 can be removed. Referring to FIG. 26, the bulk carrier substrate material (e.g., Si) 231 can be removed. Referring to FIG. 27, the dielectric layer 232 can be removed.

FIG. 27 shows an example of the semiconductor apparatus 200 that includes the second portion 220 stacked on the first portion 210. The first portion 210 includes the wiring layer 213, the at least one first semiconductor device 212 being NMOS device(s), and the first substrate 211 (e.g., Si substrate). The second portion 220 includes the wiring layer 225, the at least one second semiconductor device 222 being PMOS device(s), the layer 224 (e.g., Si layer), and the wiring layer 226. In an example, the at least one first semiconductor device 212 and the at least one second semiconductor device 222 are aligned.

The first portion 210 can include the sub-portion 212A and the second portion 220 can include the sub-portion 222A as described above. The sub-portion 212A can include one or more stacks of the at least one first semiconductor device 212, and the sub-portion 222A can include one or more stacks of the at least one second semiconductor device 222, similar as those described with reference to FIG. 13B except that the at least one first semiconductor device 212 includes NMOS devices and the at least one second semiconductor device 222 includes PMOS devices. In an example, one of the wiring layer 213 and the wiring layer 226 includes a power rail (or buried power rail).

The third flow is described with reference to FIGS. 28-40 and 14 and can be used to form the semiconductor apparatus 300. The process flow 1400 starts at S1401 and proceeds to S1410.

Figure 28:
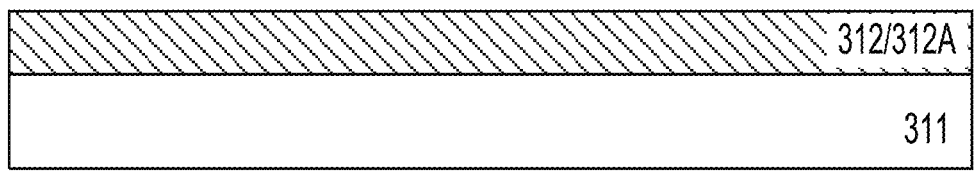
Figure 29:
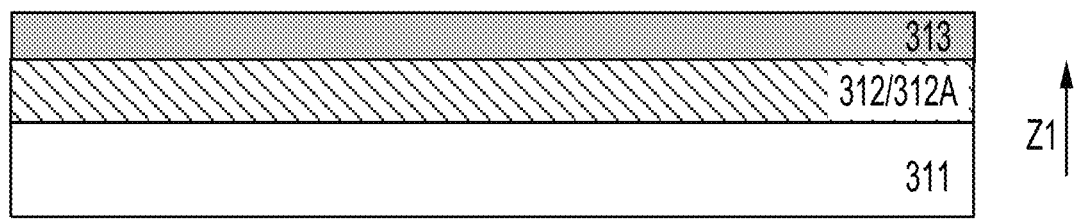

Referring to FIGS. 14, 28, and 29, at S1410, a first portion 310 of the semiconductor apparatus 300 can be formed on a first substrate 311. The first portion 310 can include at least one first semiconductor device 312 that can be one of NMOS device(s) and PMOS device(s). The at least one first semiconductor device 312 can be formed on the first substrate 311 (FIG. 28). The at least one first semiconductor device 312 can include first channel region(s) formed by a first epitaxial growth. In an example, the at least one first semiconductor device 312 includes one or more NMOS devices (e.g., a stack of NMOS devices stacked along a Z1 direction), and the first substrate 311 is a Si substrate. In an example, the first portion 310 including the first substrate 311 is on a first wafer 335.

In some examples, the first portion 310 includes a sub-portion 312A having the at least one first semiconductor device 312. In an example, the at least one first semiconductor device 312 includes multiple first MOS devices 312 and the sub-portion 312A includes one or more LIs that connect the multiple first MOS devices 312.

In an example, a wiring layer 313 is formed over the at least one first semiconductor device 312 where the at least one first semiconductor device 312 is positioned between the wiring layer 313 and the first substrate 311, and thus the first portion 310 further includes the wiring layer 313 (FIG. 29). Metal X (e.g., M0, M1, M2, or the like) routing can be formed in the wiring layer 313. Alternatively, no wiring layer is formed over the first semiconductor device 312, and thus the first portion 310 includes no wiring layer. In an example, the wiring layer 313 is formed over the sub-portion 312A.

Figure 30:
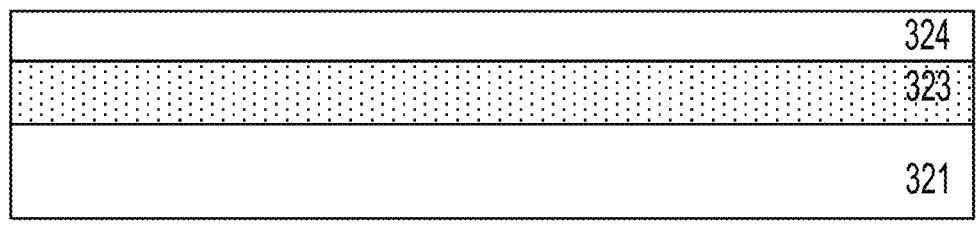

Referring to FIGS. 14 and 30-32, at S1420, a second portion 320 of the semiconductor apparatus 300 can be formed on a second substrate 329. The second portion 320 can include at least one second semiconductor device (e.g., MOS device) 322 that can be one of NMOS device(s) and PMOS device(s). In an example, the at least one second semiconductor device 322 includes one or more PMOS devices (e.g., a stack of PMOS devices stacked along a Z2 direction that is substantially perpendicular to a substrate plane of the second substrate 329). The second substrate 329 can include a bulk substrate material (e.g., Si) 321. Referring to FIG. 30, the second substrate 329 can further include a dielectric layer (e.g., an oxide layer) 323 stacked over the bulk substrate material 321, and a layer 324 of a single crystal semiconductor material (e.g., Ge or SiGe) stacked over the dielectric layer 323.

The at least one first semiconductor device 312 and the at least one second semiconductor device 322 can include GAA nano sheets.

Figure 31:
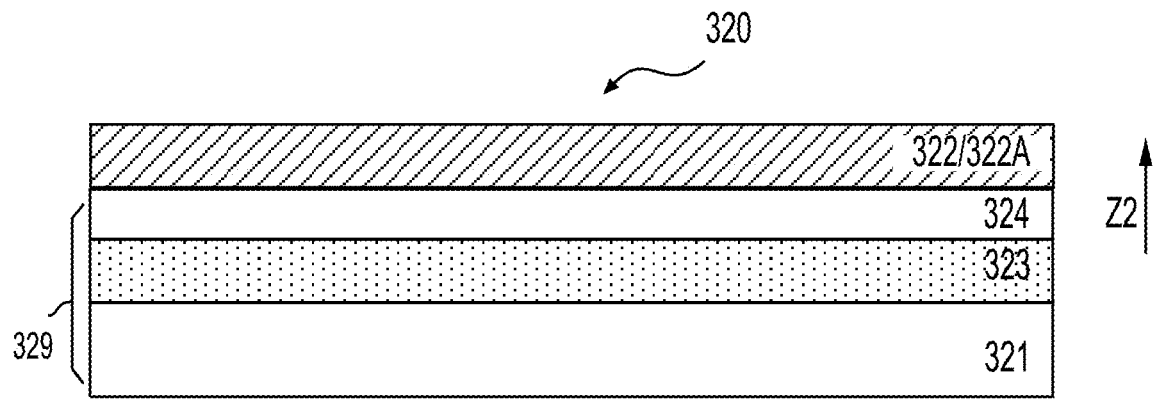
Figure 32:
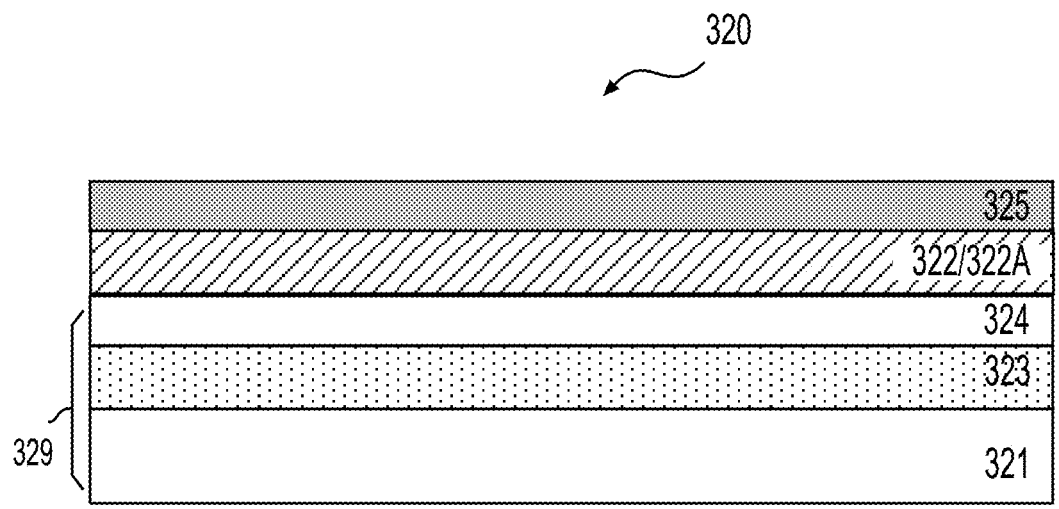

The at least one second semiconductor device 322 can be formed over the layer 324 (FIG. 31). The at least one second semiconductor device 322 can include second channel region(s) formed by a second epitaxial growth that is different from the first epitaxial growth in FIG. 28.

In some examples, the second portion 320 includes a sub-portion 322A having the at least one second semiconductor device 322. In an example, the at least one second semiconductor device 322 includes multiple second MOS devices 322 and the sub-portion 322A includes one or more LIs that connect the multiple second MOS devices 322.

In an example, a wiring layer 325 is formed over the at least one second semiconductor device 322 (FIG. 32), and thus the at least one second semiconductor device 322 is positioned between the second substrate 329 and the wiring layer 325. In an example, the wiring layer 325 is formed over the sub-portion 322A. Metal X (e.g., M0, M1, M2, or the like) routing can be formed in the wiring layer 325.

Figure 33:
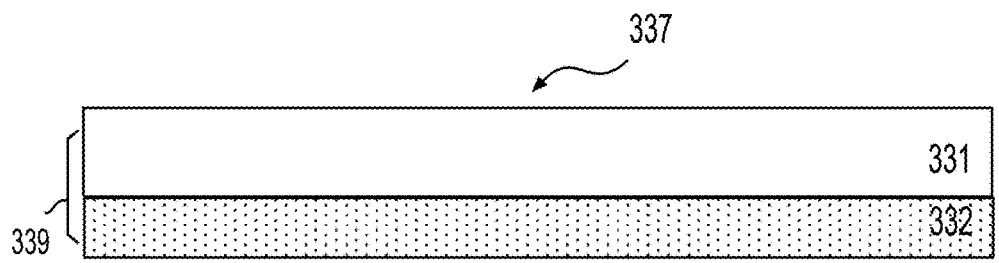
Figure 34:
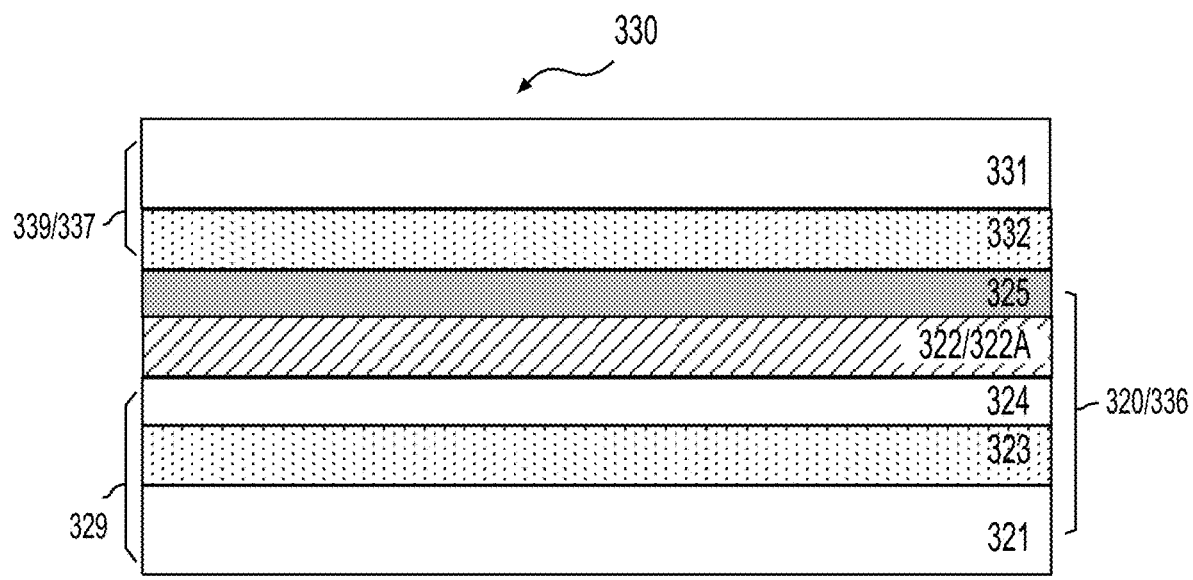

Referring to FIGS. 14, 33, and 34, at S1430, a carrier substrate 339 can be attached to the second portion 320 of the semiconductor apparatus 300 where the at least one second semiconductor device 322 can be positioned between the carrier substrate 339 and the second substrate 329.

Referring to FIG. 33, the carrier substrate 339 can include a bulk carrier substrate material (e.g., Si) 331. In an example, the carrier substrate 339 further includes a dielectric layer (e.g., an oxide layer) 332.

Referring to FIG. 34, the carrier substrate 339 can be attached to the second portion 320. In an embodiment, the dielectric layer 332 is attached to the second portion 320. In an embodiment, the carrier substrate 339 is attached to the wiring layer 325. In an example, the dielectric layer 332 is attached to the wiring layer 325 of the second portion 320. The at least one second semiconductor device 322 can be positioned between the carrier substrate 339 and the second substrate 329. Thus, a structure 330 can include the carrier substrate 339 and the second portion 320.

Referring back to FIGS. 30 and 33, in an example, the second substrate 329 is on a second wafer 336, and the carrier substrate 339 is on a carrier wafer 337 that is different from the second wafer 336. Referring to FIG. 34, the carrier wafer 337 including the carrier substrate 339 can be attached to the second wafer 336 including the second portion 320. The structure 330 can include the carrier wafer 337 and the second wafer 336.

Figure 35:
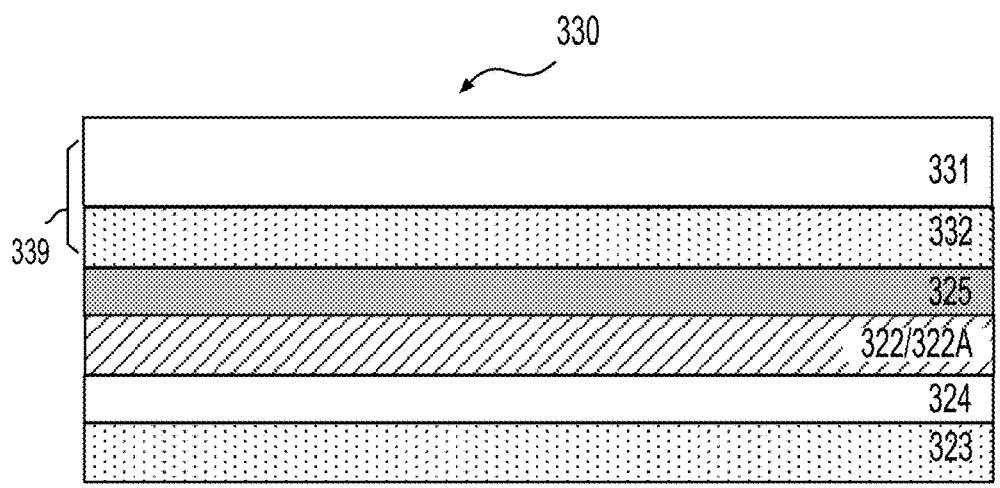

Referring to FIGS. 14 and 35, at S1440, the bulk substrate material 321 can be removed from the second substrate 329.

At S1450, the first portion 310 and the second portion 320 can be bonded to form the semiconductor apparatus 300 where the at least one first semiconductor device 312 and the at least one second semiconductor device 322 are positioned between the carrier substrate 339 and the first substrate 311. The at least one second semiconductor device 322 can be stacked above the at least one first semiconductor device 312 along a Z direction that is substantially perpendicular to a substrate plane of the first substrate 311.

In an example, referring to FIG. 36, a wiring layer 326 is formed from the dielectric layer 323 in the second portion 320. Metal X (e.g., M0, M1, M2, or the like) routing can be formed in the wiring layer 326.

Referring to FIG. 37, the first portion 310 and the second portion 320 are aligned prior to being bonded. Referring back to FIGS. 28 and 30, the first portion 310 can be fabricated on the first wafer 335, and the second portion 320 can be fabricated on the second wafer 336 that is different from the first wafer 335. The second substrate 329 is different from the first substrate 311. In an example, the first wafer 335 including the first portion 310 and the second wafer 336 including the second portion 320 are aligned such that the first portion 310 and the second portion 320 are aligned. Alternatively, the first wafer 335 can be divided (e.g., cut) into a first plurality of smaller portions (e.g., dies), and the second wafer 336 can be divided (e.g., cut) into a second plurality of smaller portions (e.g., dies). One of the first plurality of dies including the first portion 310 can be aligned to one of the second plurality of dies including the second portion 320 such that the first portion 310 and the second portion 320 are aligned. In an example, the first portion 310 and the second portion 320 are aligned such that the at least one first semiconductor device 312 is aligned with the at least one second semiconductor device 322.

Figure 38:
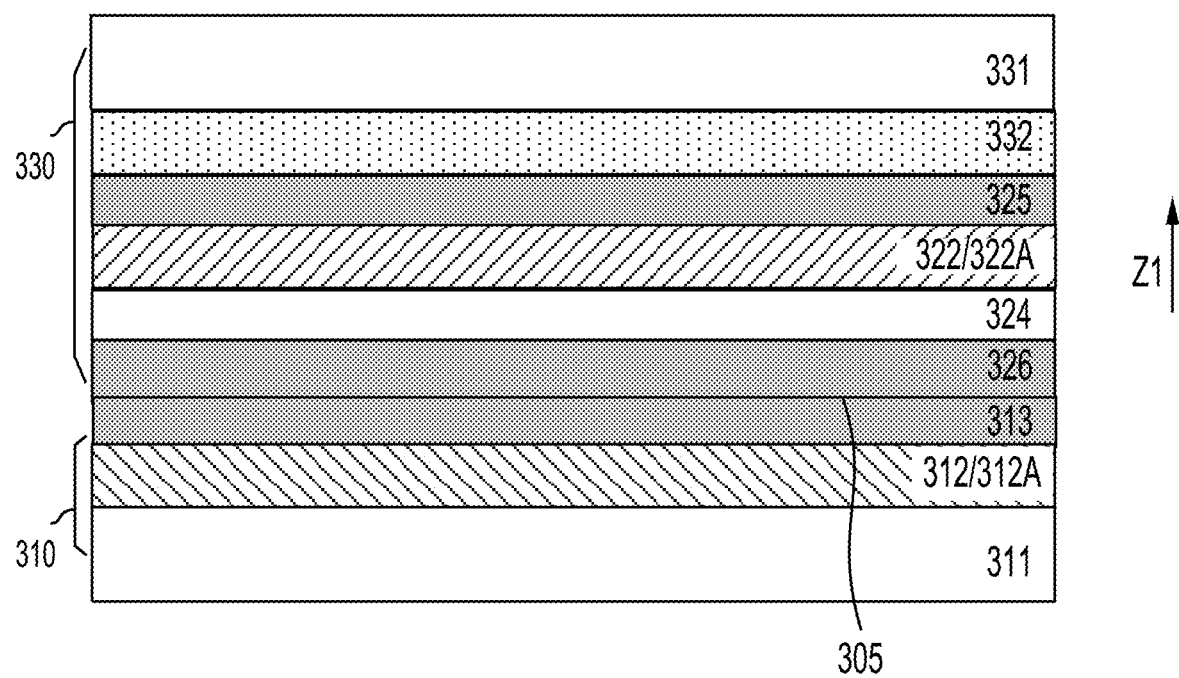

Referring to FIG. 38, the first portion 310 and the second portion 320 can be bonded after being aligned. In an example, the wiring layer 326 and the wiring layer 313 are bonded. Accordingly, the wiring layer 326 can be positioned between the at least one first semiconductor device 312 and the at least one second semiconductor device 322.

In an example, the first wafer 335 and the second wafer 336 are aligned and bonded. Accordingly, the first portion 310 and the second portion 320 are bonded. In an example, the one of the first plurality of dies including the first portion 310 can be bonded to the one of the second plurality of dies including the second portion 320, and thus the first portion 310 and the second portion 320 are bonded.

In an example, the wiring layer 326 is positioned in contact with the wiring layer 313 to align the at least one first semiconductor device 312 with the at least one second semiconductor device 322. The first portion 310 and the second portion 320 can be bonded at an interface 305 between the wiring layer 326 and the wiring layer 313.

The process flow 1400 can be suitably adapted to manufacture the semiconductor apparatus 300. For example, steps in the process flow 1400 can be suitably combined, modified, and/or omitted. Any suitable order can be used to implement the process flow 1400. Additional step(s) can be added to the process flow 1400.

Figure 39:
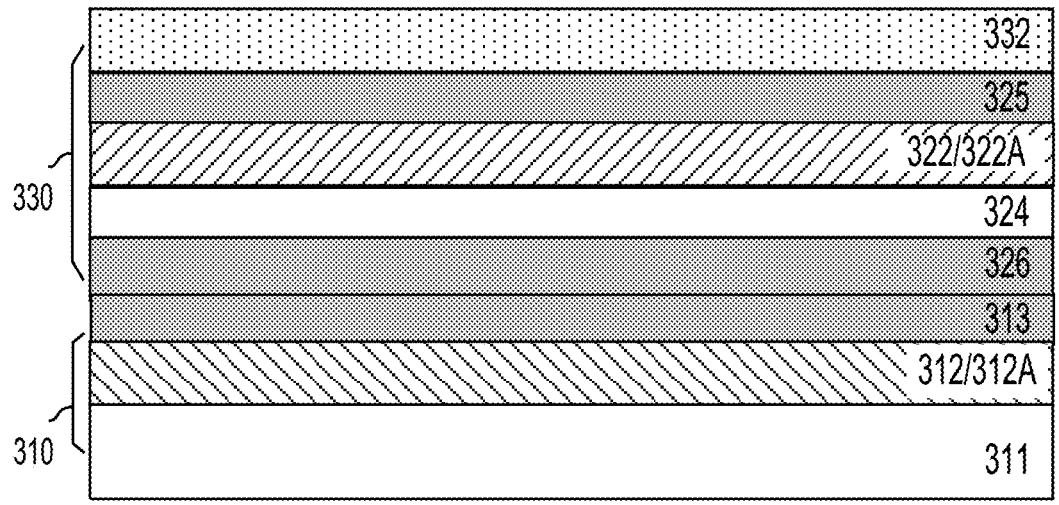
Figure 40:
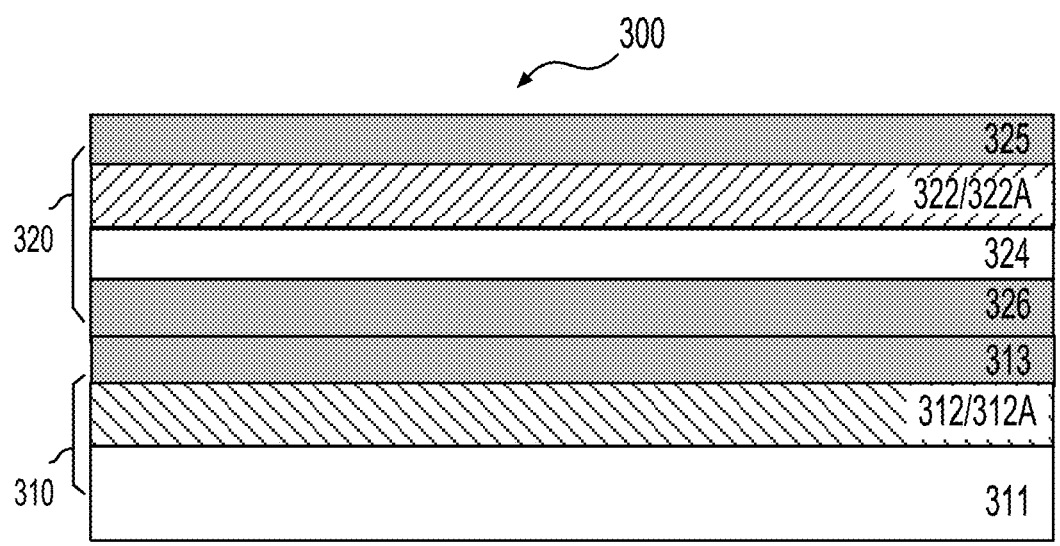

In an example, after bonding the first portion 310 and the second portion 320, a portion of the carrier substrate 339 or the carrier substrate 339 can be removed. Referring to FIG. 39, the bulk carrier substrate material (e.g., Si) 331 can be removed. Referring to FIG. 40, the dielectric layer 332 can be removed.

FIG. 40 shows an example of the semiconductor apparatus 300 that includes the second portion 320 stacked on the first portion 310. The first portion 310 includes the wiring layer 313, the at least one first semiconductor device 312 being NMOS device(s), and the first substrate 311 (e.g., Si substrate). The second portion 320 includes the wiring layer 325, the at least one second semiconductor device 322 being PMOS device(s), the layer 324 (e.g., Ge layer or SiGe layer), and the wiring layer 326. In an example, the at least one first semiconductor device 312 and the at least one second semiconductor device 322 are aligned.

The first portion 310 can include the sub-portion 312A and the second portion 320 can include the sub-portion 322A as described above. The sub-portion 312A can include one or more stacks of the at least one first semiconductor device 312, and the sub-portion 322A can include one or more stacks of the at least one second semiconductor device 322, similar as those described with reference to FIG. 13B except that the at least one first semiconductor device 312 includes NMOS devices and the at least one second semiconductor device 322 includes PMOS devices. In an example, one of the wiring layer 313 and the wiring layer 326 includes a power rail (or buried power rail).

The fourth flow is described with reference to FIGS. 41-54 and 14 and can be used to form the semiconductor apparatus 400. The process flow 1400 starts at S1401 and proceeds to S1410.

Figure 41:
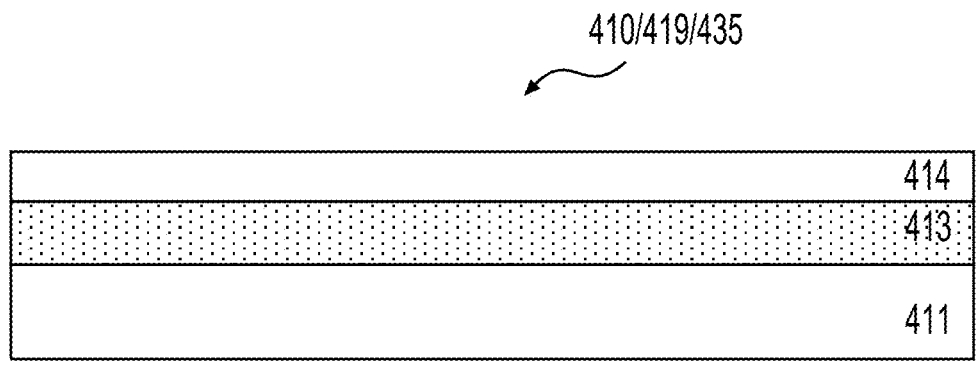
FIGS. 41-54 show exemplary cross sectional views of a semiconductor apparatus 400 in various steps of a process flow according to some embodiments of the disclosure.

Referring to FIGS. 14 and 41-43, at S1410, a first portion 410 of the semiconductor apparatus 400 can be formed on a first substrate 419. The first portion 410 can include at least one first semiconductor device 412 that can be one of NMOS device(s) and PMOS device(s). Referring to FIG. 41, the first substrate 419 can include a bulk substrate material (e.g., Si) 411. In an example, the first substrate 419 further includes a dielectric layer (e.g., an oxide layer) 413 stacked over the bulk substrate material 411, and a layer 414 of a single crystal semiconductor material (e.g., Si or SiC) stacked over the dielectric layer 413. In an example, the first portion 410 including the first substrate 419 is on a first wafer 435.

Figure 42:
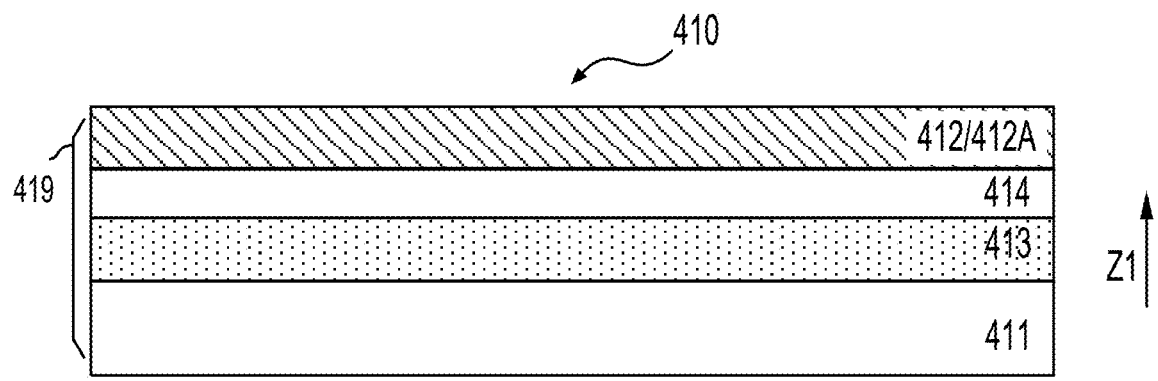

The at least one first semiconductor device 412 can be formed on the first substrate 419 (FIG. 42). For example, the at least one first semiconductor device 412 can be formed on the layer 414. The at least one first semiconductor device 412 can include first channel region(s) formed by a first epitaxial growth. In an example, the at least one first semiconductor device 412 includes one or more NMOS devices (e.g., a stack of NMOS devices stacked along a Z1 direction).

In some examples, the first portion 410 includes a sub-portion 412A having the at least one first semiconductor device 412. In an example, the at least one first semiconductor device 412 includes multiple first MOS devices 412 and the sub-portion 412A includes one or more LIs that connect the multiple first MOS devices 412.

Figure 43:
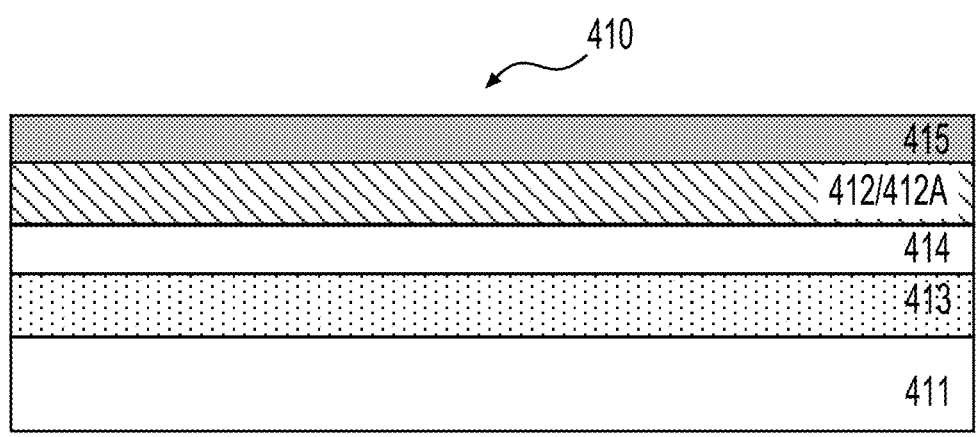

In an example, referring to FIG. 43, a wiring layer 415 is formed over the at least one first semiconductor device 412 where the at least one first semiconductor device 412 is positioned between the wiring layer 415 and the first substrate 419, and thus the first portion 410 further includes the wiring layer 415. Metal X (e.g., M0, M1, M2, or the like) routing can be formed in the wiring layer 415. Alternatively, no wiring layer is formed over the first semiconductor device 412, and thus the first portion 410 includes no wiring layer. In an example, the wiring layer 415 is formed over the sub-portion 412A.

Figure 44:
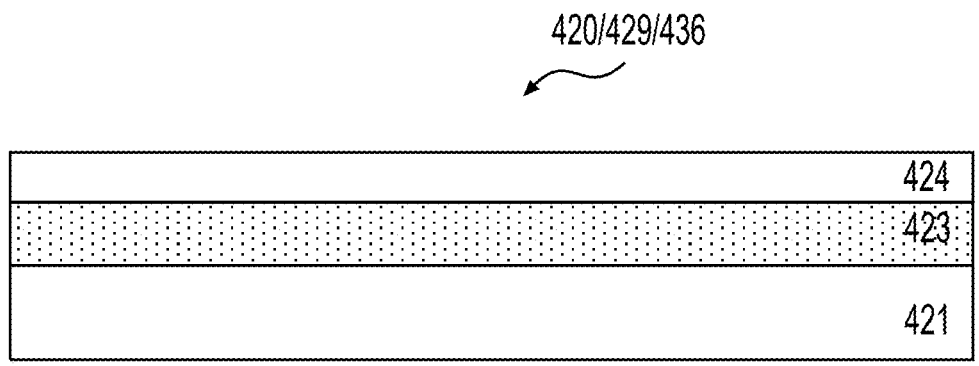

Referring to FIGS. 14 and 44-46, at S1420, a second portion 420 of the semiconductor apparatus 400 can be formed on a second substrate 429. The second portion 420 can include at least one second semiconductor device 422 that can be one of NMOS device(s) and PMOS device(s). In an example, the at least one second semiconductor device 422 includes one or more PMOS devices (e.g., a stack of PMOS devices stacked along a Z2 direction that is substantially perpendicular to a substrate plane of the second substrate 429). The second substrate 429 can include a bulk substrate material (e.g., Si) 421. Referring to FIG. 44, the second substrate 429 can further include a dielectric layer (e.g., an oxide layer) 423 stacked over the bulk substrate material 421, and a layer 424 of a single crystal semiconductor material (e.g., Ge or SiGe) stacked over the dielectric layer 423.

The at least one first semiconductor device 412 and the at least one second semiconductor device 422 can include GAA nano sheets.

Figure 45:
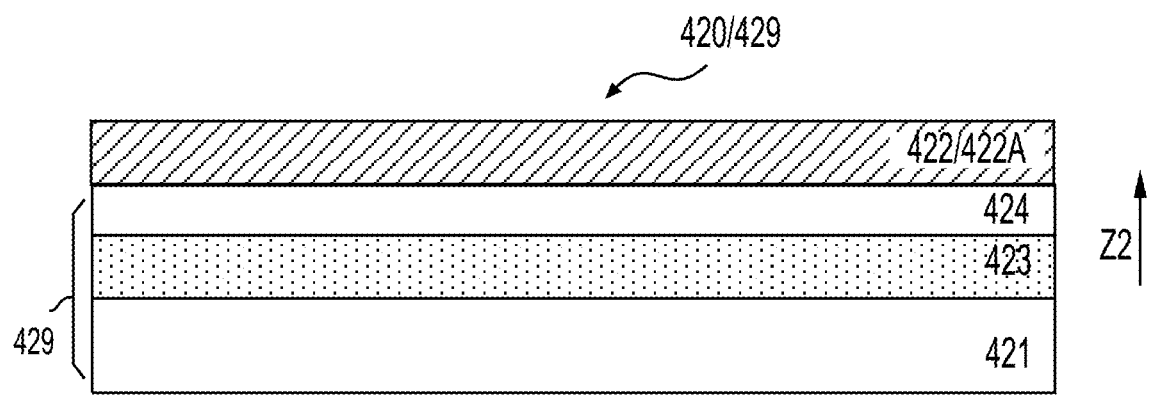
Figure 46:
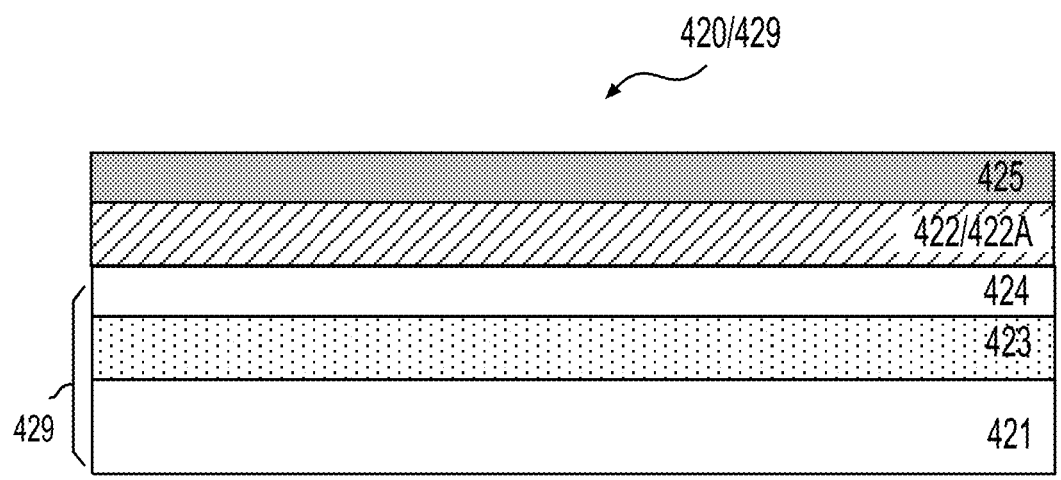

The at least one second semiconductor device 422 can be formed over the layer 424 (FIG. 45). The at least one second semiconductor device 422 can include second channel region(s) formed by a second epitaxial growth that is different from the first epitaxial growth.

In some examples, the second portion 420 includes a sub-portion 422A having the at least one second semiconductor device 422. In an example, the at least one second semiconductor device 422 includes multiple second MOS devices 422 and the sub-portion 422A includes one or more LIs that connect the multiple second MOS devices 422.

In an example, a wiring layer 425 is formed over the at least one second semiconductor device 422 (FIG. 46), and thus the at least one second semiconductor device 422 is positioned between the second substrate 429 and the wiring layer 425. In an example, the wiring layer 425 is formed over the sub-portion 422A. Metal X (e.g., M0, M1, M2, or the like) routing can be formed in the wiring layer 425.

Figure 47:
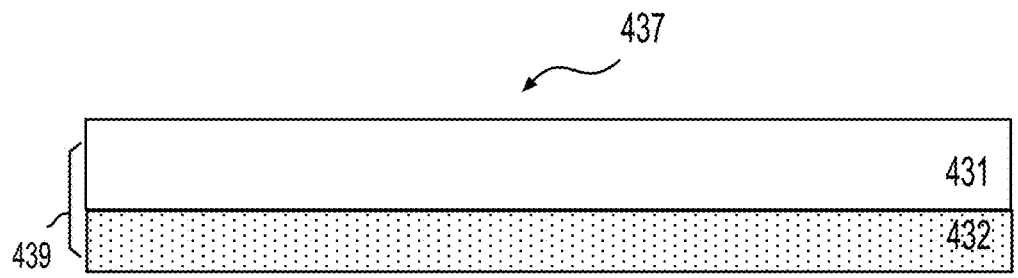
Figure 48:
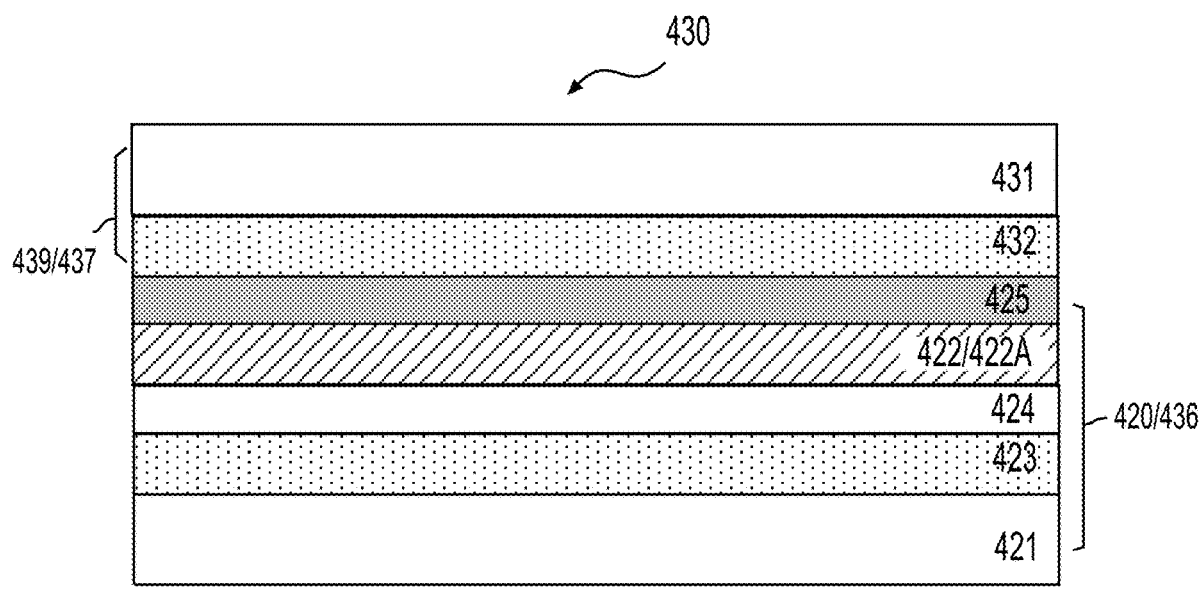

Referring to FIGS. 14, 47, and 48, at S1430, a carrier substrate 439 can be attached to the second portion 420 of the semiconductor apparatus 400 where the at least one second semiconductor device 422 can be positioned between the carrier substrate 439 and the second substrate 429.

Referring to FIG. 47, the carrier substrate 439 can include a bulk carrier substrate material (e.g., Si) 431. In an example, the carrier substrate 439 further includes a dielectric layer (e.g., an oxide layer) 432.

Referring to FIG. 48, the carrier substrate 439 can be attached to the second portion 420. In an embodiment, the dielectric layer 432 is attached to the second portion 420. In an embodiment, the carrier substrate 439 is attached to the wiring layer 425. In an example, the dielectric layer 432 is attached to the wiring layer 425 of the second portion 420. The at least one second semiconductor device 422 can be between the carrier substrate 439 and the second substrate 429. Thus, a structure 430 can include the carrier substrate 439 and the second portion 420.

Referring back to FIGS. 44 and 47, in an example, the second substrate 429 is on a second wafer 436, and the carrier substrate 439 is on a carrier wafer 437 that is different from the second wafer 436. Referring to FIG. 48, the carrier wafer 437 including the carrier substrate 439 can be attached to the second wafer 436 including the second portion 420. The structure 430 can include the carrier wafer 437 and the second wafer 436.

Figure 49:
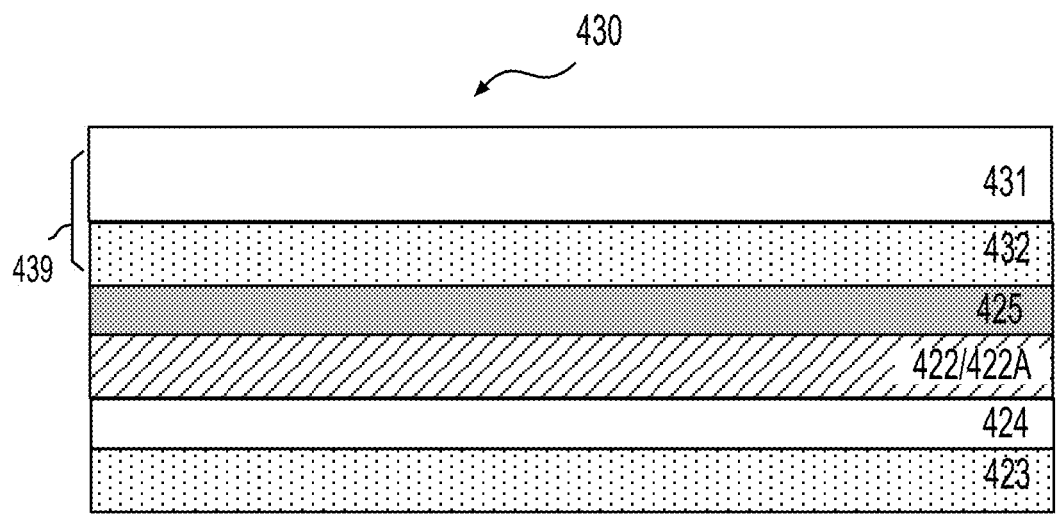

Referring to FIGS. 14 and 49, at S1440, the bulk substrate material 421 can be removed from the second substrate 429.

At S1450, the first portion 410 and the second portion 420 can be bonded to form the semiconductor apparatus 400 where the at least one first semiconductor device 412 and the at least one second semiconductor device 422 are positioned between the carrier substrate 439 and the first substrate 419. The at least one second semiconductor device 422 can be stacked above the at least one first semiconductor device 412 along a Z direction that is substantially perpendicular to a substrate plane of the first substrate 419.

Figure 50:
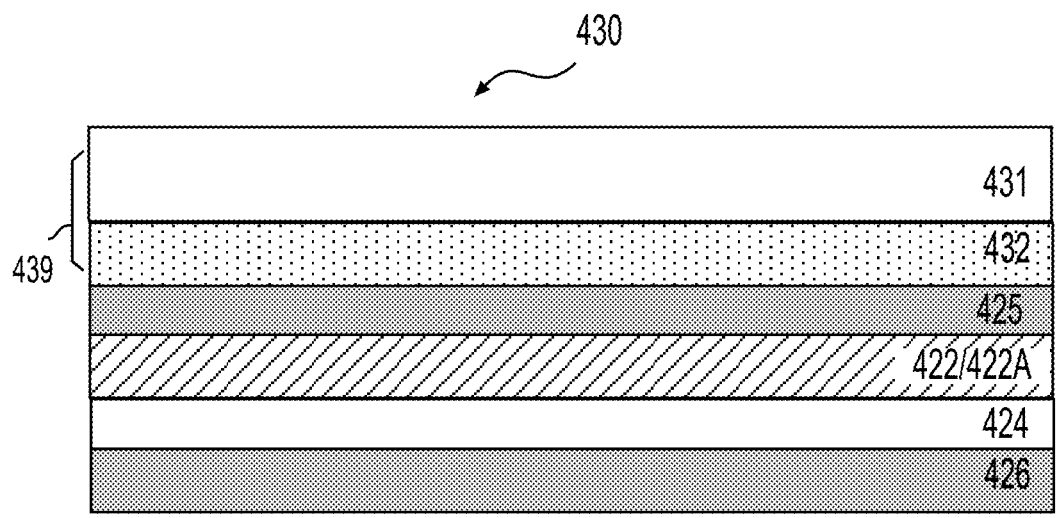

In an example, referring to FIG. 50, a wiring layer 426 is formed from the dielectric layer 423 in the second portion 420. Metal X (e.g., M0, M1, M2, or the like) routing can be formed in the wiring layer 426.

Figure 51:
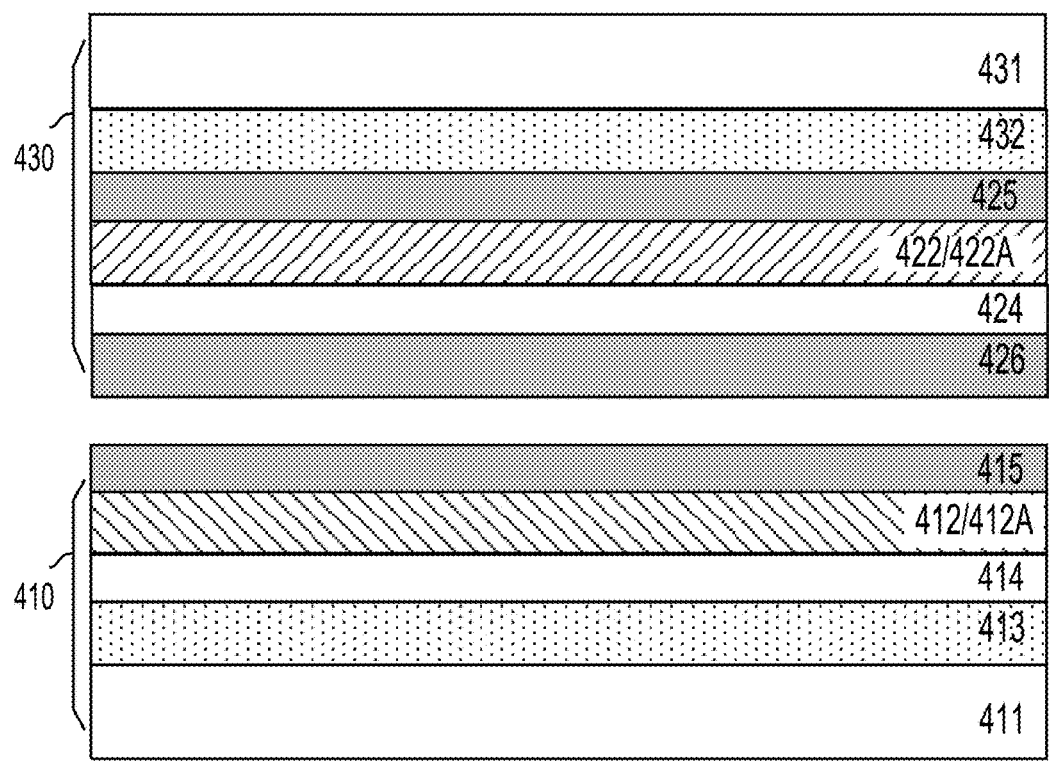

Referring to FIG. 51, the first portion 410 and the second portion 420 are aligned prior to being bonded. Referring back to FIGS. 41 and 44, the first portion 410 can be fabricated on the first wafer 435, and the second portion 420 can be fabricated on the second wafer 436 that is different from the first wafer 435. The second substrate 429 is different from the first substrate 419136

In an example, the first wafer 435 including the first portion 410 and the second wafer 436 including the second portion 420 are aligned such that the first portion 410 and the second portion 420 are aligned. Alternatively, the first wafer 435 can be divided (e.g., cut) into a first plurality of smaller portions (e.g., dies), and the second wafer 436 can be divided (e.g., cut) into a second plurality of smaller portions (e.g., dies). One of the first plurality of dies including the first portion 410 can be aligned to one of the second plurality of dies including the second portion 420 such that the first portion 410 and the second portion 420 are aligned. In an example, the first portion 410 and the second portion 420 are aligned such that the at least one first semiconductor device 412 is aligned with the at least one second semiconductor device 422.

Figure 52:
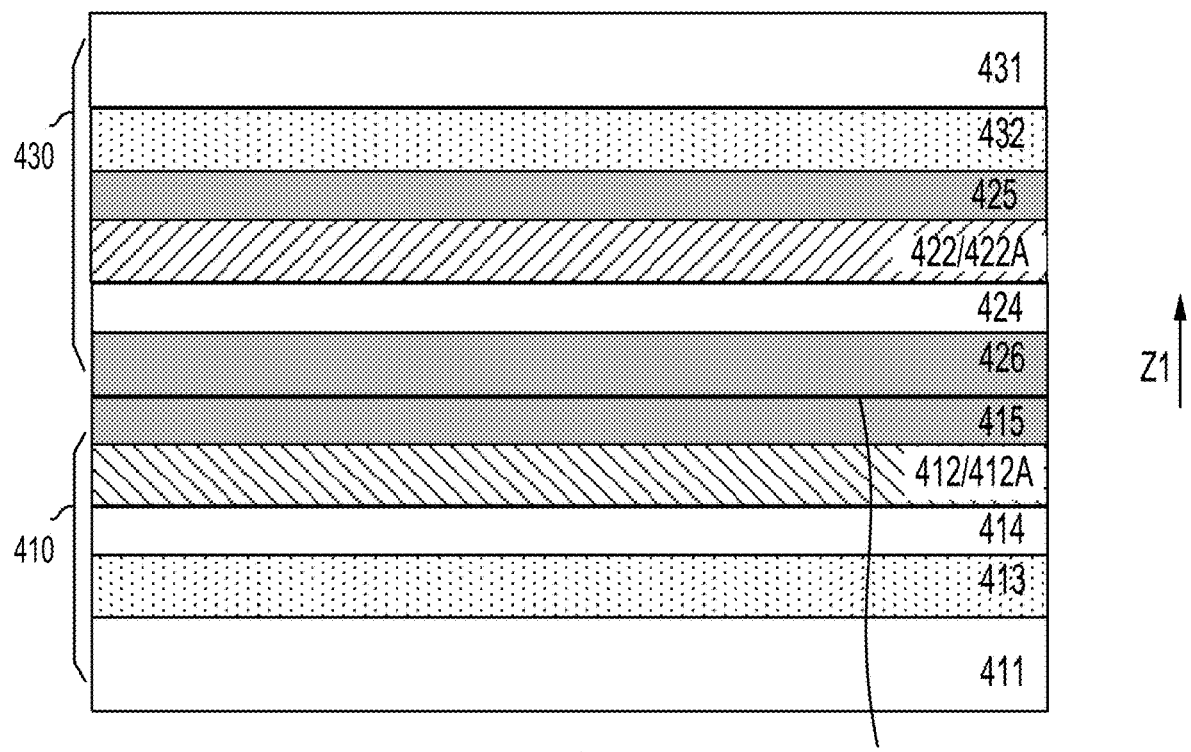

Referring to FIG. 52, the first portion 410 and the second portion 420 can be bonded after being aligned. In an example, the wiring layer 426 and the wiring layer 415 are bonded. Accordingly, the wiring layer 426 can be positioned between the at least one first semiconductor device 412 and the at least one second semiconductor device 422.

In an example, the first wafer 435 and the second wafer 436 are aligned and bonded. Accordingly, the first portion 410 and the second portion 420 are bonded. In an example, the one of the first plurality of dies including the first portion 410 can be bonded to the one of the second plurality of dies including the second portion 420, and thus the first portion 410 and the second portion 420 are bonded.

In an example, the wiring layer 426 is positioned in contact with the wiring layer 415 to align the at least one first semiconductor device 412 with the at least one second semiconductor device 422. The first portion 410 and the second portion 420 can be bonded at an interface 405 between the wiring layer 426 and the wiring layer 415.

The process flow 1400 can be suitably adapted to manufacture the semiconductor apparatus 400. For example, steps in the process flow 1400 can be suitably combined, modified, and/or omitted. Any suitable order can be used to implement the process flow 1400. Additional step(s) can be added to the process flow 1400.

Figure 53:
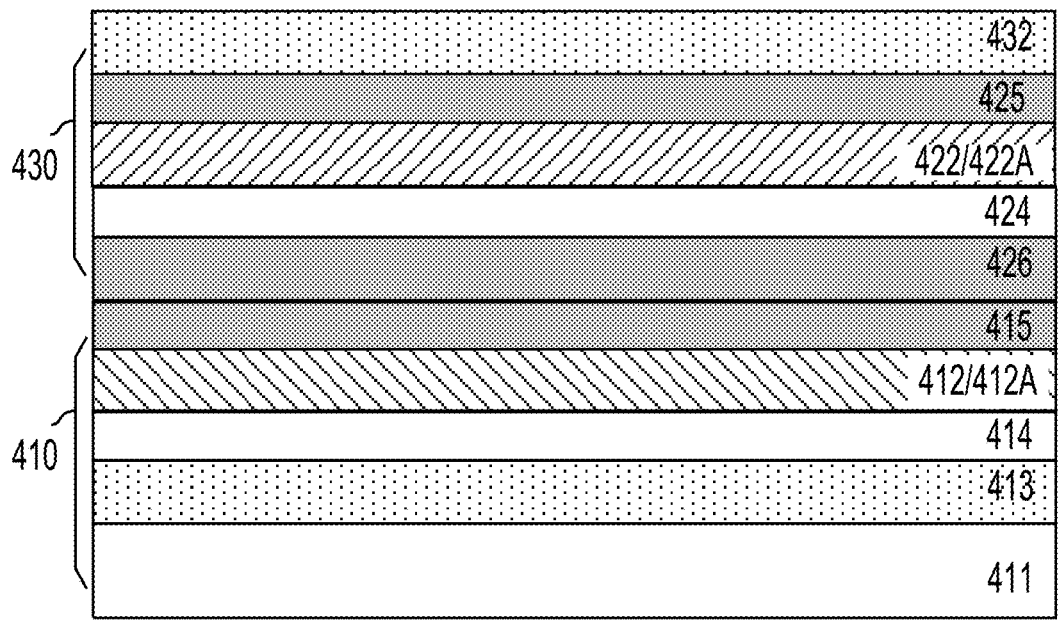
Figure 54:
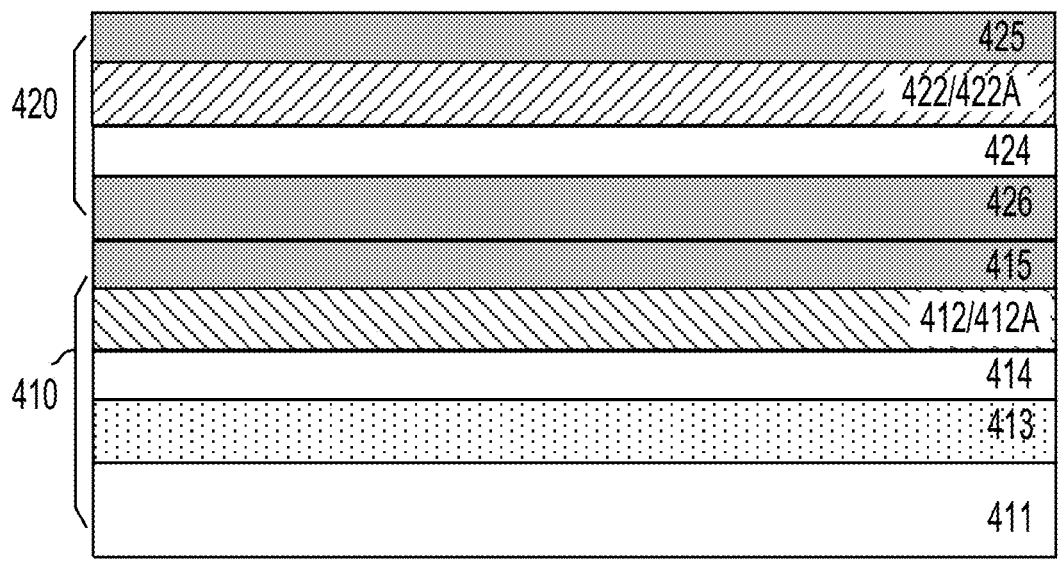

In an example, after bonding the first portion 410 and the second portion 420, a portion of the carrier substrate 439 or the carrier substrate 439 can be removed. Referring to FIG. 53, the bulk carrier substrate material (e.g., Si) 431 can be removed. Referring to FIG. 54, the dielectric layer 432 can be removed.

FIG. 54 shows an example of the semiconductor apparatus 400 that includes the second portion 420 stacked on the first portion 410. The first portion 410 includes the wiring layer 415, the at least one first semiconductor device 412 being NMOS device(s), and the first substrate 419 (e.g., including the layer 414, the dielectric layer 413, and the bulk substrate material (e.g., Si)). The second portion 420 includes the wiring layer 425, the at least one second semiconductor device 422 being PMOS device(s), the layer 424 (e.g., Ge layer or SiGe layer), and the wiring layer 426. In an example, the at least one first semiconductor device 412 and the at least one second semiconductor device 422 are aligned.

The first portion 410 can include the sub-portion 412A and the second portion 420 can include the sub-portion 422A as described above. The sub-portion 412A can include one or more stacks of the at least one first semiconductor device 412, and the sub-portion 422A can include one or more stacks of the at least one second semiconductor device 422, similar as those described with reference to FIG. 13B except that the at least one first semiconductor device 412 includes NMOS devices and the at least one second semiconductor device 422 includes PMOS devices. In an example, one of the wiring layer 415 and the wiring layer 426 includes a power rail (or buried power rail).

As described above with reference to FIGS. 1-54, a complementary MOS (CMOS) device (e.g., complementary field-effect transistors (FET) (CFET)) including a NMOS (e.g., an nFET) and a PMOS (e.g., a pFET) can be formed in the semiconductor apparatuses 100, 200, 300, and 400.

The process flow 1400 can be suitably adapted to manufacture a semiconductor apparatus that is different from the semiconductor apparatuses 100, 200, 300, and 400.

Figure 86A:
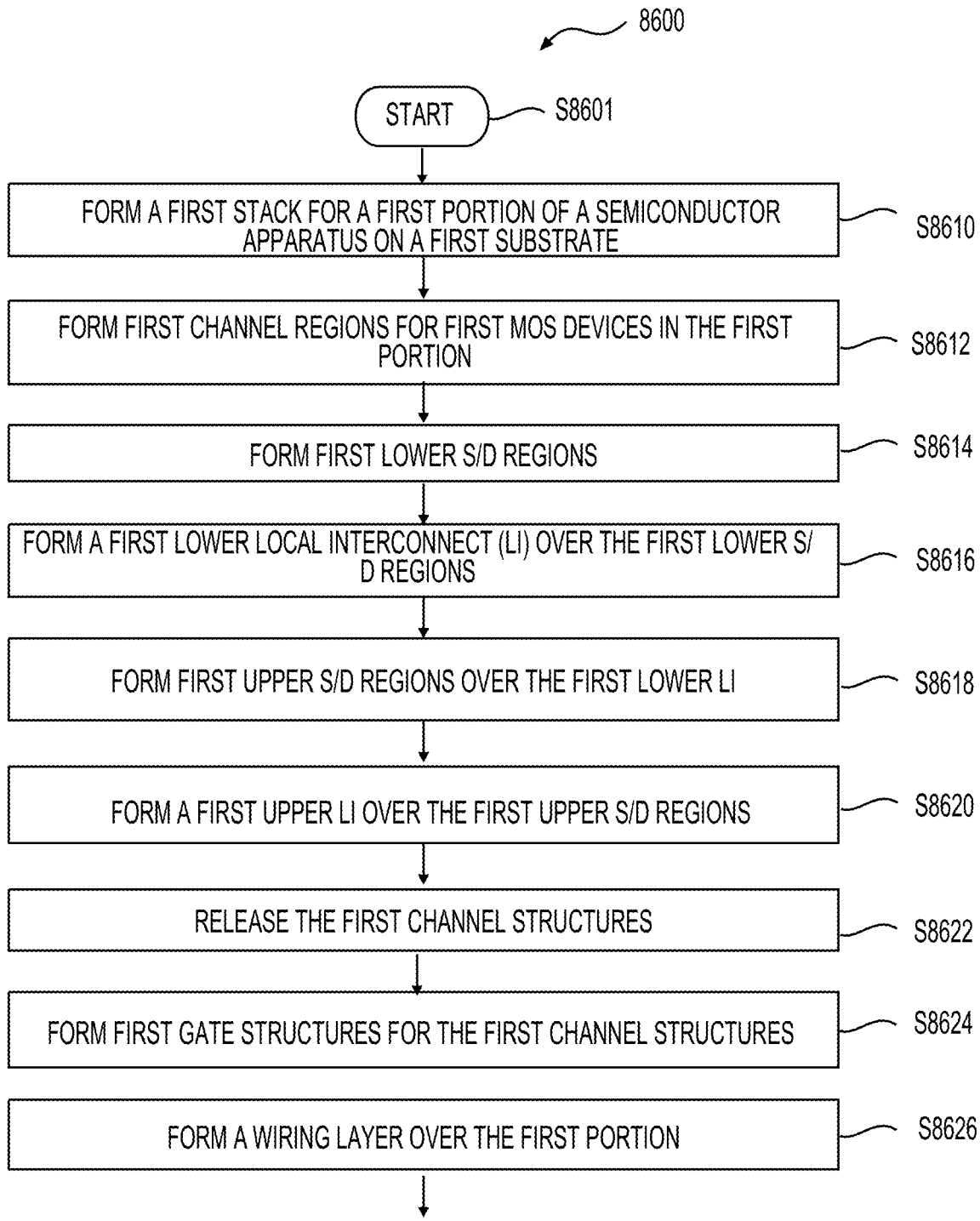
FIGS. 86A-86B shows an exemplary process flow to form a semiconductor apparatus according to an embodiment of the disclosure.
Figure 86B:
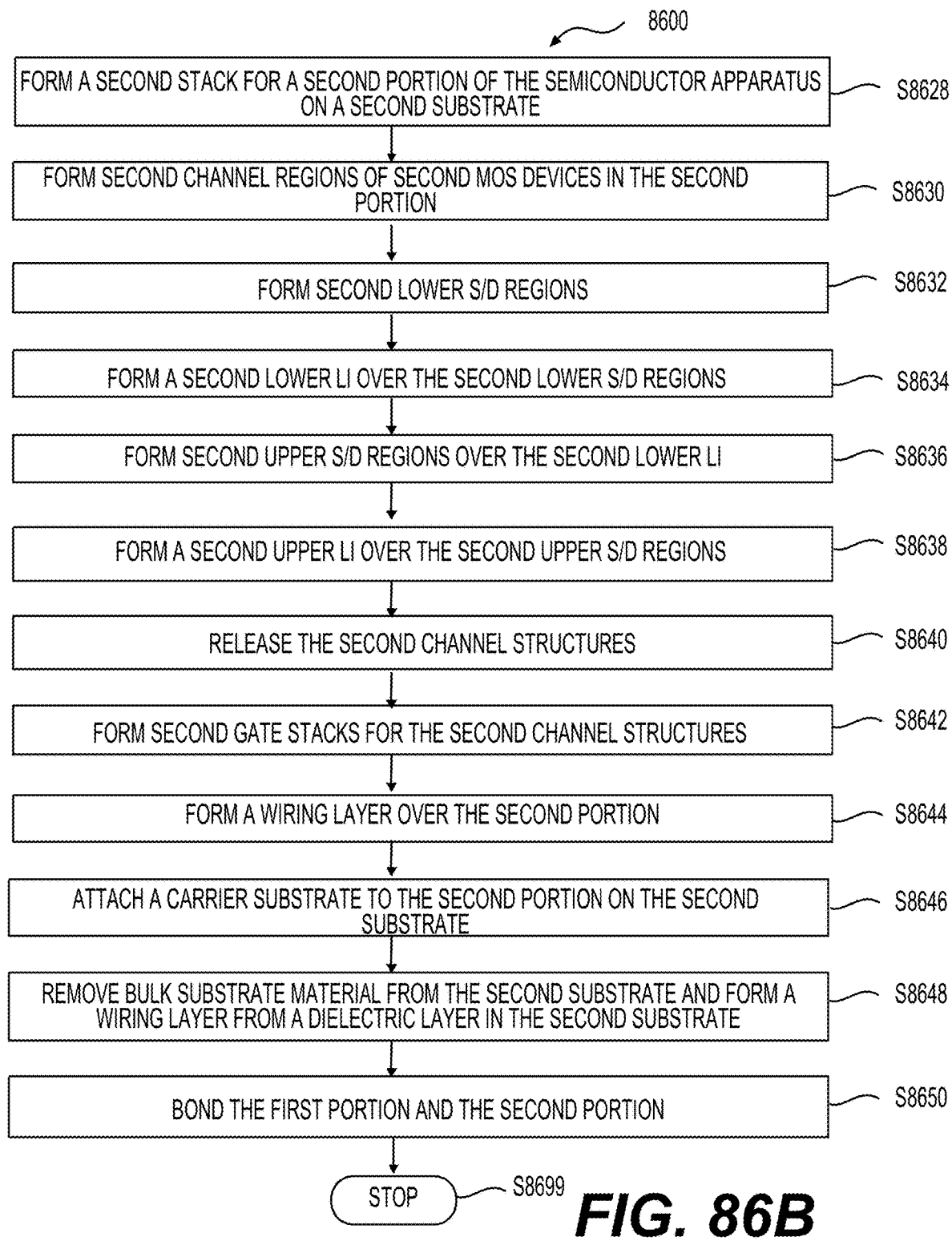

FIGS. 86A and 86B show an exemplary process flow 8600 to form a semiconductor apparatus (e.g., a 3D semiconductor apparatus) according to an embodiment of the disclosure. The process flow 8600 can be used to manufacture the semiconductor apparatus 200 in FIGS. 15-27. The process flow 8600 can be suitably adapted to manufacture the semiconductor apparatus 100, 300, and 400 or other 3D semiconductor apparatus from multiple wafers or multiple substrates.

Descriptions below are given to illustrate an example of the second flow. Referring to FIGS. 15 and 17, NMOS device(s) formed on an NMOS wafer (e.g., the first wafer 235) including a Si substrate (e.g., the first substrate 211) can be combined with PMOS device(s) formed on a PMOS wafer (e.g., the second wafer 236) that includes a single crystal Si layer (e.g., the layer 224) on an oxide layer (e.g., the dielectric layer 223) that is stacked on a Si substrate (e.g., the bulk substrate material 221). Drawings and descriptions illustrate a process flow including nano sheet(s) (e.g., N+ Si layers 504 in FIG. 55) formation with a substrate selection. Various types of substrates (e.g., the first substrate 211 and the second substrate 229) can be selected for various design objectives and can provide different device characteristics to optimize performance (e.g., mobility) of a semiconductor apparatus fabricated with the process flow.

Various techniques (e.g., bonding techniques described in U.S. patent application Ser. No. 16/854,340) can be used for bonding wafers together. Moreover, metal layer(s) can include pads or enlarged connection points to assist with alignment and connection of two or more wafers. Techniques herein provide metal X layer completed through metal X routing followed by, for example, an oxide deposition on top of the metal X routing. A dual damascene process can be used for metal connection from a wafer (e.g., a PMOS wafer). When attached to another wafer (e.g., an NMOS wafer), a CFET can be formed.

Power rail(s) can be formed between the two wafers (e.g., the PMOS and NMOS wafers), for example, to provide power supply to a semiconductor apparatus (e.g., the semiconductor apparatus 200). The power rail(s) can supply a positive voltage (e.g., Vdd), a ground voltage (e.g., GRND), a negative voltage, and/or the like.

Descriptions below show two wafers with NMOS and PMOS circuits, respectively. The descriptions can be suitably adapted to combine (or bond) any suitable number of wafers, such as 2, 3, 10, or the like. A wafer can include any suitable number of nano sheets (or nano planes) where respective channel regions can be formed. The number of nano sheets in a wafer can be one or more, such as 4, 8, or the like. By combining wafers and nano planes with elements that are optimized for NMOS and PMOS devices, respectively, techniques herein can achieve very high performance 3D circuits.

Figure 55:
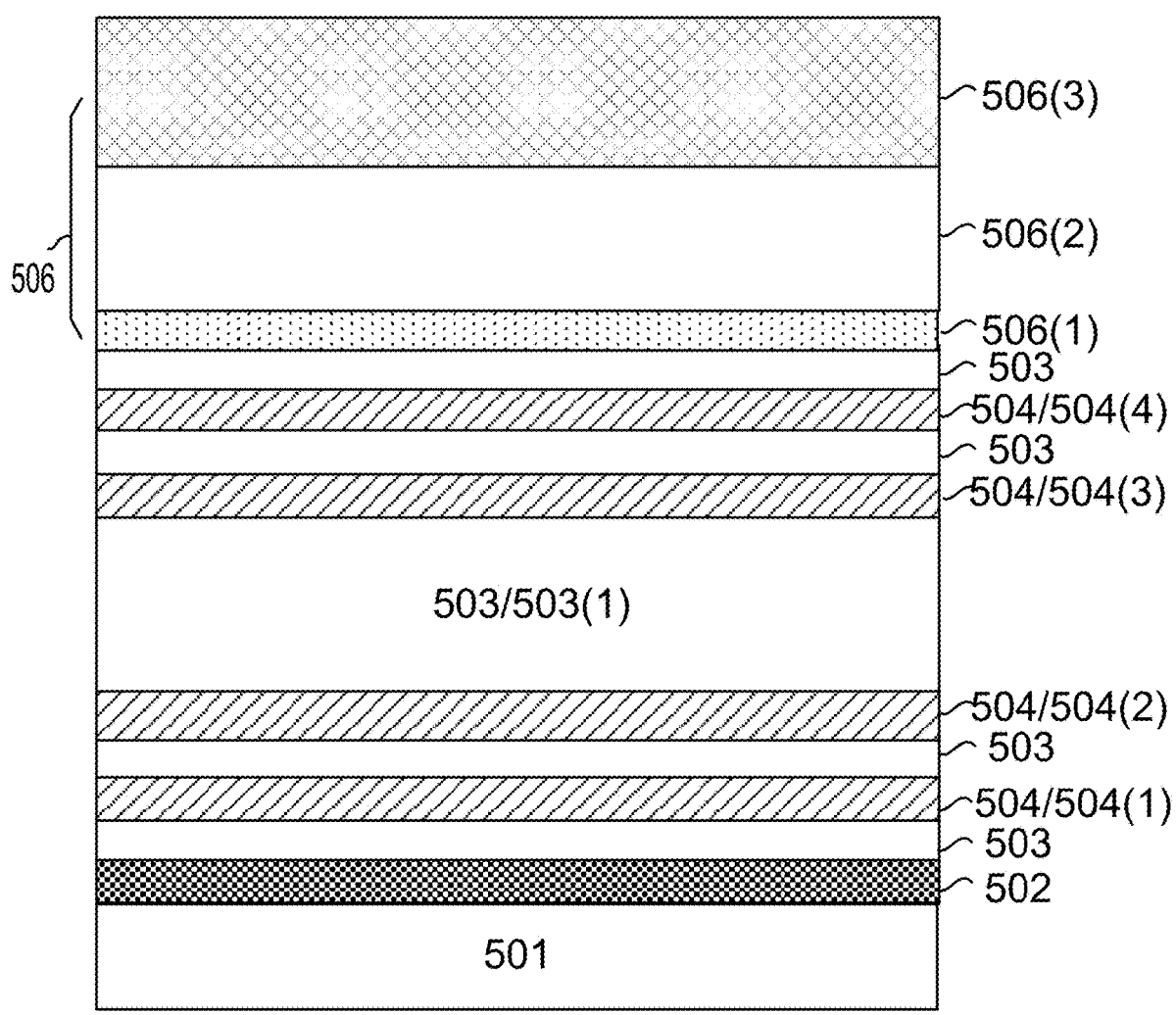
FIGS. 55-73, 74A, 74B, 75-84, 85A, and 85B show exemplary cross sectional views of a semiconductor apparatus 500 in various steps of a process flow according to some embodiments of the disclosure.

The process flow 8600 starts at S8601 and proceeds to S8610. Referring to FIGS. 55 and 86A, at S8610, a first stack 561 for a first portion 510 of a semiconductor apparatus 500 can be formed on a first substrate 501. In an embodiment, the first substrate 501 is on a first wafer 562.

The first substrate 501 can be a Si substrate where a bulk substrate material is Si. The first stack 561 can include any suitable layers and materials, such as dielectric material(s), semiconductor material(s), and/or the like. The semiconductor material(s) can include single crystal (or monocrystalline) material(s), polycrystalline material(s), and/or amorphous material(s). Referring to FIG. 55, the first stack 561 includes a SiGe (e.g., 65%) layer (also referred to as a SiGe65 layer) 502, alternating SiGe layers 503 and N+ Si layers 504, and a cap layer 506. The SiGe65 layer 502 and the SiGe layers 503 are sacrificial (or disposable) layers that can be replaced in subsequent steps. The N+ Si layers 504 can be formed by first epitaxial growth and can be referred to as first epitaxial layers. The N+ Si layers 504 can be doped with Phosphorous (P) or Arsenic (As) for NMOS devices, for example, by a diffusion process, an implantation process, and/or the like. The N+ Si layers 504 can be referred to as nano sheets or nano planes. In an example, first S/D regions (or first S/D terminals) (e.g., first lower S/D terminals or first lower S/D regions 524, first upper S/D terminals or first upper S/D regions 534) and first channel regions (or first channel structures) 556 of respective first MOS devices 575 fabricated from the first stack 561 can have an identical doping (e.g., P, As). In general, any suitable doping can be used for the first S/D regions (e.g., first lower S/D terminals 524, first upper S/D terminals 534) and the first channel regions 556 of the first MOS devices 575. The doping for the first S/D regions can be different from the doping for the first channel regions 556.

A number M of the N+ Si layers (or N+ Si nano sheets) 504 is four in an example shown in FIG. 55, and thus a stack of four of the first MOS devices 575 can be formed based on the N+ Si layers 504(1)-(4). The number M can be any suitable number, for example, ranging from one to six, for example, to form a stack of M of the first MOS devices 575. In an example, M is larger than 6.

The cap layer 506 can include any suitable layer or a combination of layers. In an example, the cap layer 506 includes an oxide layer 506(1), an amorphous Si layer 506(2), and a nitride layer 506(3). The oxide layer 506(1) can include silicon oxide formed based on tetraethoxysilane (TEOS). The nitride layer 506(3) can be formed by plasma enhanced chemical vapor deposition (PECVD).

The layers in the first stack 561 can have any suitable thicknesses, for example, based on device performance and/or fabrication requirements of the semiconductor apparatus 500. One (labeled with 503(1), also referred to as the SiGe layer 503(1)) of the SiGe layers 503 can have a first thickness T1 that is larger than a second thickness T2 of the remaining SiGe layers 503 that are different from the SiGe layer 503(1). In an example, the first thickness T1 is two times to four times that of the second thickness T2, and thus T1=P1×T2, where P1 ranges from 2 to 4.

Additional steps can include forming buried power rails, shallow trench isolation (STI), dummy gate(s), sacrificial spacer(s), inner spacer formation, a P-epi top tier encapsulation, and/or the like.

Figure 56:
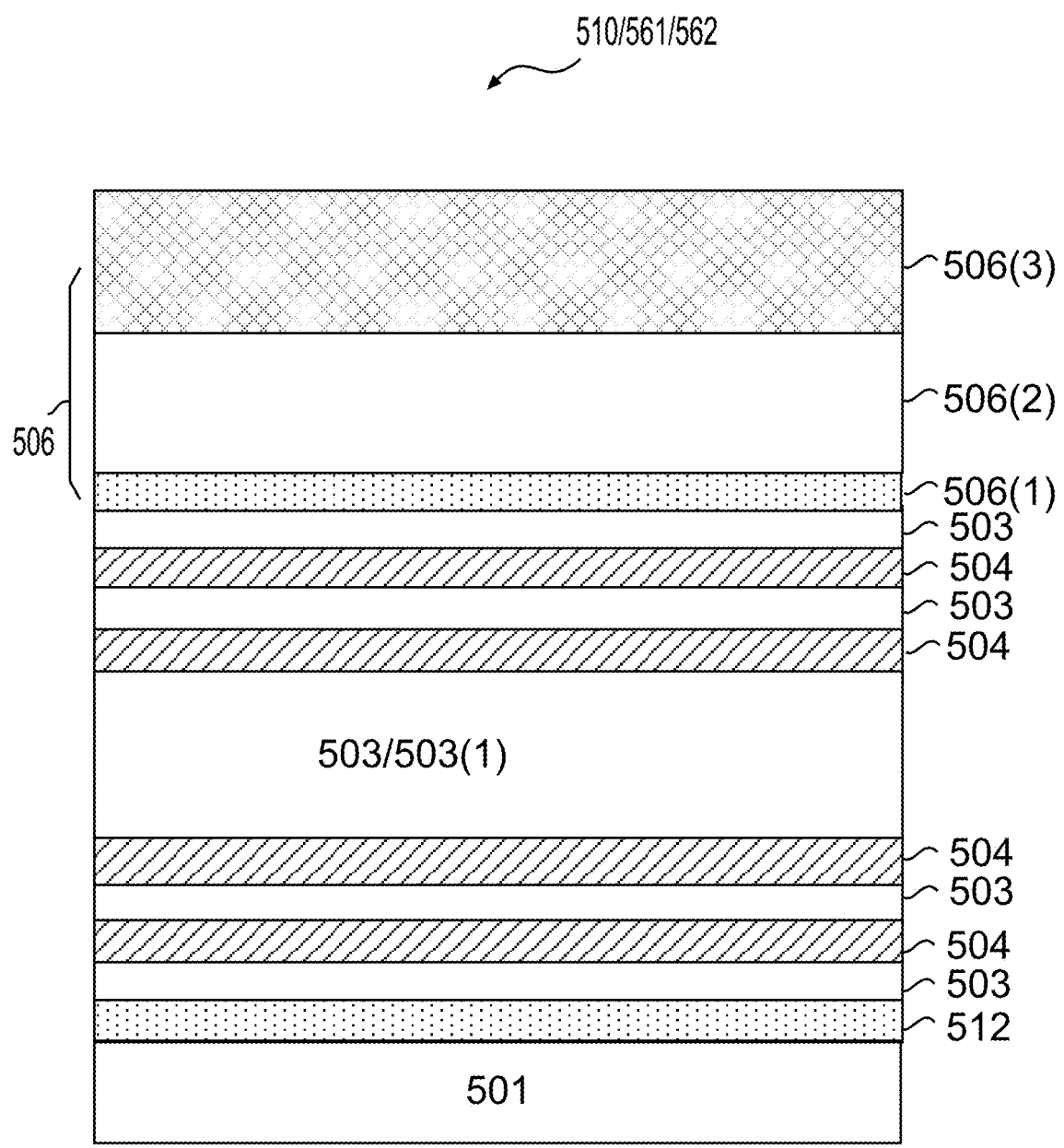
Figure 57:
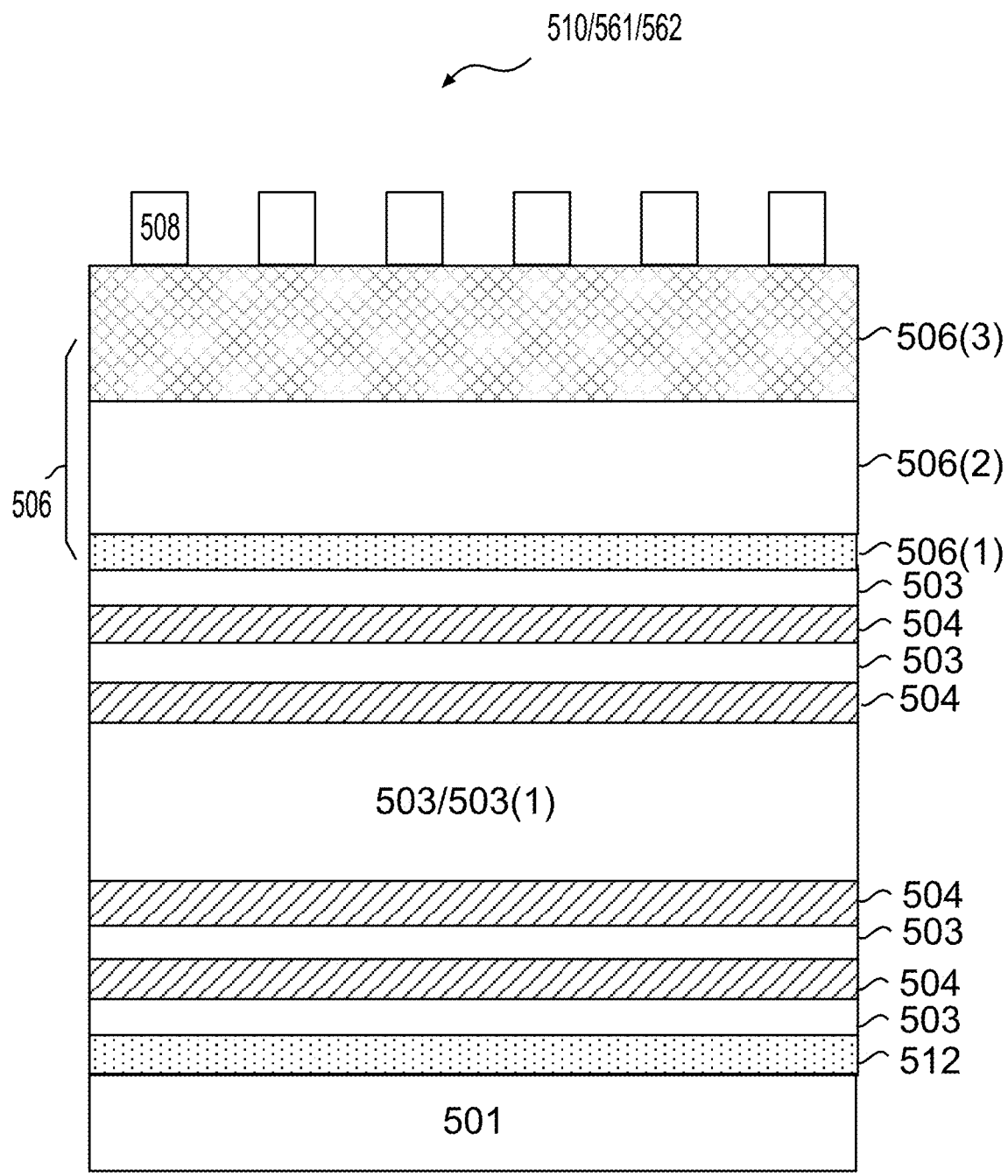
Figure 58:
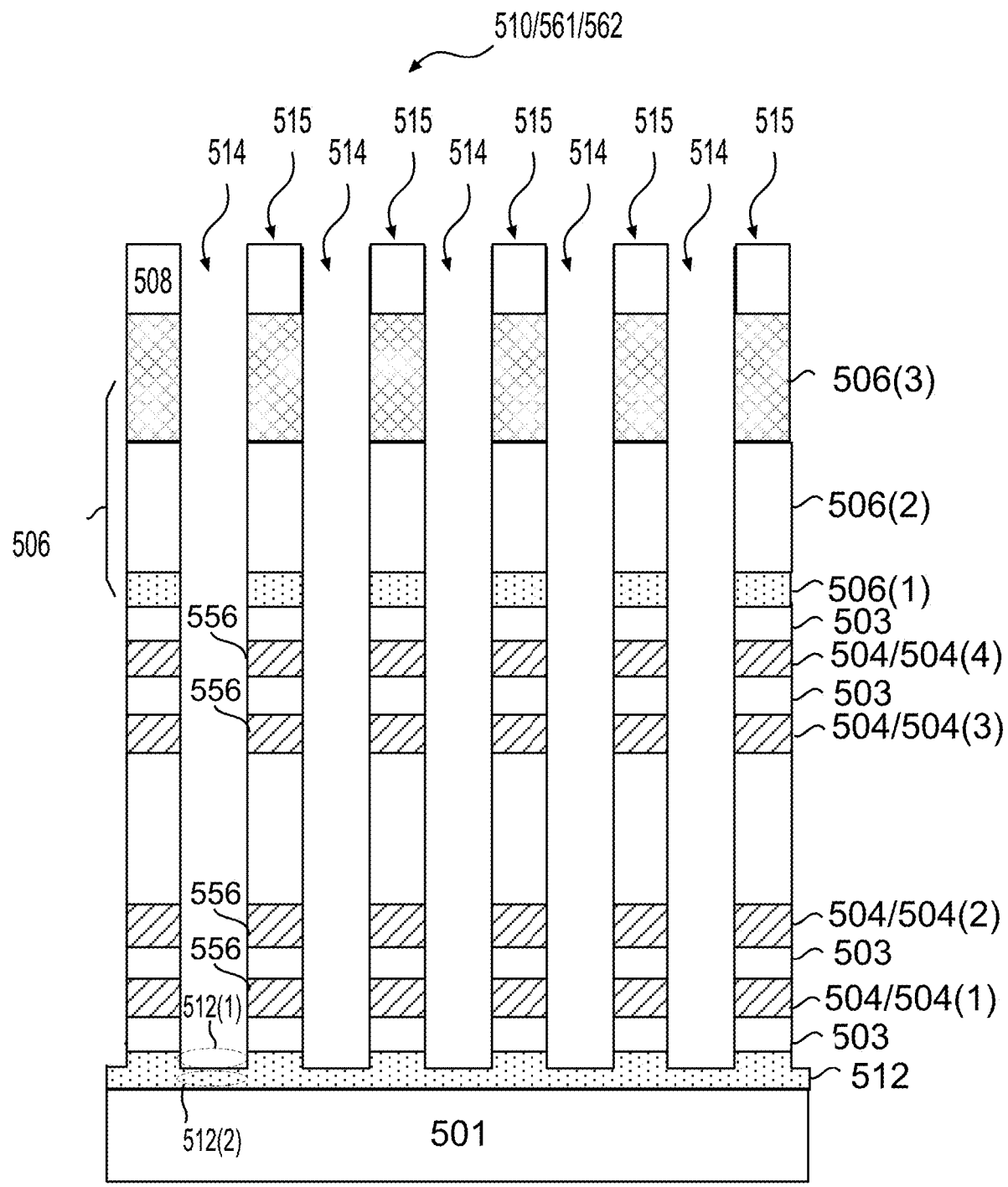

At S8612, the first channel regions 556 for the first MOS devices 575 in the first portion 510 can be defined. Referring to FIG. 56, a low dielectric (low-K) layer 512 can replace the SiGe65 layer 502. Referring to FIG. 57, a photoresist (PR) mask layer 508 is formed and patterned over the cap layer 506, for example, to define the first channel regions 556. Referring to FIG. 58, trenches 514 are formed in the first stack 561 based on the PR mask layer 508, for example, by an etching process that etches the first stack 561 that is not covered by the PR mask layer 508. In an example shown in FIG. 58, a top portion 512(1) of the low-K layer 512 is removed by the etching process and a bottom portion 512(2) of the low-K layer 512 remains. The trenches 514 separate regions 515. The first channel regions 556 can be defined and formed based on the N+ Si layers 504(1)-(4) in the regions 515.

Figure 59:
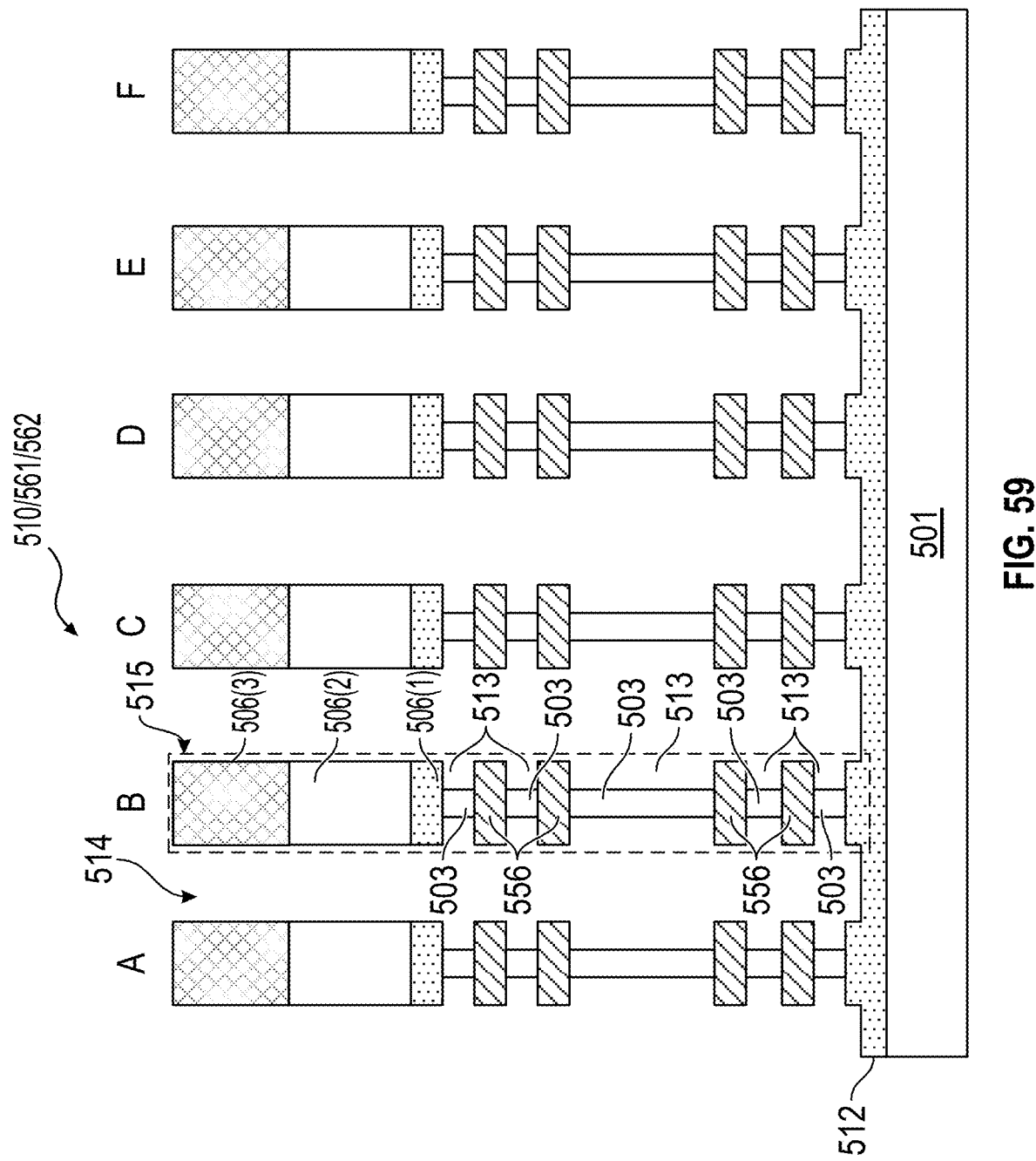

At S8616, first lower S/D regions (or first lower S/D terminals) 524 can be formed. Referring to FIG. 59, the PR mask layer 508 can be removed, for example, by an etching process. Portions of the SiGe layers 503 can be removed by an etching process, for example, after the PR mask layer 508 is removed. Accordingly, indentation regions 513 can be formed in the respective regions 515.

Figure 60:
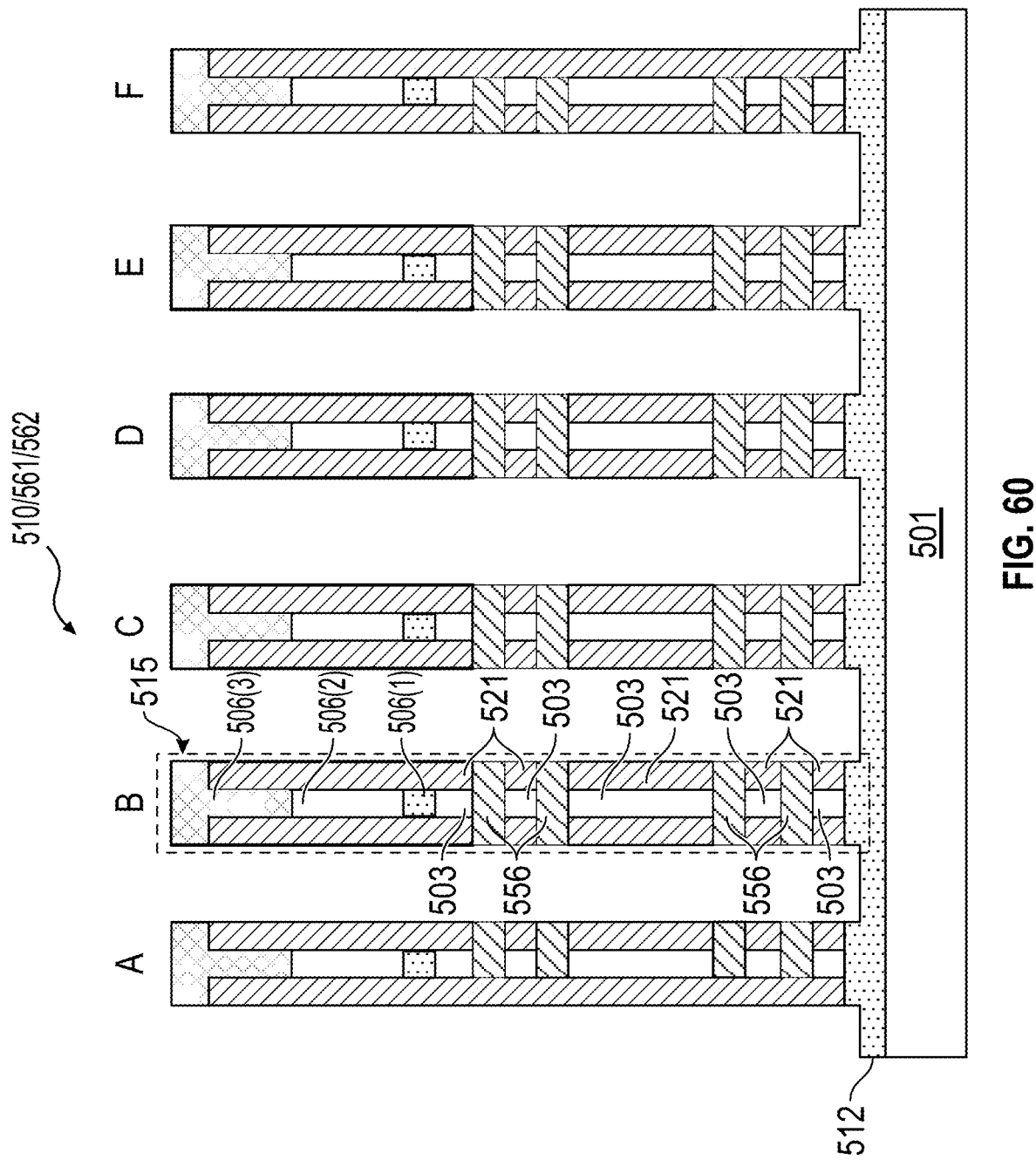

Referring to FIG. 60, a dielectric layer (e.g., including silicon oxide carbide (or silicon oxycarbide) (SiOC)) 521 can be deposited to fill the indentation regions 513 and the trenches 514. Portions of the dielectric layer 521 that are within the trenches 514 can be removed by an etching process, for example, based on a pattern of the cap layer 506.

Figure 61:
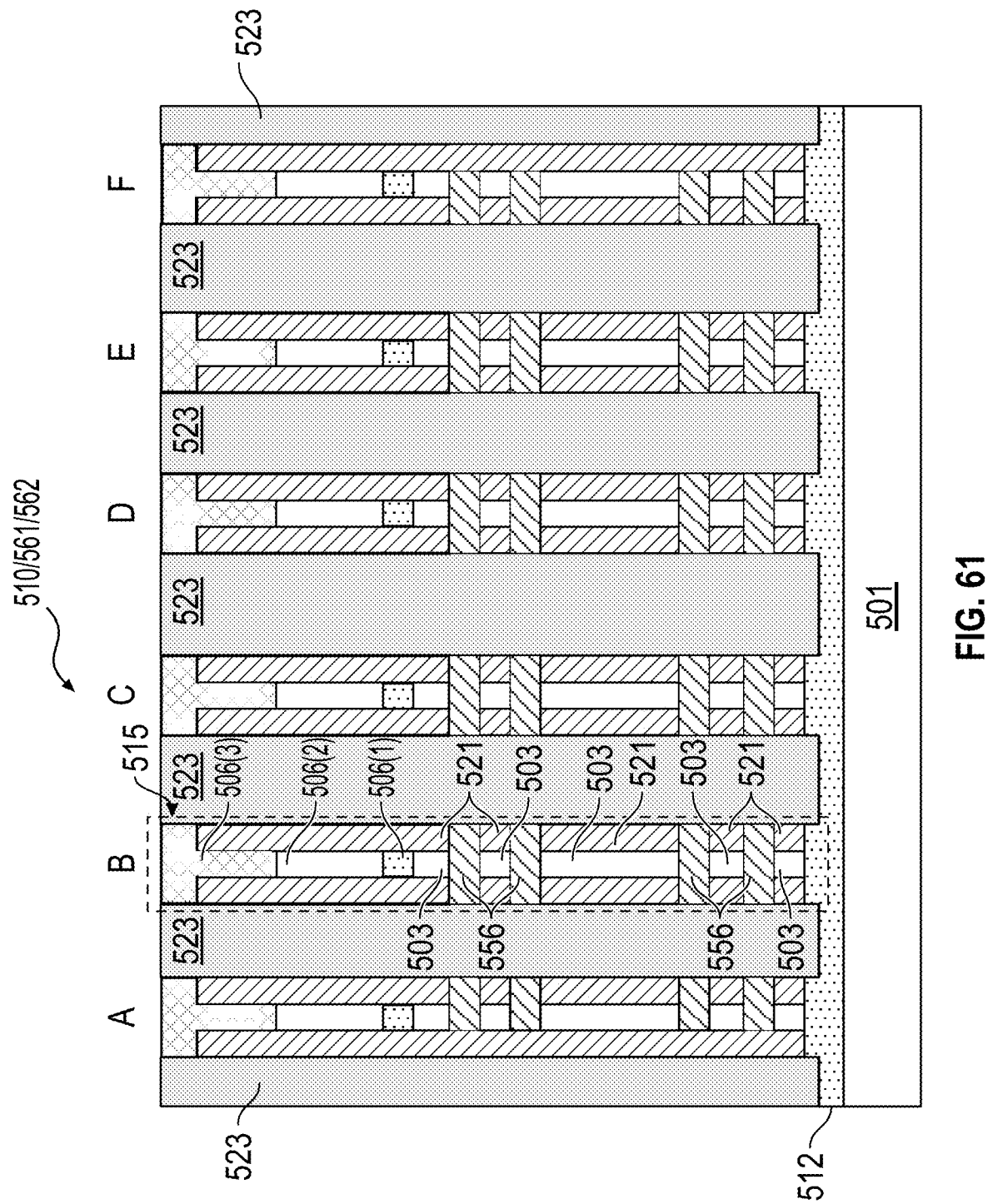
Figure 62:
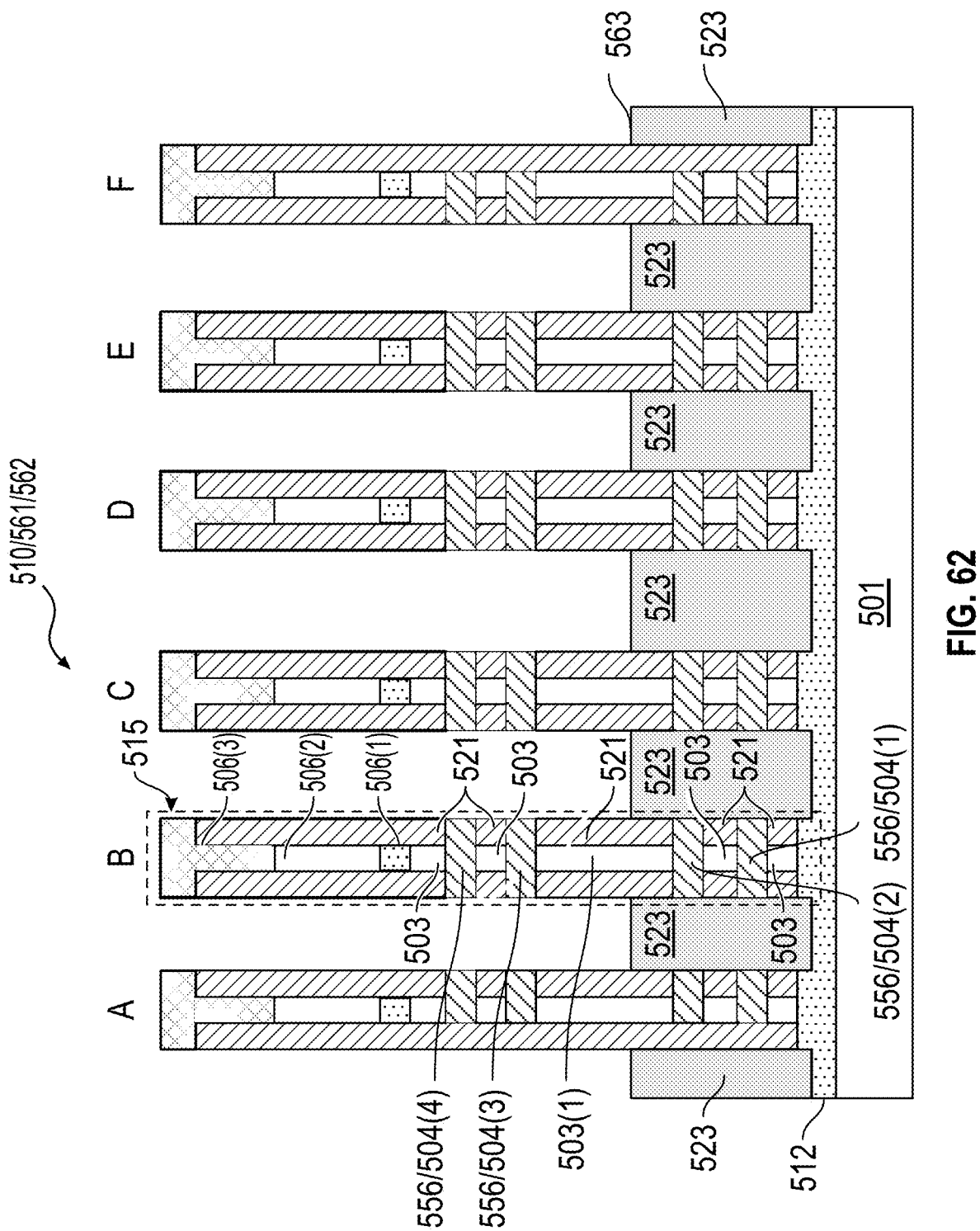
Figure 63:
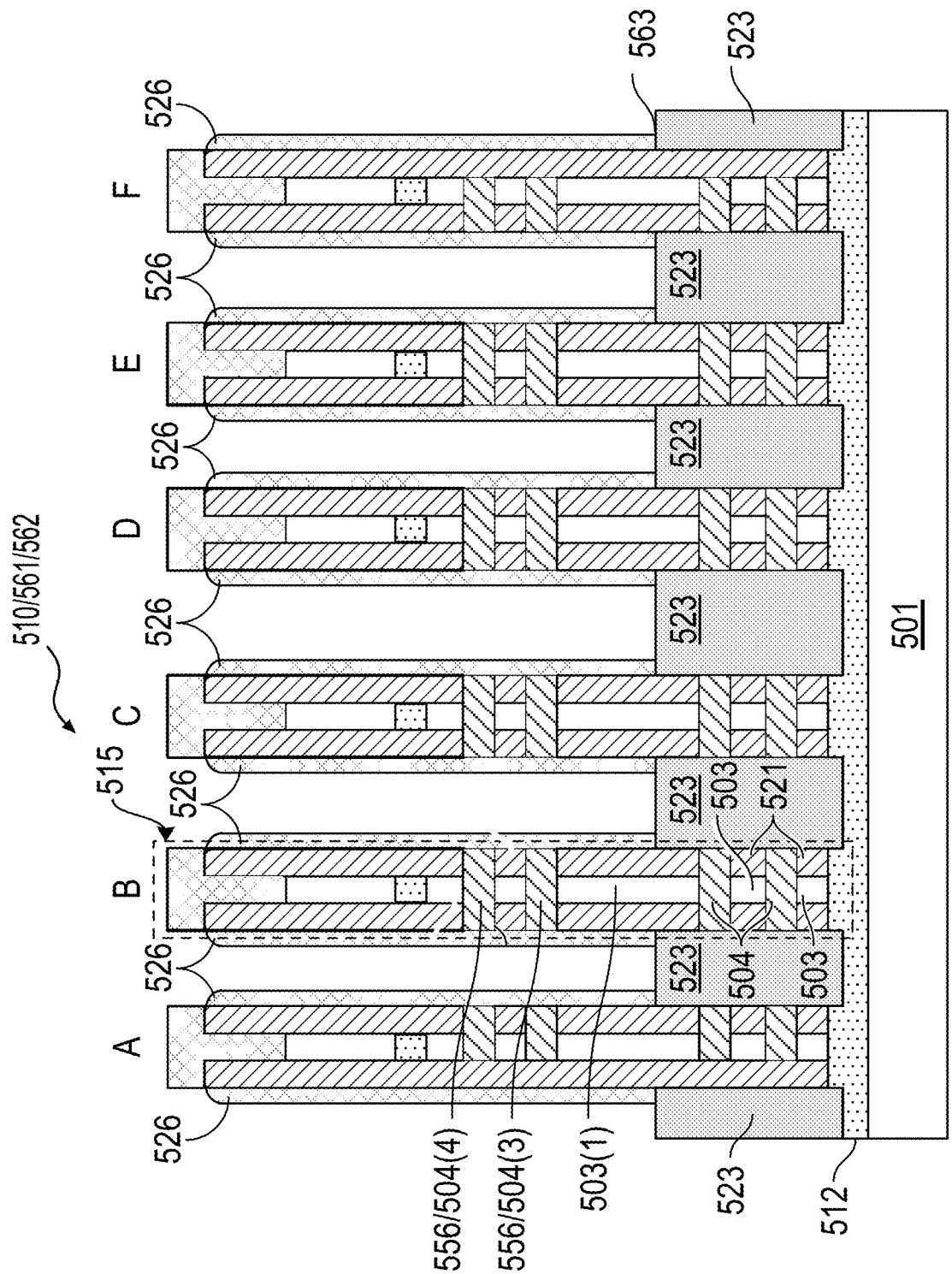

Referring to FIG. 61, a dielectric layer 523 can be deposited to fill the trenches 514 and over the first stack 561, followed by a chemical mechanical planarization (CMP). Referring to FIG. 62, the dielectric layer 523 can be etched to a level 563 that is between a top surface of the N+ Si layer 504(2) and a bottom surface of the N+ Si layer 504(3). The level 563 is within the SiGe layer 503(1). Referring to FIG. 63, a nitride spacer layer 526 can be formed by a deposition process and subsequently etched to protect the first stack 561 (e.g., including the first channel regions 556 in the N+ Si layers 504(3)-(4)) that is above the level 563. In an example, the nitride spacer layer 526 covers the regions 515 that are above the level 563.

Figure 64:
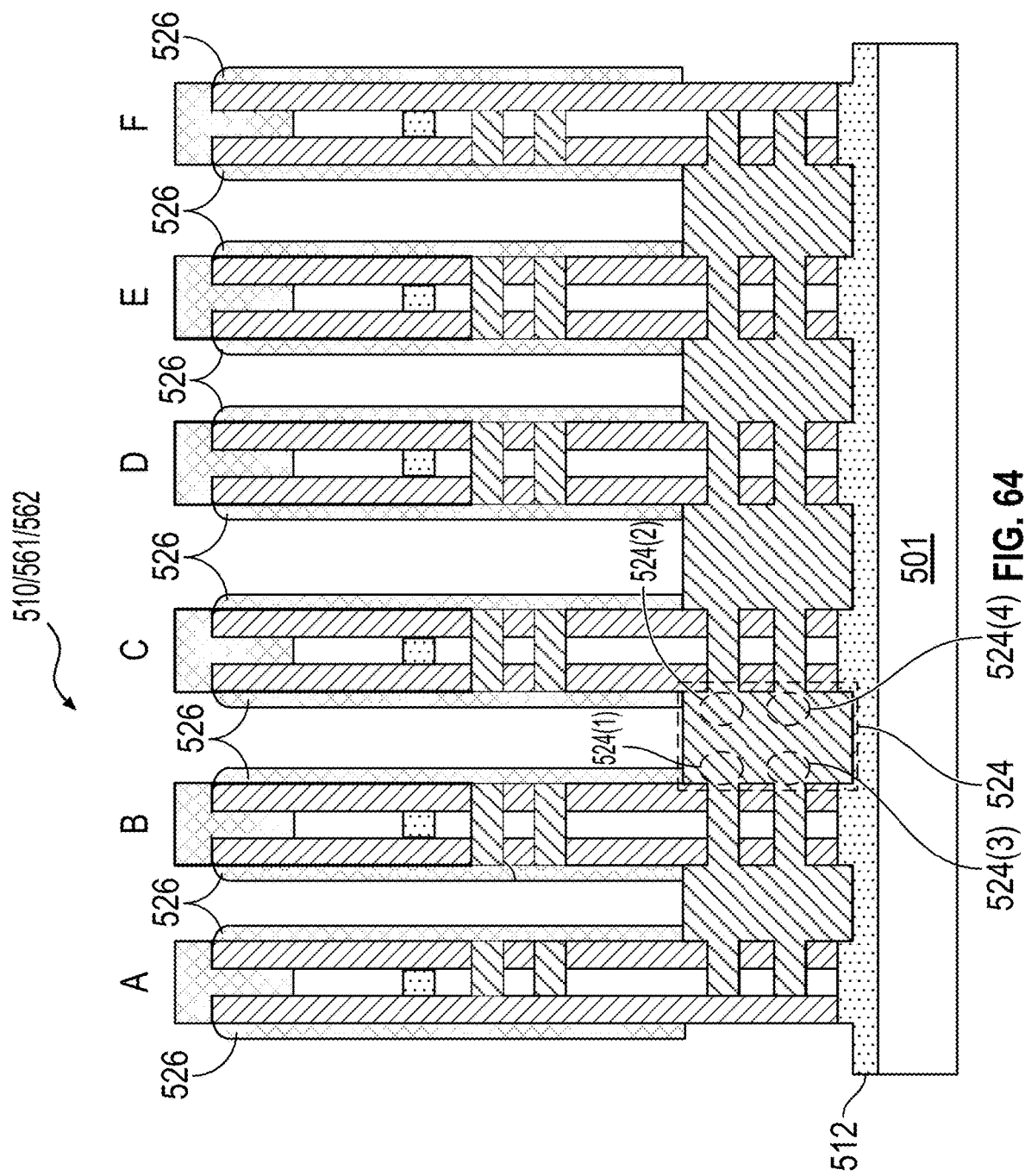

Referring to FIG. 64, the first lower S/D regions (also referred to as N+ S/D regions) 524 can be formed, for example, by P or As N+ S/D epitaxial growth. In FIG. 64, two adjacent ones of the first lower S/D regions 524 are connected. For example, the first lower S/D regions 524(1) and 524(2) are connected, the first lower S/D regions 524(2) and 524(4) are connected, the first lower S/D regions 524(1) and 524(3) are connected, and the first lower S/D regions 524(2) and 524(4) are connected. Accordingly, the first lower S/D regions 524(1)-(4) are connected. Alternatively, adjacent ones of the first lower S/D regions 524 can be grown/extended but not connected along the Z direction and/or the Y direction.

Figure 65:
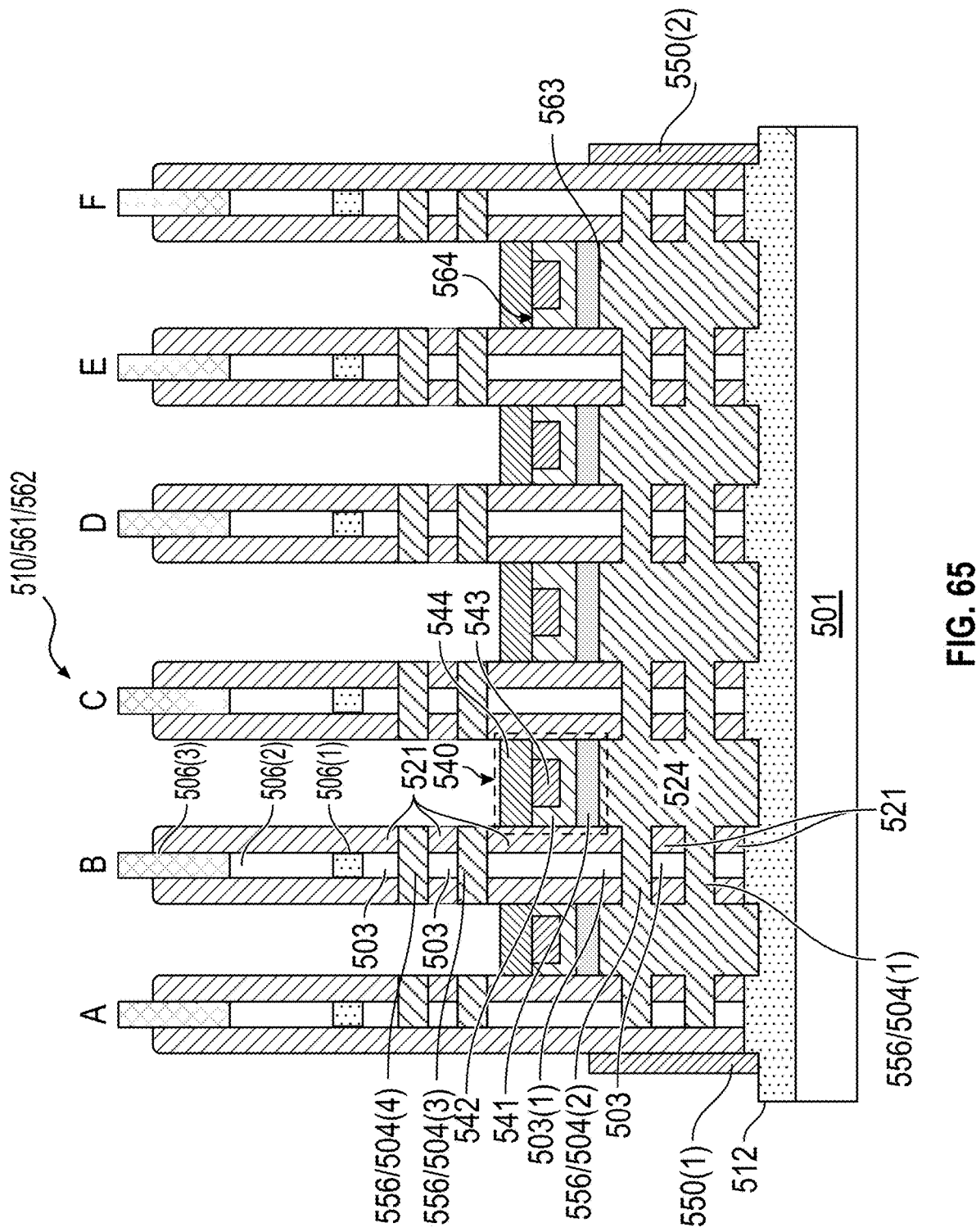

At S8616, referring to FIG. 65, a first lower LI 540 can be formed over the first lower S/D regions 524. The first lower LI 540 can include a titanium (Ti) layer 541 that is selected deposited over the first lower S/D regions 524. The TI layer 541 may not deposit over other regions in the first stack 561 or the TI layer 541 is minimally deposited over the other regions in the first stack 561. The first lower LI 540 can include a titanium nitride (TiN) liner 542 that is deposited over the TI layer 541 and the regions 515. The first lower LI 540 can include a metal (e.g., ruthenium (Ru)) layer 543 deposited over the TiN liner 542. Further, an etching process can etch back the metal (e.g., Ru) layer 543 and the TiN liner 542 to a level (or height) 564. The level 564 is above the level 563. The level 564 can be between the top surface of the N+ Si layer 504(2) and the bottom surface of the N+ Si layer 504(3) and can be within the SiGe layer 503(1). Subsequently, a dielectric layer (e.g., an aluminum oxide (AlO) layer) 544 can be deposited over the metal layer 543 and followed by a CMP process. In an example, the nitride spacer layer 526 is removed prior to forming the first lower LI 540.

In an example, dielectric structures 550(1)-(2) can be formed. The dielectric structures 550(1)-(2) can be formed using pre-metal dielectrics (PMD), such as an oxide.

Figure 66:
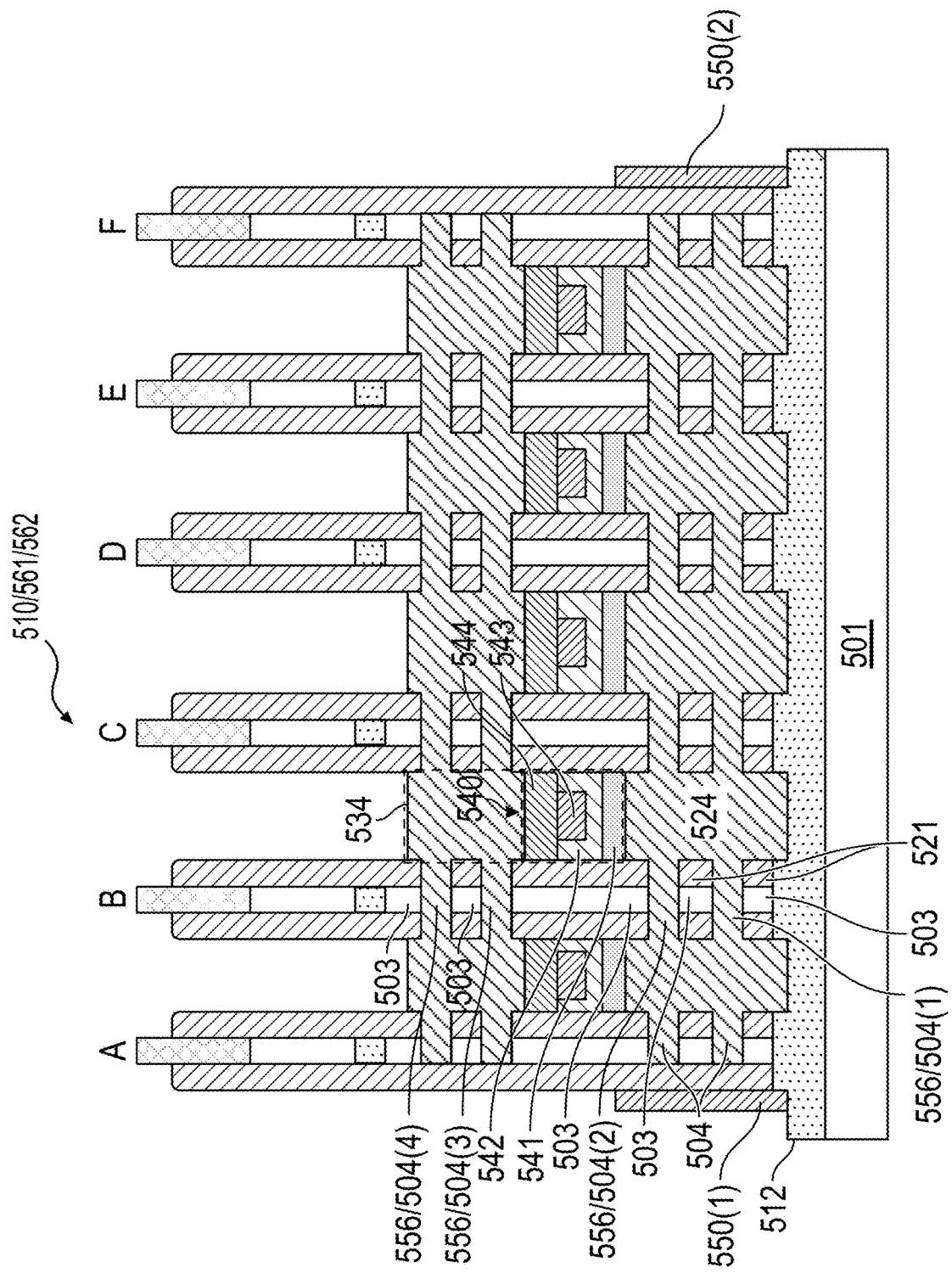

At S8618, referring to FIG. 66, the first upper S/D regions (also referred to as N+ S/D regions or first upper S/D terminals) 534 can be formed over the first lower LI 540. In an example, the nitride spacer layer 526 is removed prior to forming the first upper S/D regions 534. Similarly as described above with reference to the first lower S/D regions 524, the first upper S/D regions 534 can be formed, for example, by P or As N+ S/D epitaxial growth. Similar to the first lower S/D regions 524, in FIG. 66, two adjacent ones of the first upper S/D regions 534 are connected. Alternatively, the first upper S/D regions 534 can be grown/extended but not connected. For example, adjacent ones of the first upper S/D regions 534 are grown/extended but not connected along the Z direction and/or the Y direction.

Figure 67:
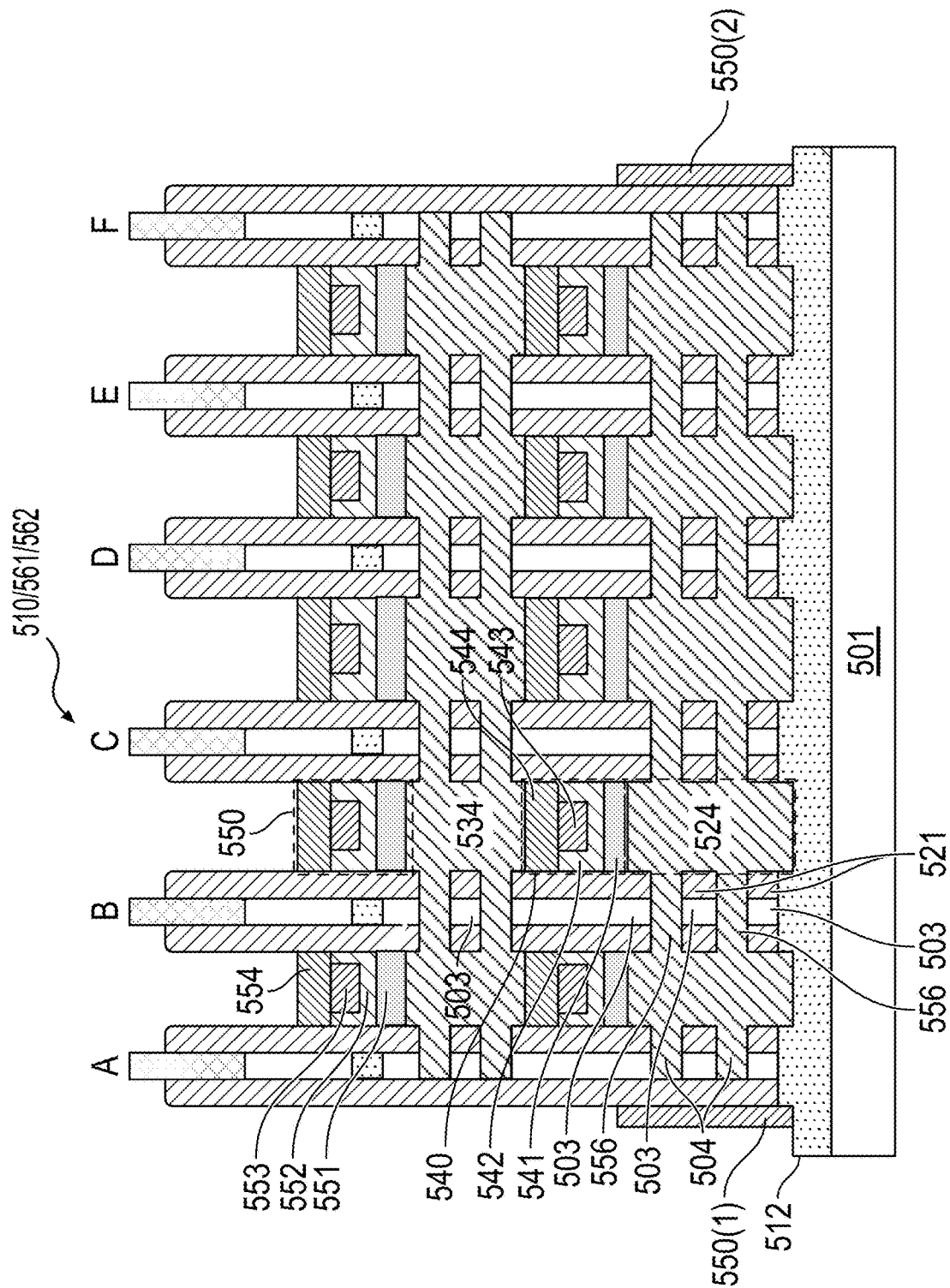

At S8620, referring to FIG. 67, a first upper LI 550 can be formed over the first upper S/D regions 534, similar as that described at S8616. The first upper LI 550 can include a Ti layer 551 that is selected deposited over the first upper S/D regions 534. The TI layer 551 may not deposit over other regions in the first stack 561 or the TI layer 551 is minimally deposited over the other regions in the first stack 561. The first upper LI 550 can include a TiN liner 552 that is deposited over the TI layer 551 and the regions 515. The first upper LI 550 can include a metal (e.g., Ru) layer 553 deposited over the TiN liner 552. Further, an etching process can etch back the metal (e.g., Ru) layer 553 and the TiN liner 552. Subsequently, a dielectric layer (e.g., an AlO layer) 554 can be deposited over the metal layer 553 and followed by a CMP process.

Figure 68:
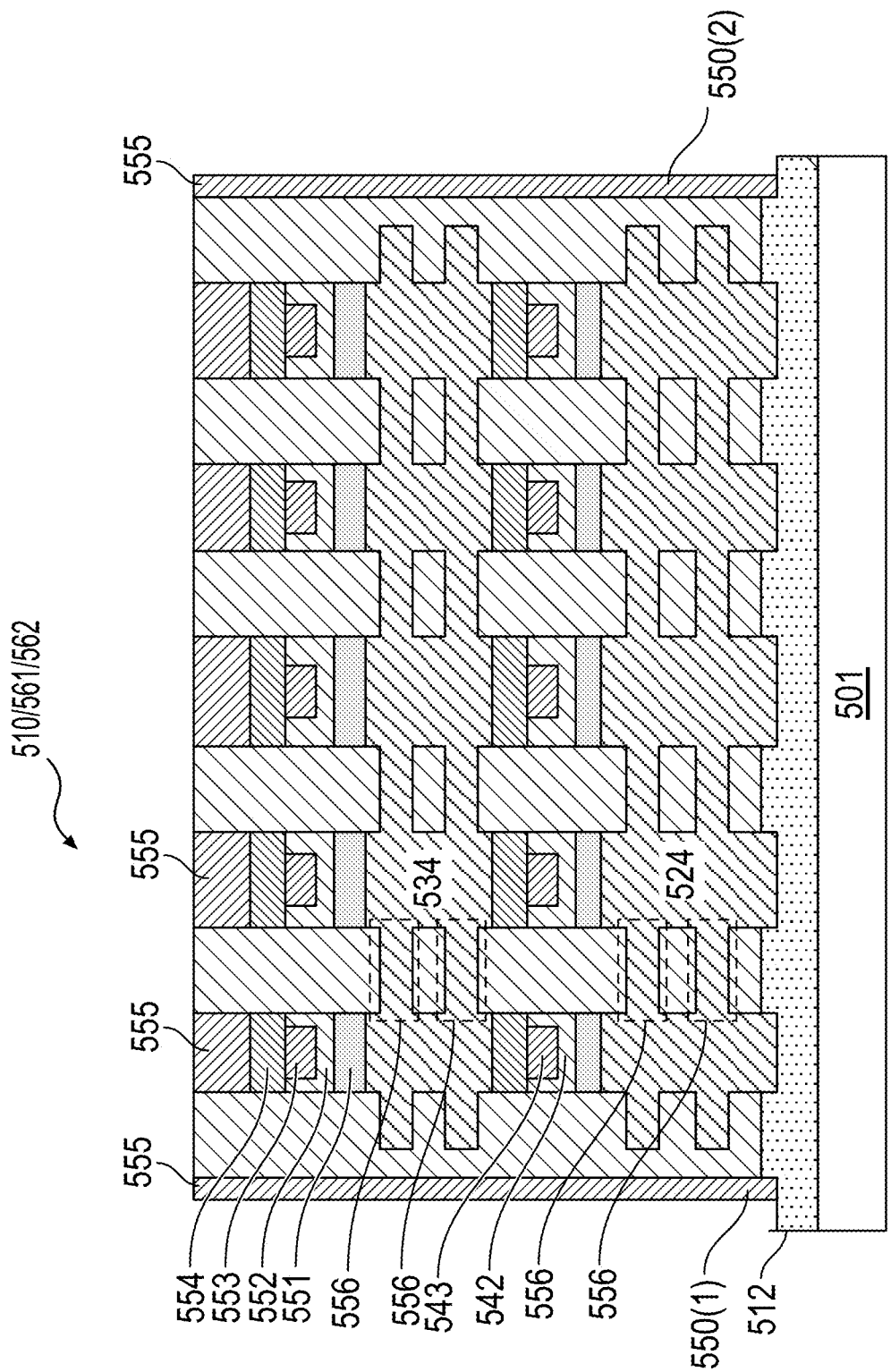

At S8622, referring to FIG. 68, the first channel regions 556 of the respective first MOS devices (e.g., NMOS devices) 575 can be released or exposed, for example, by removing (e.g., etching) the SiGe layers 503. In an example, a dielectric layer 555 can be formed over the first stack 561.

The first channel regions 556 can have any suitable structure (including shapes and dimensions) and material systems such that each of the first channel regions 556 can provide a semiconductor channel, such as an n-channel, when the first MOS device 575 is in operation.

Figure 69:
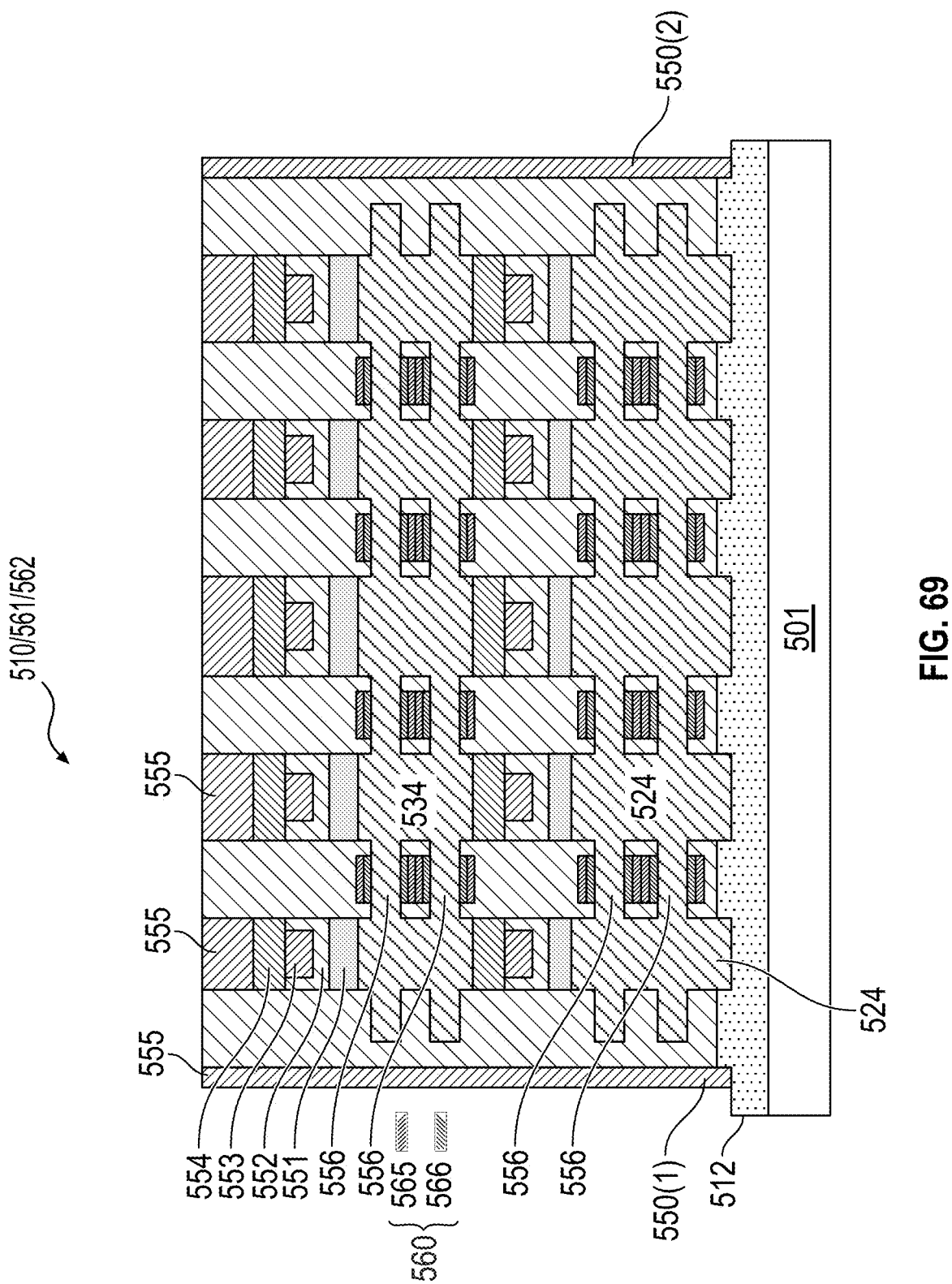

At S8624, referring to FIG. 69, first gate stacks (also referred to as first gate structures) 560 can be formed over the respective first channel regions 556. The first gate stacks 560 can include multiple layers, including any suitable dielectric layer(s) and any suitable conductive layer(s) (e.g., metal layer(s)). The conductive layer(s) can include one or more conductive materials, such as polysilicon, copper (Cu), ruthenium (Ru), and/or the like. In an example, each of the first gate stacks 560 includes a high dielectric (or high-K) layer 566 and one or more metal layers (e.g., TiN, TaN) 565 formed over the respective first channel region 556. In an example, the high-K layer 566 is formed between the first channel region 556 and the one or more metal layers 565.

Each of the first gate stacks 560 can cover or surround the respective first channel region 556 in any suitable configuration, such as that used in GAA. Gate materials can surround a channel region on all sides in the GAA configuration.

Figure 70:
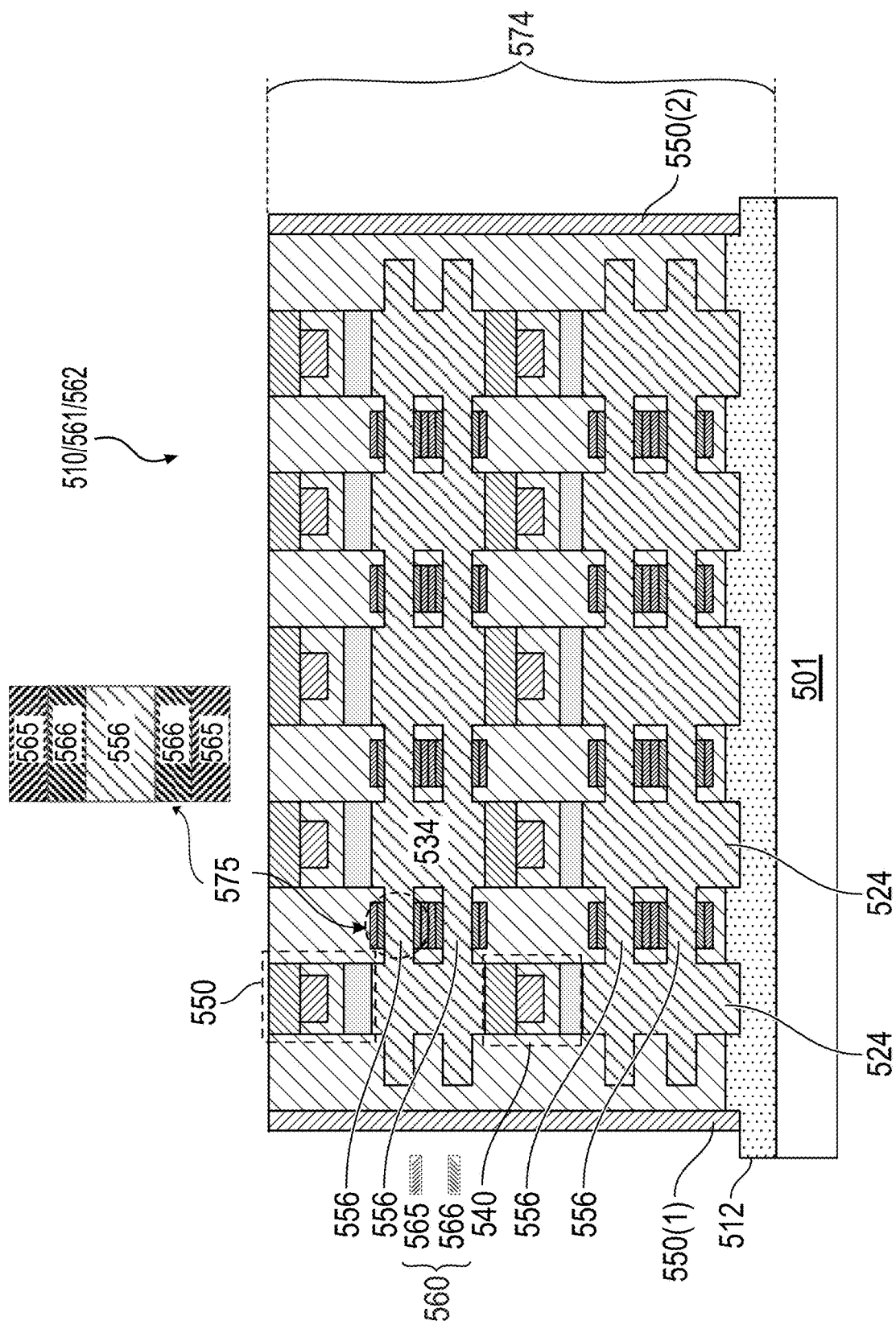

In an example, referring to FIG. 70, the dielectric layer 555 that is above the first stack 561 is removed. The first portion 510 includes a sub-portion 574. The sub-portion 574 can include the first MOS devices 575. In some examples, such as shown in FIG. 70, the sub-portion 574 includes LI(s) (e.g., the first lower LI 540 and the first upper LI 550).

Figure 71:
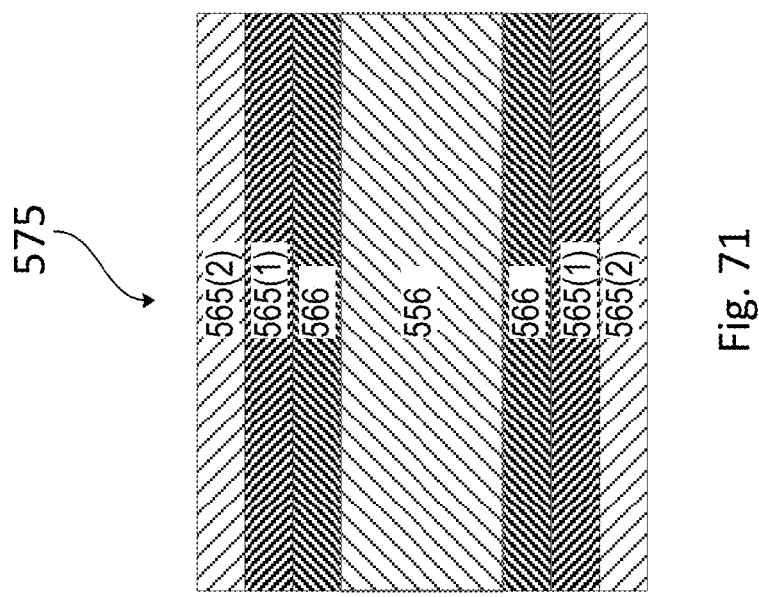

FIG. 71 shows an example of a portion of the first MOS device 575 according to an embodiment of the disclosure. The high-K layer 566 can have high dielectric constant material(s), such as a combination of an oxide layer and an AlO layer. The one or more metal layers 565 can include a TiN layer 565(1) and a TaN layer 565(2). The high-K layer 566 and the one or more metal layers 565 can wrap around the first channel region 556 that is formed from the N+ Si layer 504.

Figure 72:
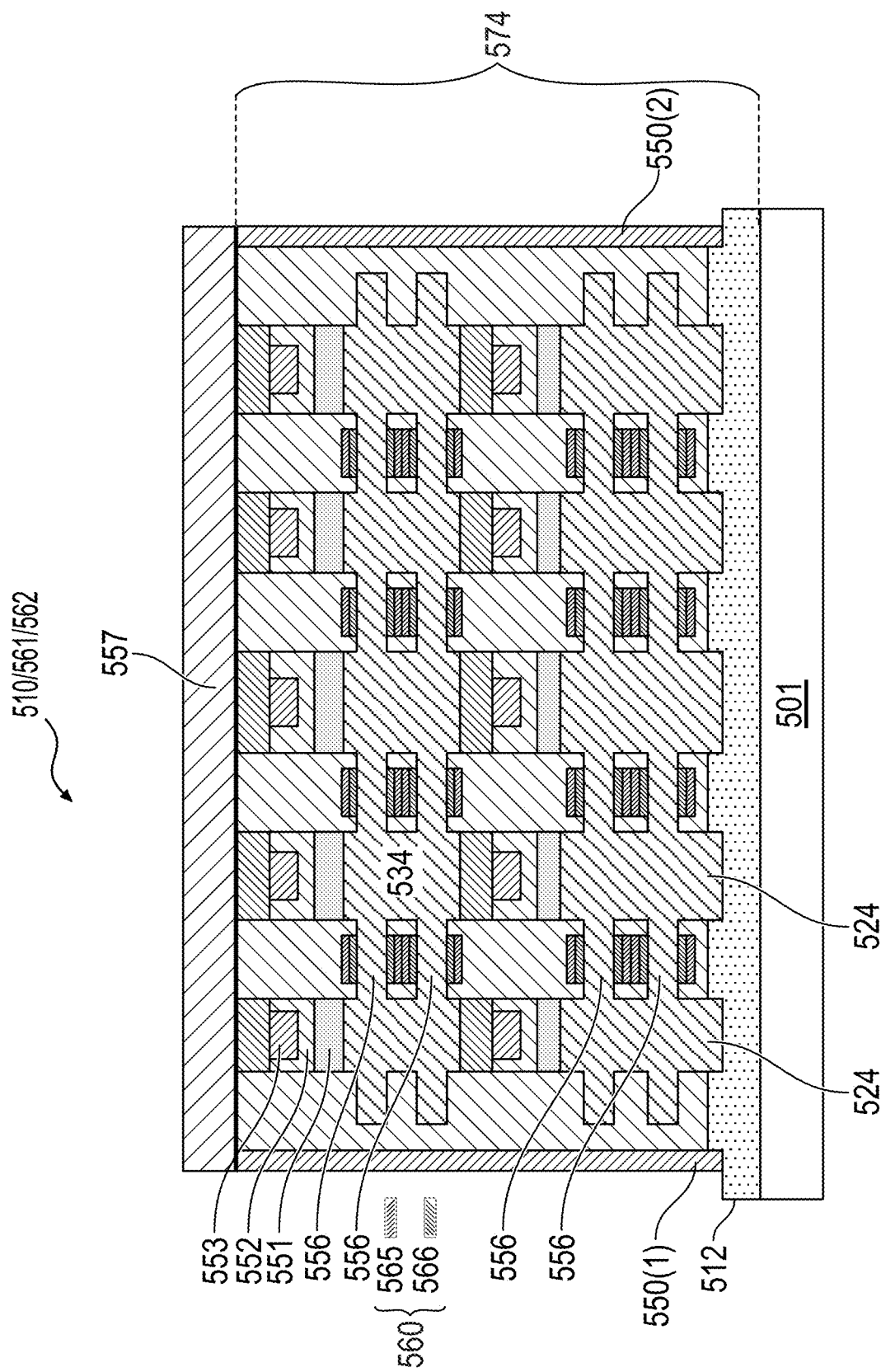
Figure 73:
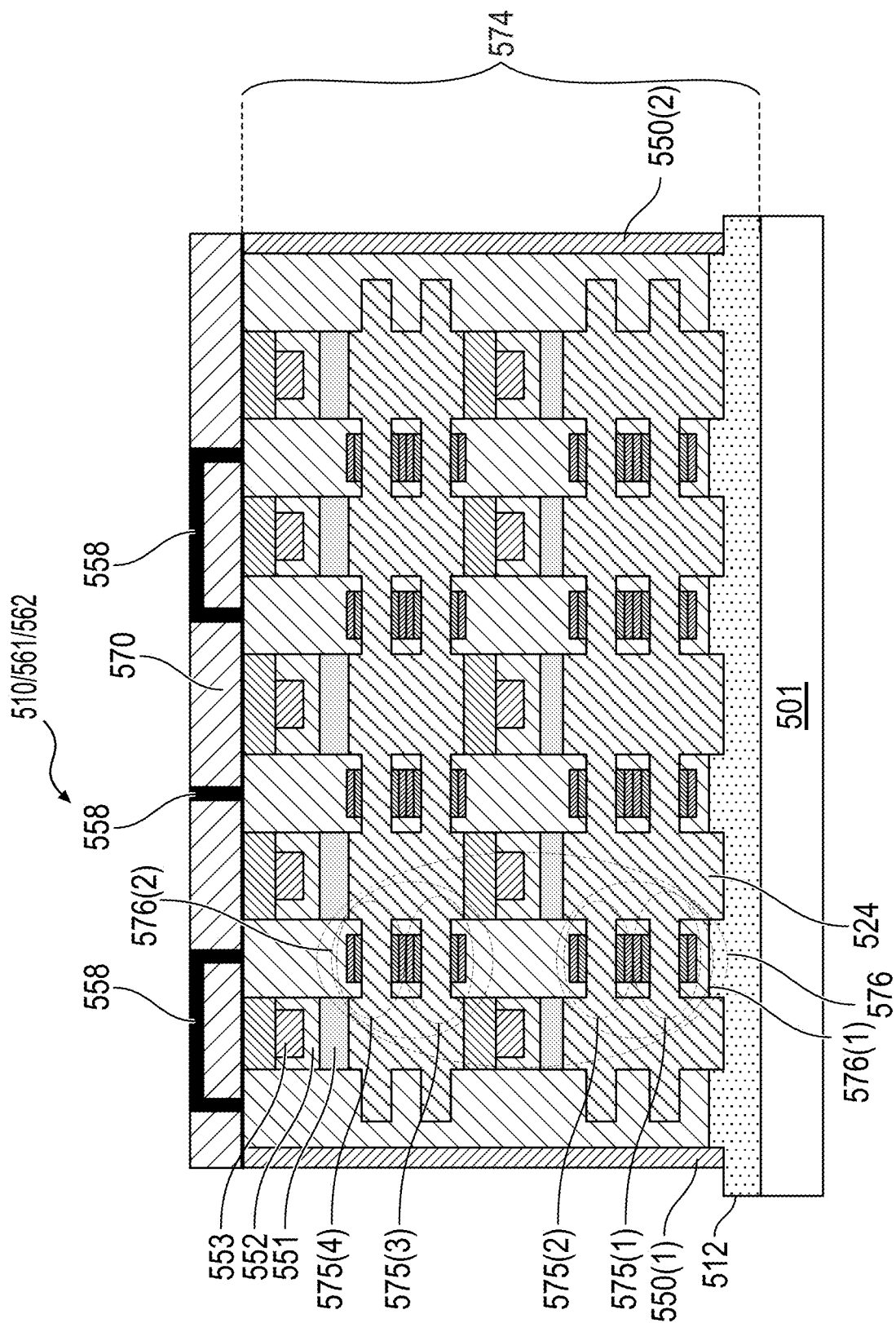

At S8626, referring to FIGS. 72 and 73, a wiring layer (also referred to as metal layer) 570 can be formed over the sub-portion 574 in the first portion 510. In FIG. 72, a dielectric layer (e.g., an oxide layer) 557 can be deposited over the sub-portion 574 to form one or more wiring layers. In FIG. 73, metal X routings 558 can be fabricated in the dielectric layer 557 to form the wiring layer 570. The metal X routings 558 can be formed using a dual damascene process for metal connections from the first MOS devices (e.g., NMOS devices) 575.

The first portion 510 can include the sub-portion 574. The sub-portion 574 can include multiple stacks 576 of the first MOS devices 575, as described above. Each stack 576 can include any suitable number of the first MOS devices 575, such as 2, 3, or more. Referring to FIG. 73, the stack 576 includes four NMOS devices (e.g., 575(1)-(4)) in sub-stacks 576(1)-(2). For example, the first MOS devices 575(1)-(2) are in the sub-stack 576(1) and the first MOS devices 575(3)-(4) are in the sub-stack 576(2). The first MOS devices 575(1)-(2) include the respective first lower S/D regions 524 and the respective first channel regions 556. The first MOS devices 575(3)-(4) include the respective first upper S/D regions 534 and the respective first channel regions 556.

The above descriptions can be adapted to describe steps used to fabricate the second portion 610 that includes second MOS devices 675 on a second substrate 601.

Figure 74A:
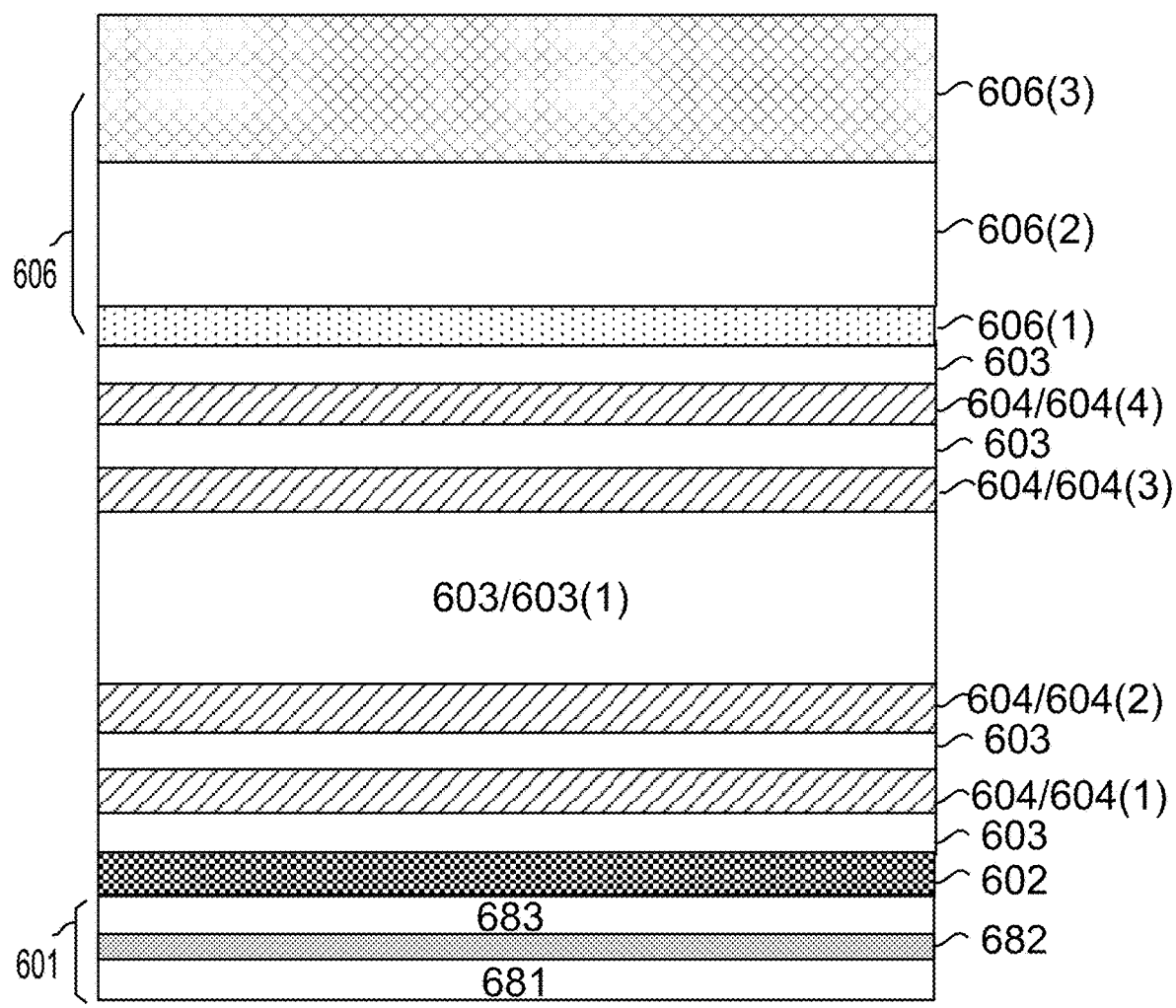

Referring to FIGS. 74A and 86B, at S8628, a second stack 661 for the second portion 610 of the semiconductor apparatus 500 can be formed on a second substrate 601. In an embodiment, the second substrate 601 is on a second wafer 662. The second wafer 662 can be different from the first wafer 562.

The second substrate 601 can be identical to the second substrate 229 as described with reference to FIG. 17 and can include a single crystal Si layer 683 on a dielectric layer (e.g., an oxide layer) 682 stacked on a bulk substrate material (e.g., Si) 681. The second stack 661 can include any suitable layers and materials, such as dielectric material(s), semiconductor material(s), and/or the like. The semiconductor material(s) can include single crystal (or monocrystalline) material(s), polycrystalline material(s), and/or amorphous material(s). Referring to FIG. 74A, the second stack 661 includes a $Si_xGe_y$ layer 602, alternating Si layers 603 and P+ Ge or SiGe (e.g., $Si_xGe_y$) layers (also referred to as P+ layers) 604, and a cap layer 606. The $Si_xGe_y$ layer 602 and the Si layers 603 are sacrificial (or disposable) layers that can be replaced in subsequent steps. The P+ layers 604 can be formed by second epitaxial growth and can be referred to as second epitaxial layers. The P+ layers 604 can be doped with Boron (B) for PMOS devices, for example, by a diffusion process, an implantation process, and/or the like. The P+ layers 604 can be referred to as nano sheets or nano planes. In an example, second S/D regions (or second S/D terminals) (e.g., second lower S/D terminals or second lower S/D regions 624, second upper S/D terminals or second upper S/D regions 634) and second channel regions (or second channel structures) 656 of respective second MOS devices 675 fabricated from the second stack 661 can have an identical doping (e.g., B). In general, any suitable doping can be used for the second S/D regions (e.g., the second lower S/D terminals 624, the second upper S/D terminals 634) and the second channel regions 656 of the second MOS devices 675. The doping for the second S/D regions can be different from the doping for the second channel regions 656.

In an example, the N+ Si layers 504 and the P+ layers 604 can be individually or separately optimized in the first epitaxial growth and in the second epitaxial growth, respectively.

A number K of the P+ layers (or P+ nano sheets) 604 is four in an example shown in FIG. 74A, and thus a stack of four of the second MOS devices 675 can be formed based on the P+ layers 604 (1)-(4). The number K can be any suitable number, for example, ranging from one to six, for example, to form a stack of K of the second MOS devices 675. In an example, K is larger than 6.

The cap layer 606 can include any suitable layer or a combination of layers. In an example, the cap layer 606 includes an oxide layer 606(1), an amorphous Si layer 606(2), and a nitride layer 606(3). The oxide layer 606(1) can include silicon oxide formed based on TEOS. The nitride layer 606(3) can be formed by PECVD.

The layers in the second stack 661 can have any suitable thicknesses, for example, based on device performance and/or fabrication requirements of the semiconductor apparatus 500. One (labeled with 603(1), also referred to as the Si layer 603(1)) of the Si layers 603 can have a first thickness T3 that is larger than a second thickness T4 of the remaining Si layers 603 that are different from the Si layer 603(1). In an example, the first thickness T3 is two times to four times that of the second thickness T4, and thus T3=P2×T4, where P2 ranges from 2 to 4.

Figure 74B:
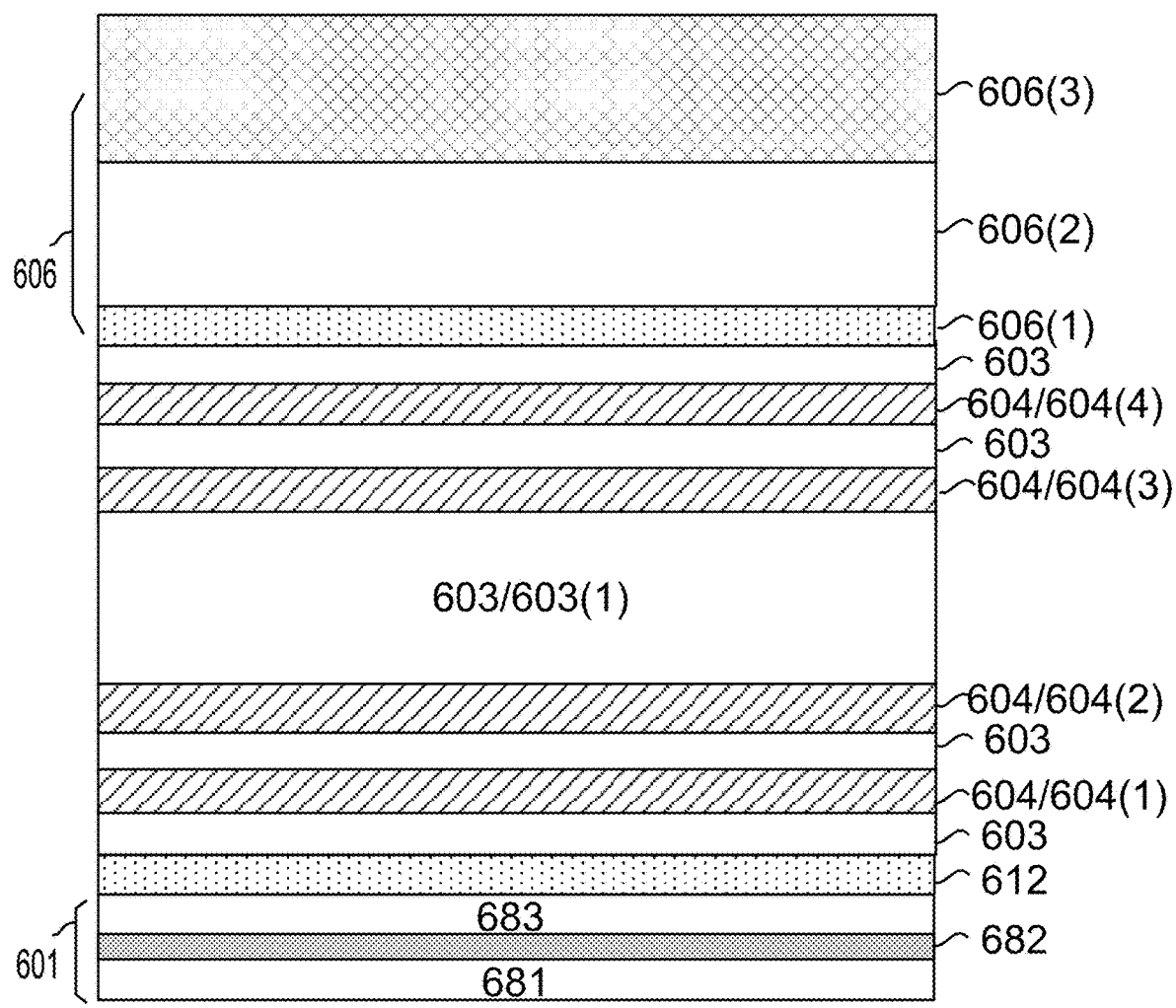

Referring to FIG. 74B, a low-K layer 612 can replace the $Si_xGe_y$ layer 602. Additional steps can include forming buried power rails, shallow trench isolation (STI), dummy gate(s), sacrificial spacer(s), inner spacer formation, a P-epi top tier encapsulation, and/or the like.

Figure 75:
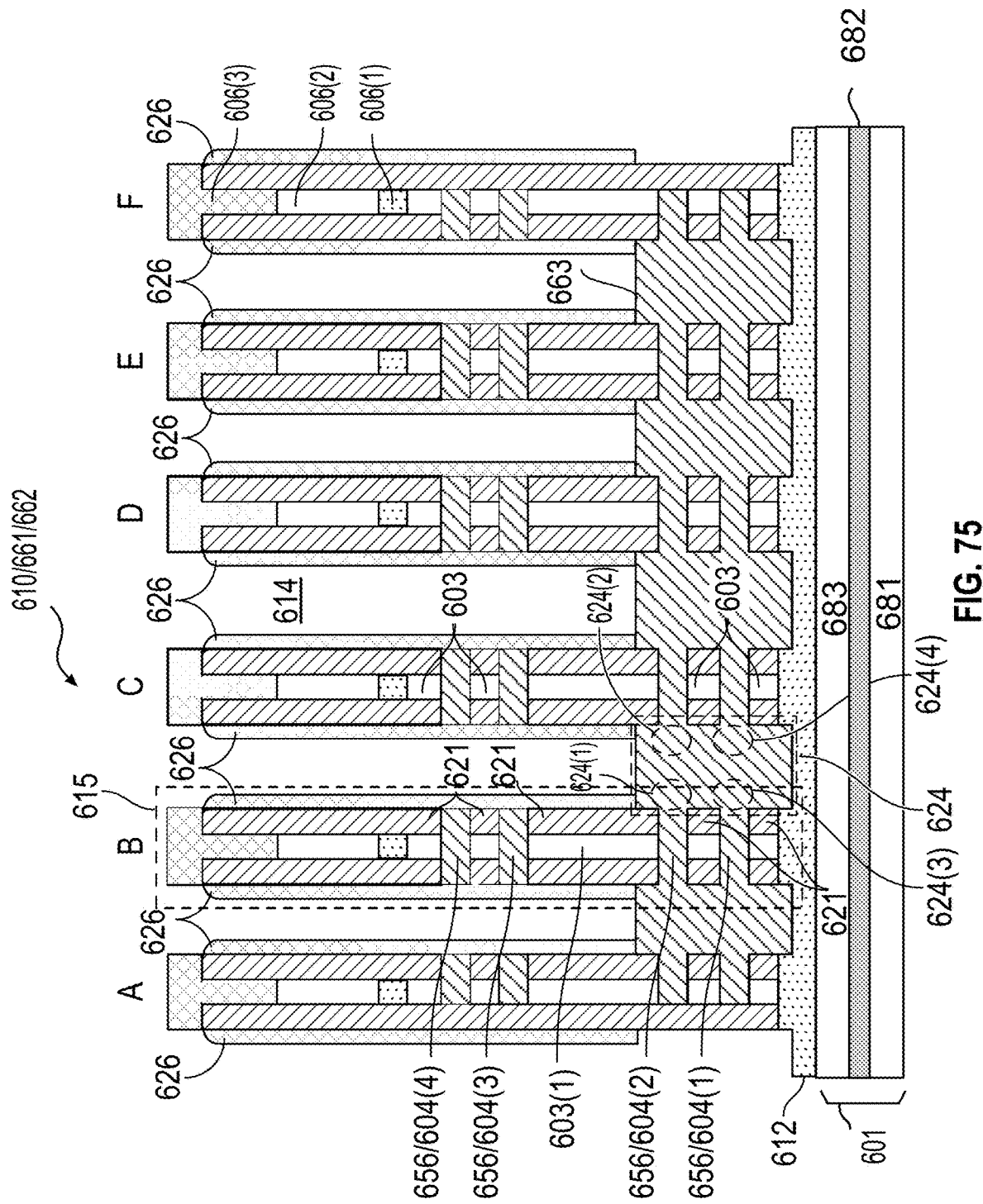

At S8630, the second channel regions 656 for the second MOS devices 675 in the second portion 610 can be defined or formed, similar as described above in S8612. Thus, detailed descriptions are omitted for purposes of brevity. Referring to FIG. 75, a top portion of the low-K layer 612 is removed by an etching process and a bottom portion of the low-K layer 612 remains. Trenches 614 can be formed in the second stack 661 based on a PR mask layer above the cap layer 606, for example, by an etching process that etches the second stack 661 that is not covered by the PR mask layer. The trenches 614 separate regions 615. The second channel regions 656 can be defined and formed based on the P+ layers 604(1)-(4) in the regions 615.

At S8632, second lower S/D regions (or second lower S/D terminals) 624 can be formed, similar as described above with reference to S8614. Thus, detailed descriptions are omitted for purposes of brevity. Referring to FIG. 75, the second lower S/D regions (also referred to as P+S/D regions) 624 can be formed, for example, by B P+S/D epitaxial growth. In FIG. 75, two adjacent ones of the second lower S/D regions 624 are connected. For example, the second lower S/D regions 624(1) and 624(2) are connected, the second lower S/D regions 624(2) and 624(4) are connected, the second lower S/D regions 624(1) and 624(3) are connected, and the second lower S/D regions 624(2) and 624(4) are connected. Accordingly, the second lower S/D regions 624(1)-(4) are connected. Alternatively, adjacent ones of the second lower S/D regions 624 can be grown/extended but not connected along the Z direction and/or the Y direction.

A dielectric layer (e.g., SiOC) 621 can have similar or identical structures/functions as those of the dielectric layer 521 and can be manufactured as described above in S8614. A nitride spacer layer 626 can have similar or identical structures/functions as those of the nitride spacer layer 526 and can be manufactured as described above in S8614. The nitride spacer layer 626 can protect the second stack 661 (e.g., including the second channel regions 656 in the P+ layers 604(3)-(4)) that is above a level 663. In an example, the nitride spacer layer 626 covers the regions 615 that are above the level 663.

Figure 76:
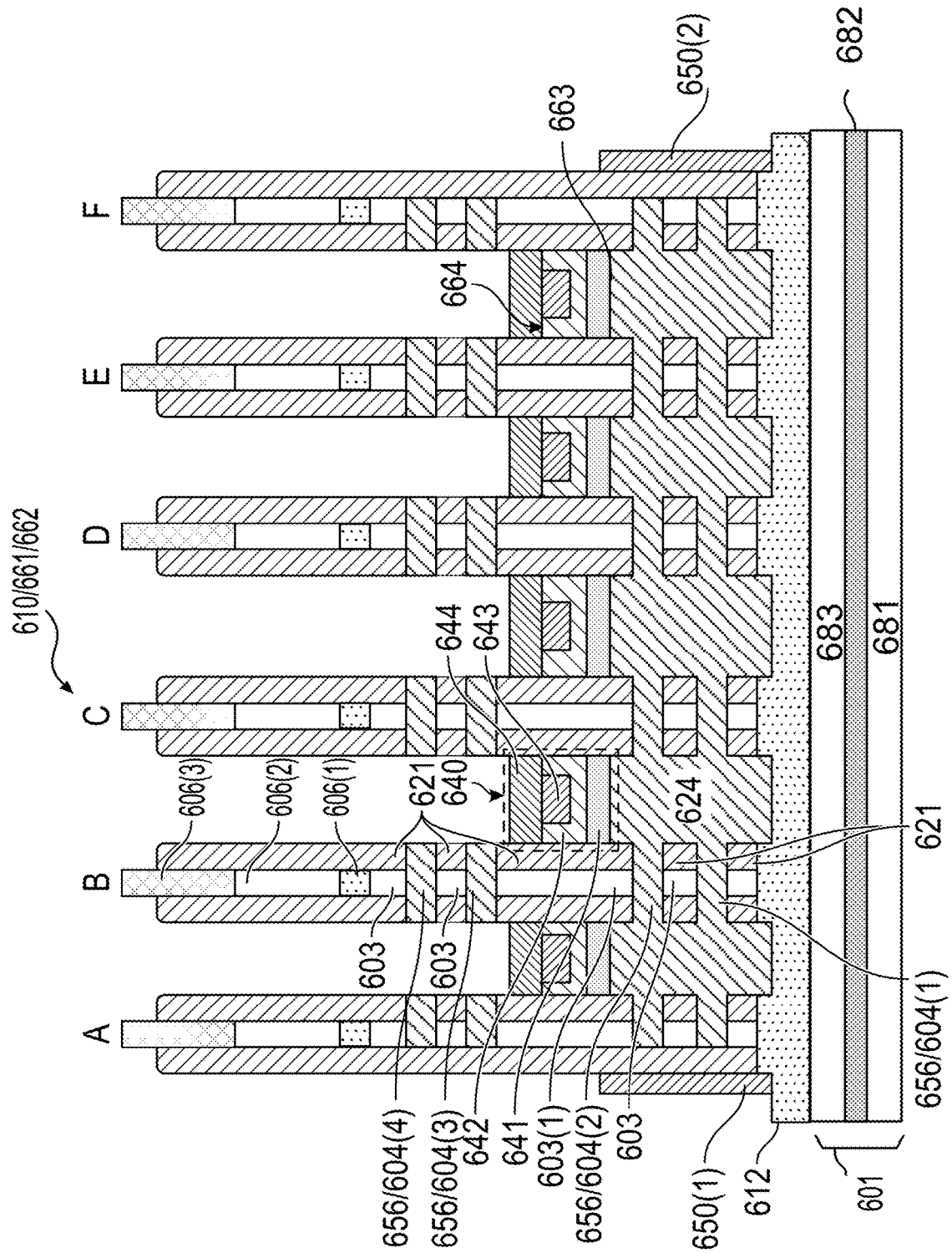

At S8634, referring to FIG. 76, a second lower LI 640 can be formed over the second lower S/D regions 624. The second lower LI 640 can include a Ti layer 641 that is selected deposited over the second lower S/D regions 624. The TI layer 641 may not deposit over other regions in the second stack 661 or the TI layer 641 is minimally deposited over the other regions in the second stack 661. The second lower LI 640 can include a TiN liner 642 that is deposited over the TI layer 641 and the regions 615. The second lower LI 640 can include a metal (e.g., Ru) layer 643 deposited over the TiN liner 642. Further, an etching process can etch back the metal (e.g., Ru) layer 643 and the TiN liner 642 to a level (or height) 664. The level 664 is above the level 663. The level 664 can be between the top surface of the P+ layer 604(2) and the bottom surface of the P+ layer 604(3) and can be within the Si layer 603(1). Subsequently, a dielectric layer (e.g., an AlO layer) 644 can be deposited over the metal layer 643 and followed by a CMP process. In an example, the nitride spacer layer 626 is removed prior to forming the second lower LI 640.

In an example, dielectric structures 650(1)-(2) can be formed. The dielectric structures 650(1)-(2) can be formed using PMD, such as an oxide.

Figure 77:
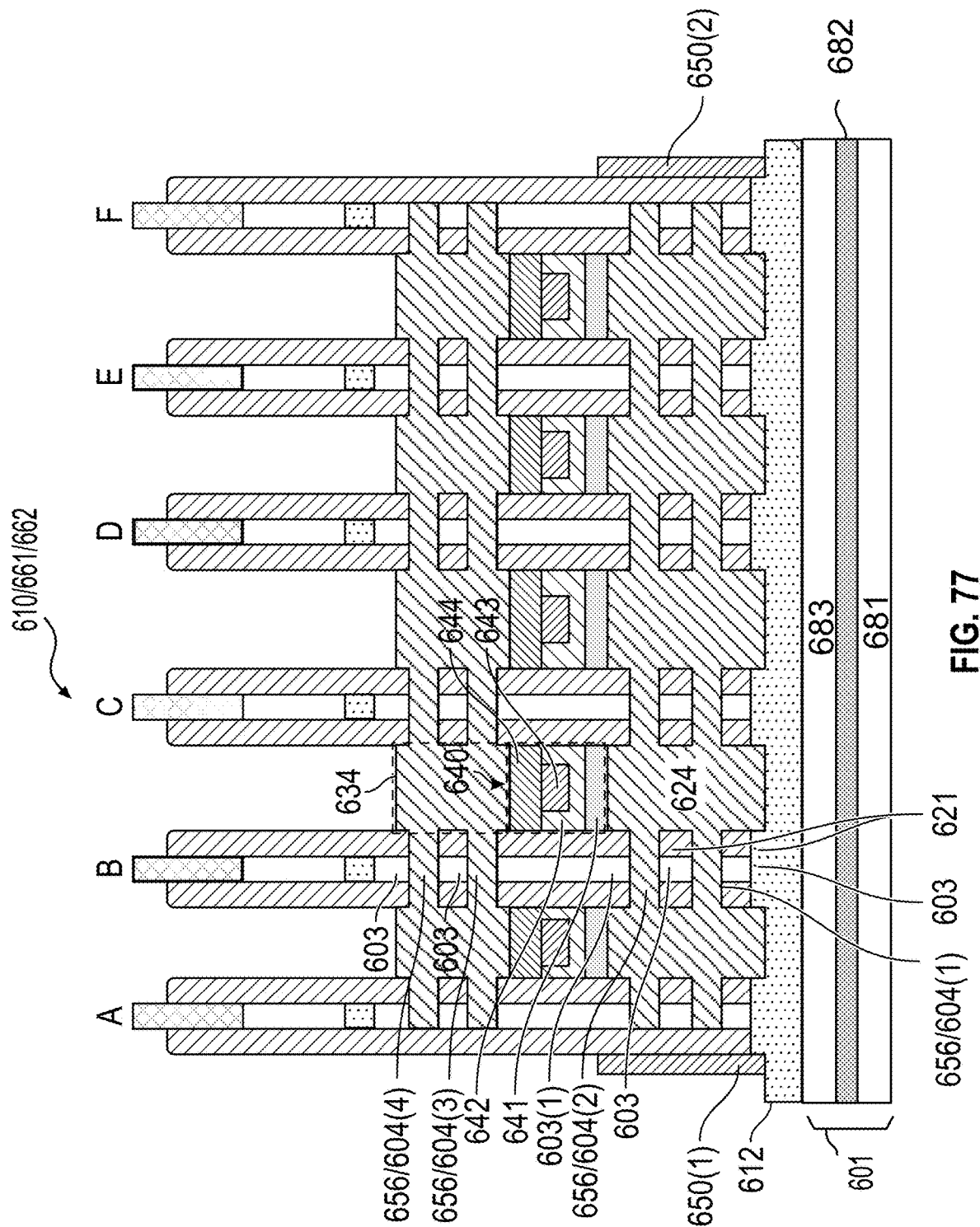

At S8636, referring to FIG. 77, the second upper S/D regions (also referred to as P+S/D regions or second upper S/D terminals) 634 can be formed over the second lower LI 640. In an example, the nitride spacer layer 626 is removed prior to forming the second upper S/D regions 634. Similarly as described above with reference to the second lower S/D regions 624, the second upper S/D regions 634 can be formed, for example, by Boron P+S/D epitaxial growth. Similar to the second lower S/D regions 624, in FIG. 77, two adjacent ones of the second upper S/D regions 634 are connected. Alternatively, the second upper S/D regions 634 can be grown/extended but not connected. For example, adjacent ones of the second upper S/D regions 634 are grown/extended but not connected along the Z direction and/or the Y direction.

Figure 78:
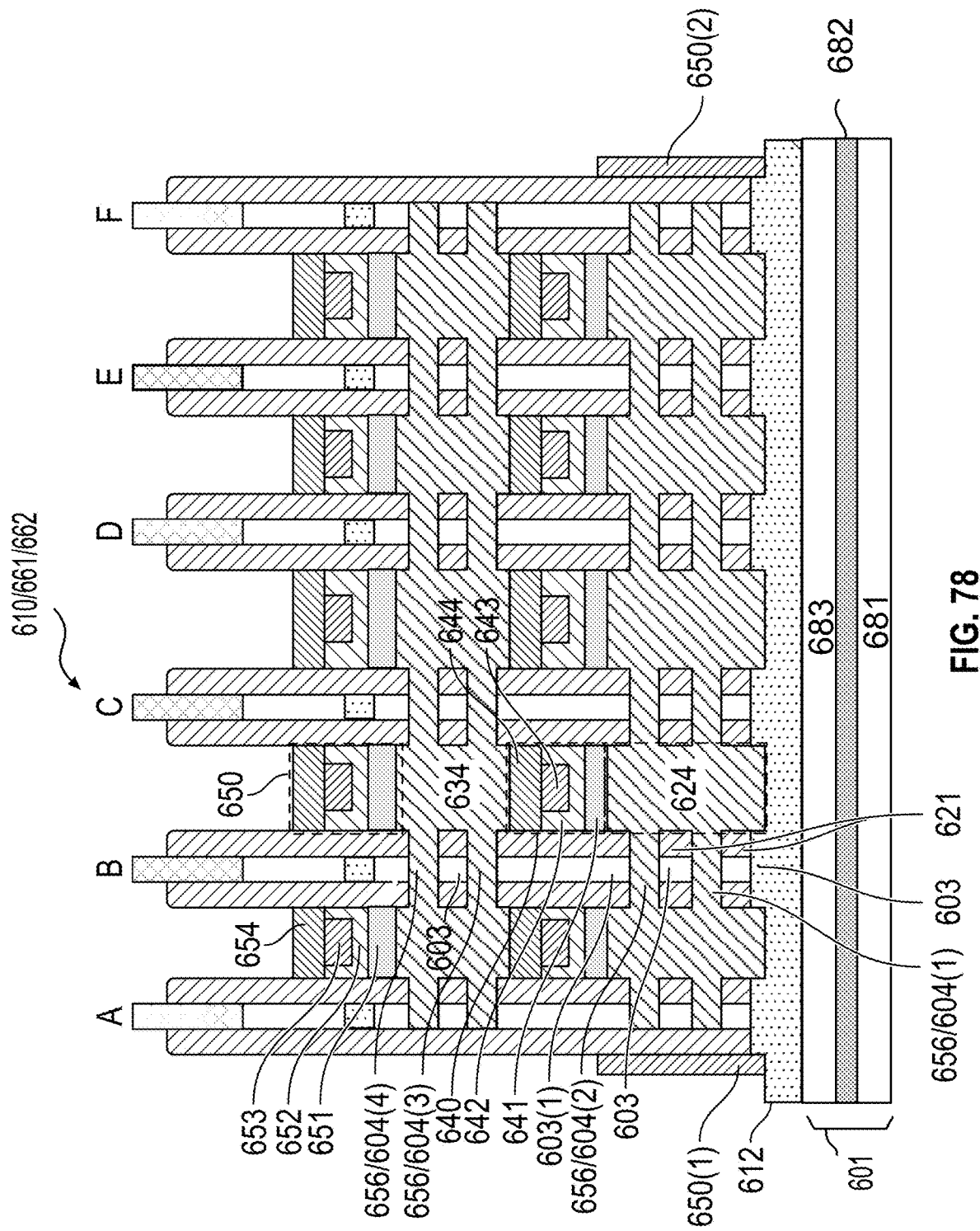

At S8638, referring to FIG. 78, a second upper LI 650 can be formed over the second upper S/D regions 634, similar as that described at S8616. The second upper LI 650 can include a Ti layer 651 that is selected deposited over the second upper S/D regions 634. The TI layer 651 may not deposit over other regions in the second stack 661 or the TI layer 651 is minimally deposited over the other regions in the second stack 661. The second upper LI 650 can include a TiN liner 652 that is deposited over the TI layer 651 and the regions 615. The second upper LI 650 can include a metal (e.g., Ru) layer 653 deposited over the TiN liner 652. Further, an etching process can etch back the metal (e.g., Ru) layer 653 and the TiN liner 652. Subsequently, a dielectric layer (e.g., an AlO layer) 654 can be deposited over the metal layer 653 and followed by a CMP process.

Figure 79:
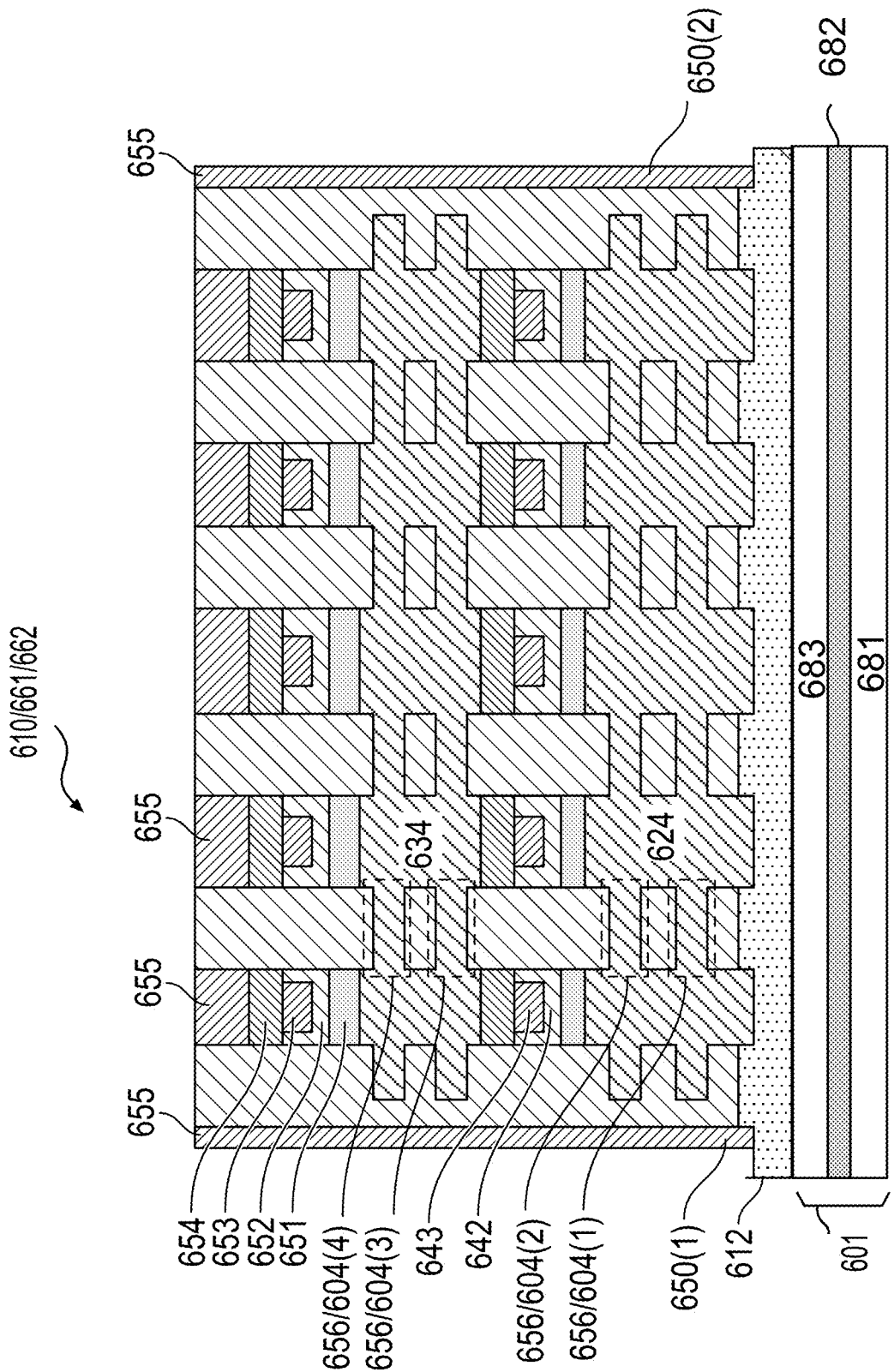

At S8640, referring to FIG. 79, the second channel regions 656 of the respective second MOS devices (e.g., PMOS devices) 675 can be released or exposed, for example, by removing (e.g., etching) the Si layers 603. In an example, a dielectric layer 655 can be formed over the second stack 661.

The second channel regions 656 can have any suitable structure (including shapes and dimensions) and material systems such that each of the second channel regions 656 can provide a semiconductor channel, such as a p-channel, when the second MOS device 675 is in operation.

Figure 80:
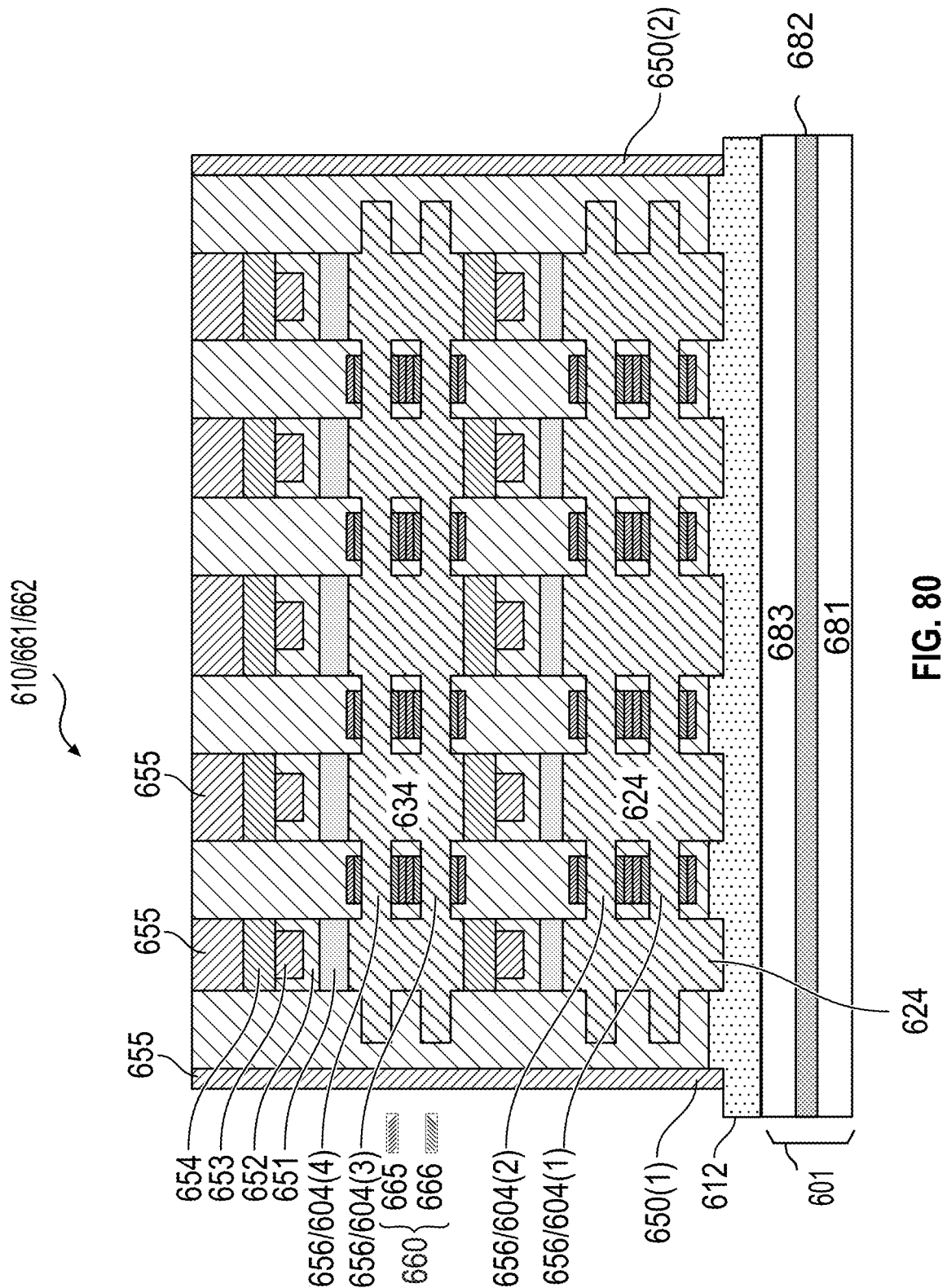

At S8642, referring to FIG. 80, second gate stacks (also referred to as second gate structures) 660 can be formed over the second channel regions 656. The second gate stacks 660 can include multiple layers, including any suitable dielectric layer(s) and any suitable conductive layer(s) (e.g., metal layer(s)). The conductive layer(s) can include one or more conductive materials, such as polysilicon, Cu, Ru, and/or the like. In an example, each of the second gate stacks 660 includes a high-K layer 666 and one or more metal layers (e.g., TiN, TaN) 665 formed over the respective second channel region 656. In an example, the high-K layer 666 is formed between the second channel region 656 and the one or more metal layers 665.

Each of the second gate stacks 660 can cover or surround the respective second channel region 656 in any suitable configuration, such as that used in GAA.

Figure 81:
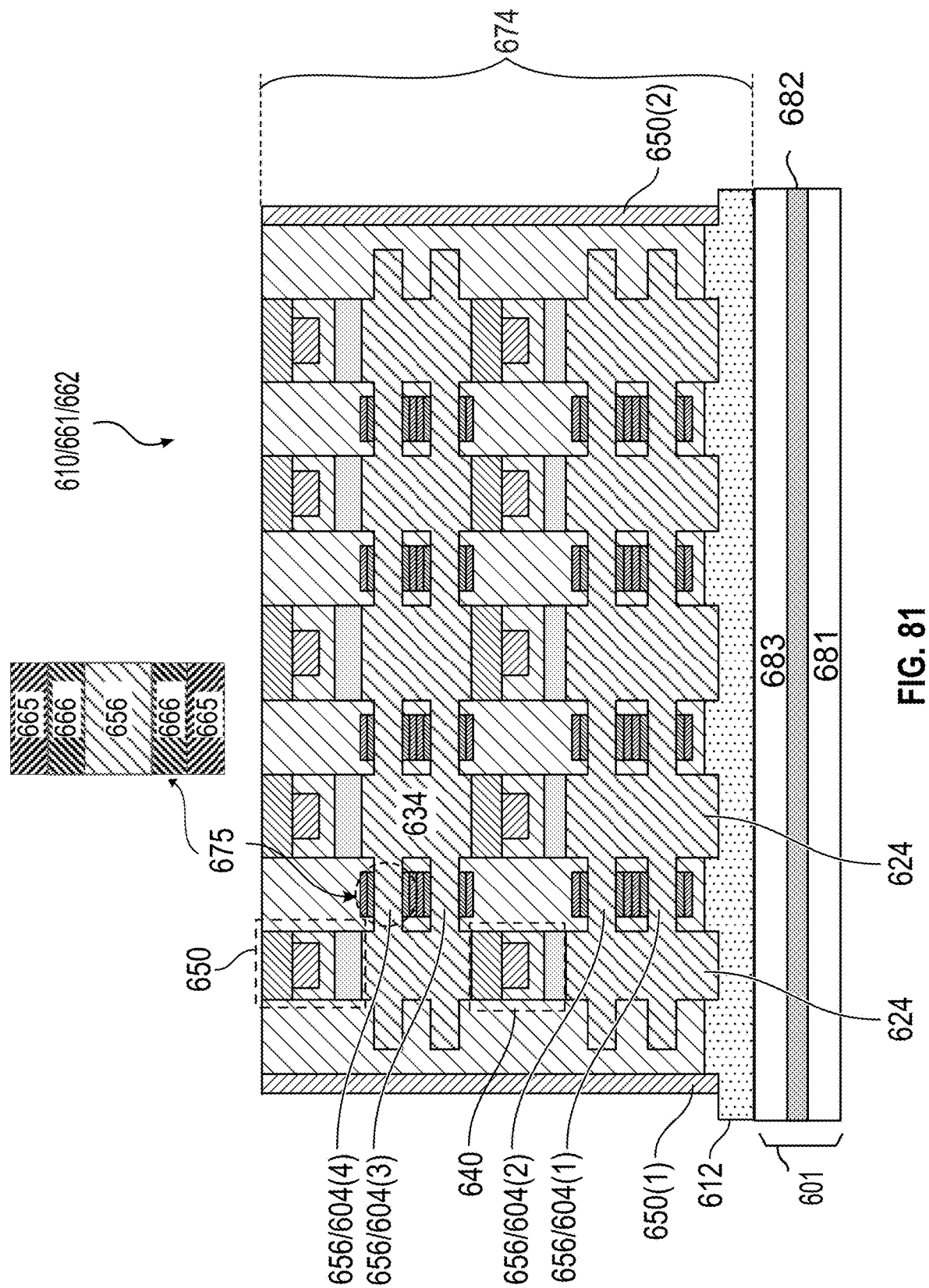

In an example, referring to FIG. 81, the dielectric layer 655 that is above the second stack 661 is removed. The second portion 610 includes a sub-portion 674. The sub-portion 674 can include the second MOS devices 675. In some examples, such as shown in FIG. 81, the sub-portion 674 includes LI(s) (e.g., the second lower LI 640 and the second upper LI 650).

Figure 82:
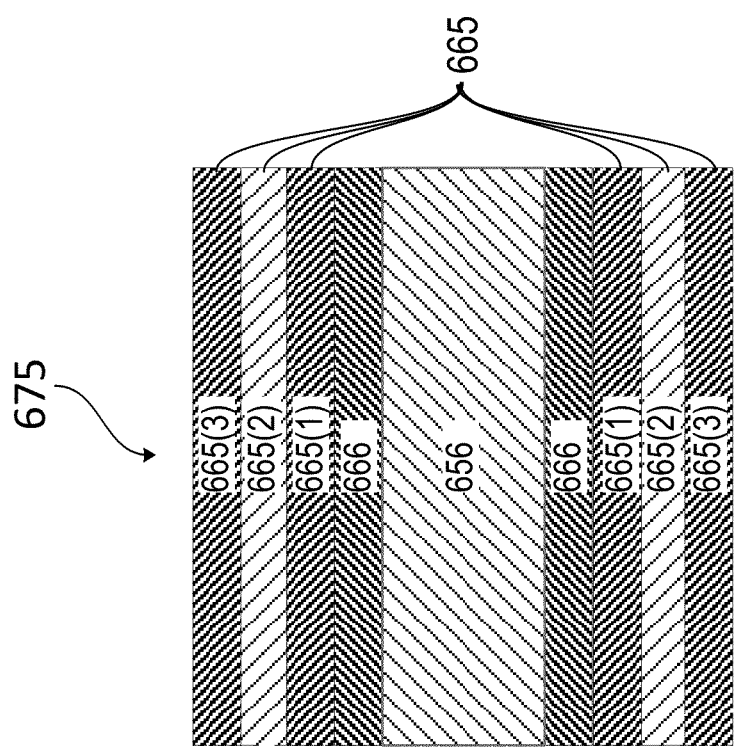

FIG. 82 shows an example of a portion of the second MOS device 675 according to an embodiment of the disclosure. The high-K layer 666 can have high dielectric constant material(s), such as a combination of an oxide layer and an AlO layer. The one or more metal layers 665 can include a TiN layer 665(1), a TaN layer 665(2), and a TiAl layer 665(3). The high-K layer 666 and the one or more metal layers 665 can wrap around the first channel region 656 that is formed from the P+ layer 604.

Figure 83:
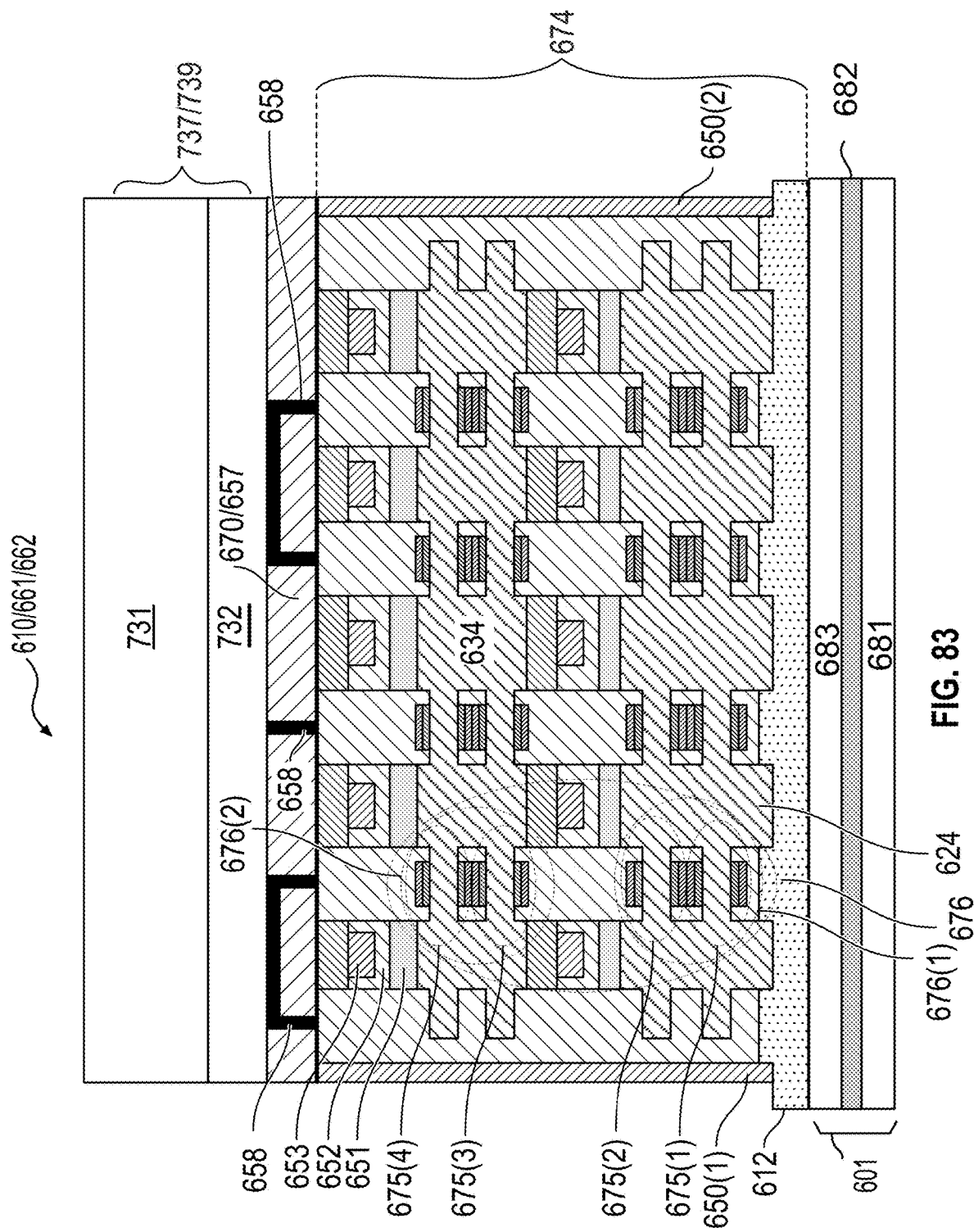

At S8644, referring to FIG. 83, a wiring layer (also referred to as metal layer) 670 can be formed over the sub-portion 674 in the second portion 610. In an example, a dielectric layer (e.g., an oxide layer) 657 can be deposited over the sub-portion 674 to form one or more wiring layers. Metal X routings 658 can be fabricated in the dielectric layer 657 to form the wiring layer 670. The metal X routings 658 can be formed using a dual damascene process for metal connections from the second MOS devices (e.g., PMOS devices) 675.

The second portion 610 can include the sub-portion 674. The sub-portion 674 can include multiple stacks 676 of the second MOS devices 675, as described above. Each stack 676 can include any suitable number of the second MOS devices 675, such as 2, 3, or more. The stack 676 includes four PMOS devices (e.g., 675(1)-(4)) in sub-stacks 676(1)-(2). For example, the second MOS devices 675(1)-(2) are in the sub-stack 676(1) and the second MOS devices 675(3)-(4) are in the sub-stack 676(2). The second MOS devices 675(1)-(2) include the respective second lower S/D regions 624 and the respective second channel regions 656. The second MOS devices 675(3)-(4) include the respective second upper S/D regions 634 and the respective second channel regions 656.

At S8646, referring to FIG. 83, a carrier substrate 739 can be attached to the second portion 610 on the second substrate 601, such as described above with reference to FIG. 21. In an example, the carrier substrate 739 is on a carrier wafer 737 and includes a bulk carrier substrate material 731 and a dielectric layer (e.g., an oxide layer) 732. The dielectric layer 732 can be attached to the wiring layer 670 that is above the sub-portion 674. In an example, the carrier wafer 737 is attached to the second wafer 662 where the second wafer 662 is different from the carrier wafer 737.

At S8648, referring to FIG. 84, the bulk substrate material (e.g., bulk Si) 681 can be removed from the second substrate 601 and a wiring layer 726 can be formed from the dielectric layer 682 in the second substrate 601, such as described with reference to FIGS. 22-23. In an example, the bulk substrate material (e.g., bulk Si) 681 opposite to the carrier wafer 737 is removed until reaching the dielectric layer 682 in the second substrate 601. Subsequently, the wiring layer (also referred to as a metal X routing layer) 726 can be formed based on the dielectric layer 682.

Figure 85A:
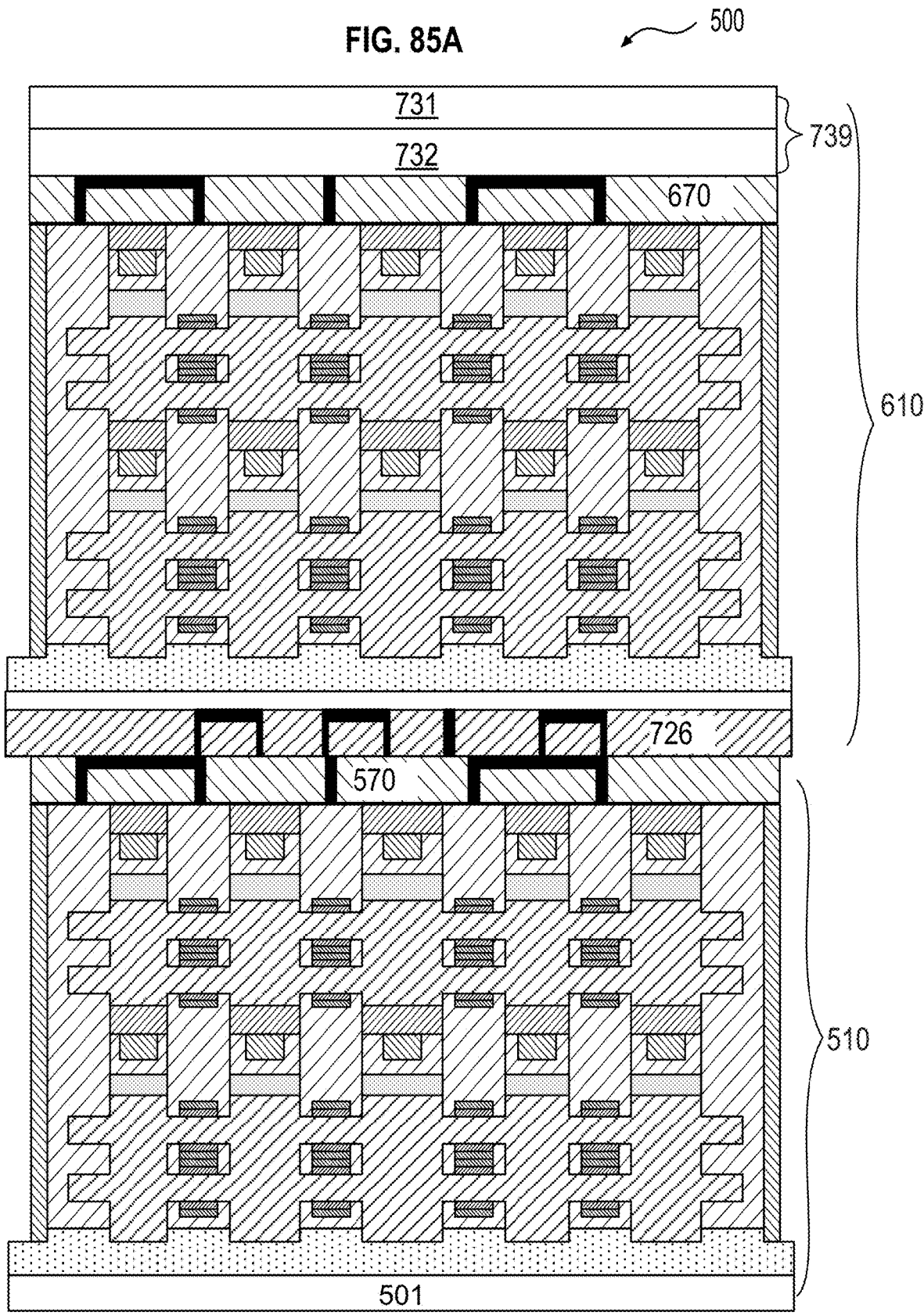

At S8650, referring to FIG. 85A, the first portion 510 on the first substrate 501 and the second portion 610 that is attached to the carrier substrate 739 can be bonded to form the semiconductor apparatus 500, as described above with reference to FIGS. 10, 11, 24, 25, 37, 38, 51, and 52. In an example, the wiring layer 570 in the first wafer 562 is bonded with the wiring layer 726 in the second wafer 662, such as disclosed in U.S. patent application Ser. No. 16/854,340.

Alternatively, any suitable bonding process (e.g., wafer bonding techniques, die bonding techniques) can be used to bond the first portion 510 and the second portion 620. In an example, the first portion 510 on the first wafer 562 is bonded to the second portion 620 that is attached to the carrier wafer 737, for example, by attaching the oxide layer closest to the metal x layer and bonding the first wafer 562 and the second wafer 662 together.

In an example, metal X routings for the first MOS devices (e.g., NMOS devices) 575 in the wiring layer 570 can be aligned and connected to corresponding metal X routings for the second MOS devices (e.g., PMOS devices) 675 in the wiring layer 726. The metal X routings are shown for illustration purpose and may not reflect a specific circuit. Any suitable metal X routings can be formed based on device performance/fabrication requirements of the semiconductor apparatus 500.

As described above with reference to FIGS. 12, 26, 39, and 53, the bulk carrier substrate material 731 can be removed to reduce a thickness of the carrier substrate 739. In an example, as described above with reference to FIGS. 13A, 27, 40, and 54, the dielectric layer 732 can be removed from the carrier substrate 739.

Figure 85B:
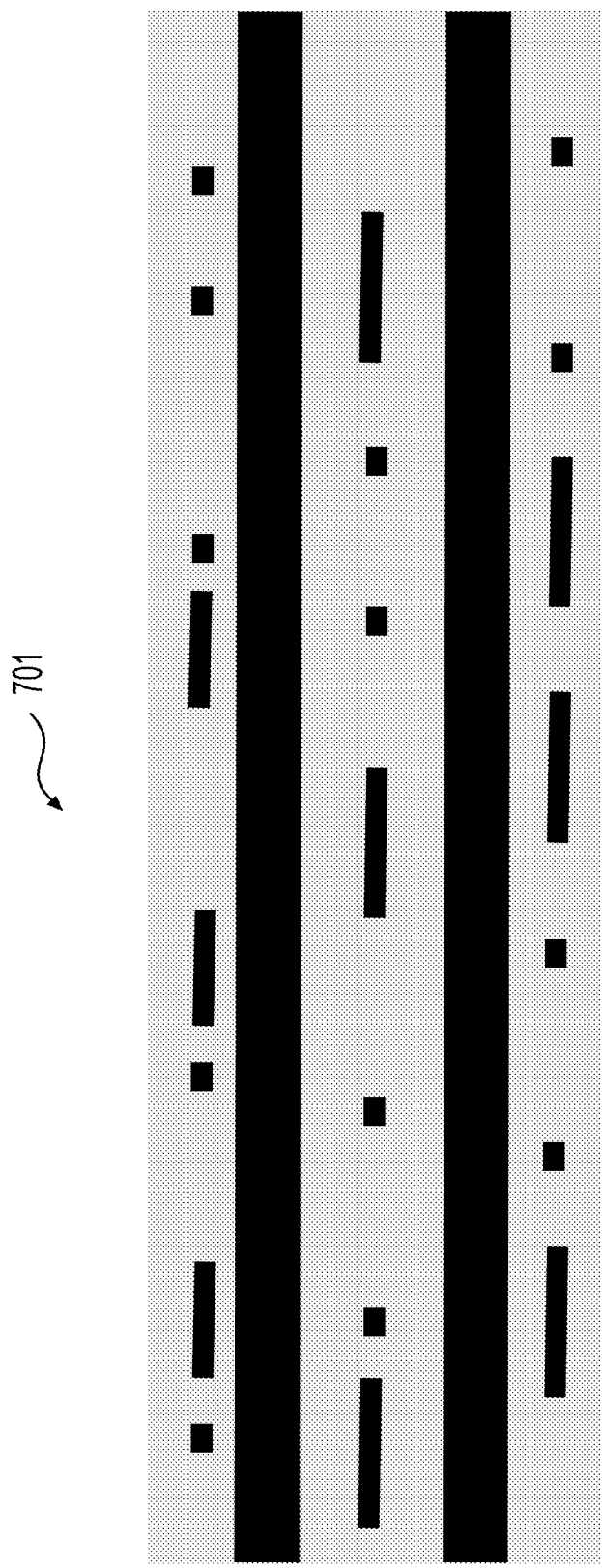

Optionally, more layers may be added depending on circuit requirements or design. Power rail(s) 701, such as shown in FIG. 85B, can be added to a middle of the PMOS devices. The power rail(s) 701 can be used as ground or power to the first MOS devices (e.g., NMOS devices) 575 and the second semiconductor devices (e.g., PMOS devices) 675. Connections can be made from one of the first MOS devices 575 and the second MOS devices (e.g., an FET) 675 to one of the power rail(s) 701.

Figure 84:
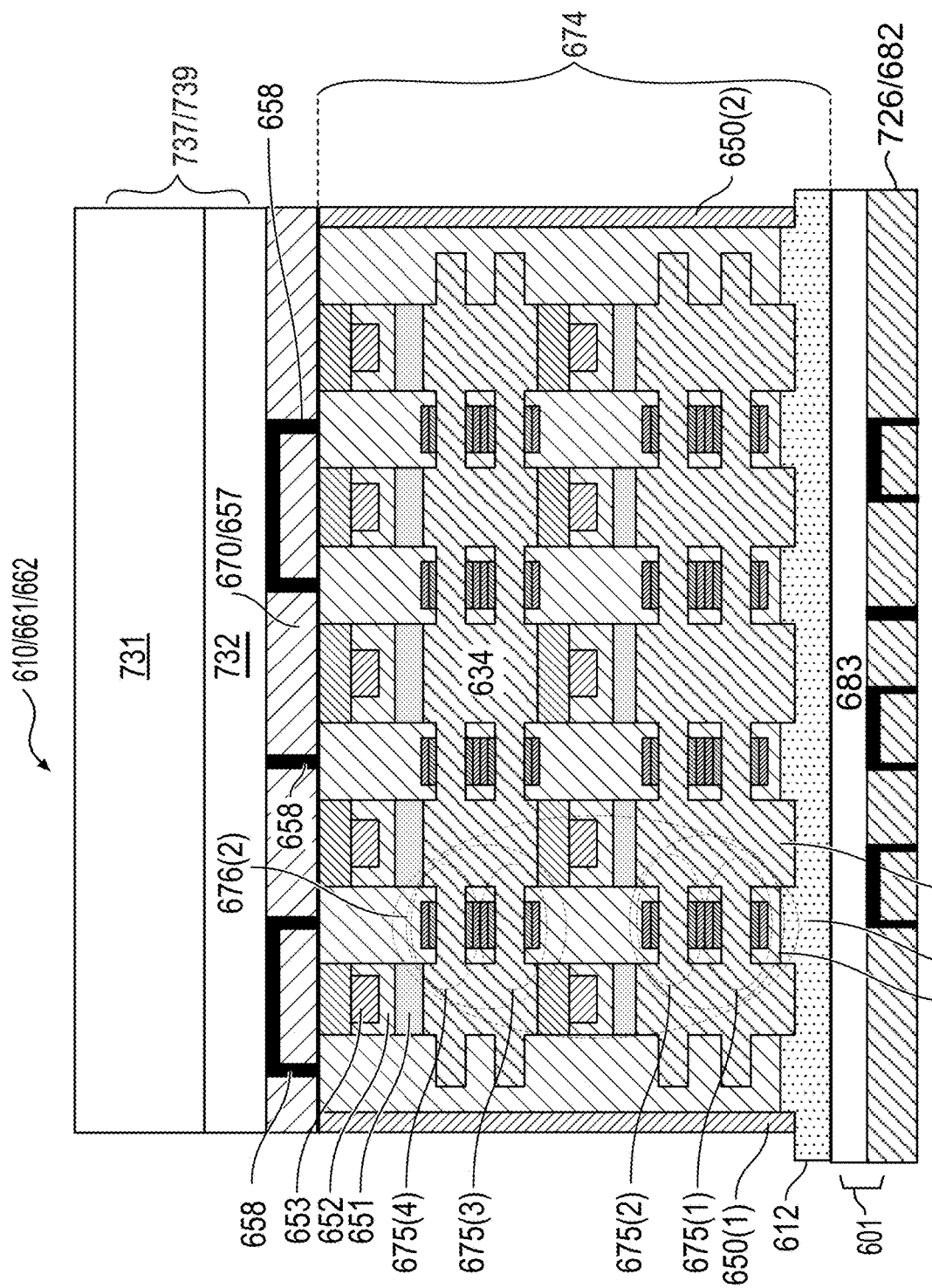

Referring FIGS. 73, 84, and 85A, the semiconductor apparatus 500 includes the first portion 510 that is formed on the first substrate 501 in the first wafer 562 and the second portion 610 that is formed on the second substrate 601 in the second wafer 662. The first portion 510 can include the sub-portion 574 and the wiring layer 570. The second portion 610 can include the sub-portion 674 and the wiring layers 726 and 670.

Referring to FIGS. 70, 73, 80, 84, and 85A, the sub-portion 574 can include the first MOS devices 575 (e.g., NMOS devices). The device performance of the first MOS devices 575 can be optimized for NMOS devices. For example, the first substrate 501, characteristics (e.g., doping, thicknesses) of the N+ Si layers 504, characteristics (e.g., structures, dimensions, materials of the first channel regions 556, the first gate stacks 560, and the first S/D regions) of the first MOS devices 575, and/or the like can be optimized for NMOS devices. Similarly, the sub-portion 674 can include the second MOS devices 675 (e.g., PMOS devices). The device performance of the second MOS devices 675 can be optimized for PMOS devices. For example, the second substrate 601, characteristics (e.g., doping, thicknesses) of the P+ Si layers 604, characteristics (e.g., structures, dimensions, materials of the second channel regions 656, the second gate stacks 660, and the second S/D regions) of the second MOS devices 675, and/or the like can be optimized for PMOS devices.

Since the first MOS devices 575 and the second MOS devices 675 are fabricated on different wafers or different substrates, such as the first wafer 562 and the second wafer 662 (or the first substrate 501 and the second substrate 601), respectively, the first MOS devices 575 and the second MOS devices 675 can be optimized separately and independently from each other. For example, high mobility can be achieved for both the first MOS devices (e.g., NMOS) 575 and the second MOS devices (e.g., PMOS) 675. Accordingly, in some examples, the fabrication process of the semiconductor apparatus 500 that includes both the first MOS devices 575 and the second MOS devices 675 can be simplified while maintaining optimized performance of the semiconductor apparatus 500.

Accordingly, techniques herein can provide high-performance 3D CMOS apparatuses or devices with flexibility as to material choice and a reduced device area. Advantages can also include high performance 3D stacking of wafers with high mobility channels using optimum substrates and nano plane materials. Stacking techniques can enable close proximity circuit element connections between adjacent silicon planes.

The process flow 8600 can also be adapted to fabricate the semiconductor apparatus 100, 300, and 400, for example, by using a different combination of substrates and nanosheets to optimize mobility.

The process flow 8600 can also be adapted to fabricate a different semiconductor apparatus including a stack of semiconductor devices stacked along the Z direction. The semiconductor devices in the semiconductor apparatus can be fabricated based on different semiconductor wafers. The semiconductor wafers can include any substrates, such as a single bulk material, a combination of multiple layers over a single bulk material, or the like.

As described above, the number M of devices fabricated in a stack of semiconductor devices along the Z direction on one wafer (e.g., the first wafer 235, the second wafer 236) can be 1, 2, . . . , 8, or more. Further, any suitable semiconductor devices (e.g., FET, nFET, pFET, NMOS, PMOS, and/or the like) can be fabricated on the wafer.

The process flows 1400 and 8600 show examples where a semiconductor apparatus (e.g., the semiconductor apparatus 200) can be fabricated based on two semiconductor wafers (e.g., the first wafer 235 and the second wafer 236). The process flows 1400 and 8600 can be adapted to fabricate a semiconductor apparatus based on more than two semiconductor wafers. For example, additional portion(s) (e.g., a third portion fabricated on a third substrate based on a third wafer) can be stacked over the wiring plane 225 in the semiconductor apparatus 200 shown in FIG. 27 by repeating steps in the process flow 1400. A number L of the portions in the semiconductor apparatus can be any suitable number, such as 2, 3, 10, or the like. Accordingly, when M devices are stacked in each wafer along the Z direction and devices fabricated on L wafers are stacked along the Z direction, a combined stack can include M×L devices stacked along the Z direction. Thus, L wafers where each includes M nano planes having components that are optimized for NMOS and PMOS devices can be combined to achieve high performance 3D circuits. In an example, M is 8 and L is 10, and 80 single crystal Si or Ge based nano planes can be used.

In addition to stacking PMOS devices over NMOS devices or stacking NMOS devices over PMOS devices, first PMOS devices on a first wafer can be stacked over second PMOS devices on a second wafer. Alternatively, first NMOS devices on a first wafer can be stacked over second NMOS devices on a second wafer.

As used in the disclosure, a semiconductor apparatus, such as the semiconductor apparatus 100, 200, 300, 400, and 500, can include transistors (e.g., FETs and floating-gate transistors), integrated circuits, a semiconductor chip (e.g., memory chip including a 3D NAND memory device, a logic chip on a semiconductor die), a stack of semiconductor chips, a semiconductor package, a semiconductor wafer, a die, and/or the like.

In general, a semiconductor apparatus fabricated using the process flow 1400 or the process flow 8600 can vary from the semiconductor apparatuses 100, 200, 300, 400, and 500. For example, one or more of the wiring layers can be excluded. Referring to FIG. 54, one (e.g., the wiring layer 415) or both of the wiring layers 415 and 426 may be excluded. Alternatively, additional wiring layer(s) can be added. In some examples, referring to FIG. 54, additional dielectric layer(s) can be added between the first portion 410 and the second portion 420. In an example, a buried power rail can be formed between the first portion 410 and the second portion 420. Due to the stacking structure, close circuit element connections can be made between adjacent Si planes.

In the manufacture of a semiconductor apparatus (e.g., on a microscopic scale), various fabrication processes can be implemented. The fabrication processes can include film-forming depositions, etch mask creation, patterning, material etching and removal, doping treatments, and/or the like. The fabrication processes can be performed repeatedly to form desired semiconductor device elements or components on a substrate of the semiconductor apparatus.

An order of description of different embodiments or steps in the present disclosure is presented for clarity sake. In general, the embodiments or steps can be performed in any suitable order. Additionally, although each of the embodiments, such as different features, techniques, configurations, and/or the like may be described in different places of the present disclosure, it is intended that each of the embodiments can be executed independently of each other or in combination with each other. Accordingly, the present disclosure can be embodied and viewed in many different ways.

The embodiments in the present disclosure are described with certain details, such as a particular geometry, a circuit schematic, and/or the like. It should be understood, however, that techniques herein may be practiced in other embodiments that depart from these specific details, and that such details are for purposes of explanation and not limitation. In general, the embodiments can be applicable in forming a transmission gate pair including a first transmission gate and a second transmission gate. The first transmission gate can be controlled by a pair of signals (e.g., a pair of inverted signals) that are inverted from each other. The second transmission gate can also be controlled by the pair of inverted signals. Further, each one of the pair of inverted signals can control two transistors where one of the two transistors is in the first transmission gate (corresponding to a first signal path) and another one of the two transistors is in the second transmission gate (corresponding to a second signal path).

The embodiments can be suitably adapted to a 3D semiconductor apparatus that can include additional 3D devices, such as a stacked SRAM as well as for other transistor types.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A method of forming a semiconductor apparatus, comprising:
    forming a first portion of the semiconductor apparatus on a first substrate, the first portion including at least one first semiconductor device;

forming a second portion of the semiconductor apparatus on a second substrate, the second portion including at least one second semiconductor device, the second substrate including a bulk substrate material and a first dielectric layer over the bulk substrate material;

attaching a carrier substrate to the second portion of the semiconductor apparatus, the at least one second semiconductor device being between the carrier substrate and the second substrate;

removing the bulk substrate material from the second substrate;

forming a first wiring layer from the first dielectric layer in the second substrate; and bonding the first portion and the second portion to form the semiconductor apparatus, the at least one second semiconductor device being stacked above the at least one first semiconductor device along a Z direction that is substantially perpendicular to a substrate plane of the first substrate, and the at least one first semiconductor device and the at least one second semiconductor device being positioned between the carrier substrate and the first substrate.

2. The method of claim 1, wherein
forming the first portion of the semiconductor apparatus includes forming the first portion on the first substrate of a first wafer; and
forming the second portion of the semiconductor apparatus includes forming the second portion on the second substrate of a second wafer, the second wafer being different from the first wafer and the second substrate being different from the first substrate.

3. The method of claim 2, wherein
the at least one first semiconductor device includes a first stack of one of NMOS devices and PMOS devices stacked along the Z direction, first channel regions in the first stack being formed by a first epitaxial growth; and
the at least one second semiconductor device includes a second stack of another one of the NMOS devices and the PMOS devices stacked along the Z direction, second channel regions in the second stack being formed by a second epitaxial growth that is different from the first epitaxial growth.

4. The method of claim 2, wherein
the at least one first semiconductor device includes a first stack of devices stacked along the Z direction, first channel regions in the first stack being formed by a first epitaxial growth, the first stack of device being one of: (a) a stack of NMOS devices, (b) a stack of PMOS devices, and (c) a stack of NMOS and PMOS devices; and
the at least one second semiconductor device includes a second stack of devices stacked along the Z direction, the second stack of device being one of: (a) a stack of NMOS devices, (b) a stack of PMOS devices, and (c) a stack of NMOS and PMOS devices, second channel regions in the second stack being formed by a second epitaxial growth that is different from the first epitaxial growth.

5. The method of claim 1, wherein
the carrier substrate further includes a second dielectric layer; and
attaching the carrier substrate includes attaching the second dielectric layer in the carrier substrate to the second portion.

6. The method of claim 1, wherein
forming the second portion of the semiconductor apparatus includes forming a second wiring layer over the at least one second semiconductor device, the at least one second semiconductor device positioned between the second substrate and the second wiring layer; and
attaching the carrier substrate to the second portion includes attaching the carrier substrate to the second wiring layer in the second portion.

7. The method of claim 1, further comprising:
after bonding the first portion and the second portion to form the semiconductor apparatus, removing the carrier substrate.

8. The method of claim 7, wherein
forming the first portion of the semiconductor apparatus includes forming a third wiring layer over the at least one first semiconductor device, the at least one first semiconductor device being between the third wiring layer and the first substrate; and
bonding the first portion and the second portion includes bonding the first wiring layer and the third wiring layer.

9. The method of claim 8, wherein one of the first wiring layer and the third wiring layer includes a power rail.

10. The method of claim 7, wherein
the at least one first semiconductor device includes a NMOS device;
the at least one second semiconductor device includes a PMOS device;
the carrier substrate further includes a second dielectric layer;
forming the first portion of the semiconductor apparatus includes:
  forming a first channel region in the at least one first semiconductor device by a first epitaxial growth; and
  forming a third wiring layer over the at least one first semiconductor device, the at least one first semiconductor device positioned between the third wiring layer and the first substrate;
forming the second portion of the semiconductor apparatus further includes:
  forming a second channel region in the at least one second semiconductor device by a second epitaxial growth that is different from the first epitaxial growth; and
  forming a second wiring layer over the at least one second semiconductor device, the at least one second semiconductor device positioned between the second substrate and the second wiring layer;
attaching the carrier substrate to the second portion includes attaching the second dielectric layer in the carrier substrate to the second wiring layer in the second portion; and
bonding the first portion and the second portion further includes:
  positioning the first wiring layer in contact with the third wiring layer to align the at least one first semiconductor device with the at least one second semiconductor device; and
  bonding the first portion and the second portion at an interface between the first wiring layer and the third wiring layer.

11. The method of claim 10, wherein
the first substrate includes a bulk substrate material that is Si; and
forming the second portion of the semiconductor apparatus includes forming the at least one second semiconductor device over a layer of single crystal Si, the second substrate further including the layer of the single crystal Si stacked over the first dielectric layer in the second substrate.

12. The method of claim 10, wherein the first substrate includes a bulk substrate material that is Si; and forming the second portion of the semiconductor apparatus includes forming the at least one second semiconductor device over a layer of a single crystal semiconductor material that is Ge or SiGe, the second substrate further including the layer of the single crystal semiconductor material stacked over the first dielectric layer in the second substrate.

13. The method of claim 10, wherein forming the first portion of the semiconductor apparatus includes forming the at least one first semiconductor device over a layer of a first single crystal semiconductor material that is Si or SiC, the first substrate including the layer of the first single crystal semiconductor material stacked over a third dielectric layer; and forming the second portion of the semiconductor apparatus includes forming the at least one second semiconductor device over a layer of a second single crystal semiconductor material that is Ge or SiGe, the second substrate including the layer of the second single crystal semiconductor material stacked over the first dielectric layer in the second substrate.

14. The method of claim 7, wherein the at least one first semiconductor device includes a PMOS device;

the at least one second semiconductor device includes a NMOS device;

the carrier substrate further includes a second dielectric layer;

forming the first portion of the semiconductor apparatus includes forming a first channel region in the at least one first semiconductor device by a first epitaxial growth; and forming the second portion of the semiconductor apparatus includes:

forming the at least one second semiconductor device over a layer of a single crystal semiconductor material that is Si or SiC, the second substrate including the layer of the single crystal semiconductor material stacked over the first dielectric layer in the second substrate, a second channel region in the at least one second semiconductor device formed by a second epitaxial growth that is different from the first epitaxial growth; and forming a second wiring layer over the at least one second semiconductor device, the at least one second semiconductor device positioned between the second wiring layer and the second substrate; and attaching the carrier substrate to the second portion includes attaching the second dielectric layer in the carrier substrate to the second wiring layer in the second portion.

15. The method of claim 14, wherein forming the first portion includes forming a third wiring layer over the at least one first semiconductor device, the at least one first semiconductor device positioned between the third wiring layer and the first substrate; and bonding the first portion and the second portion further includes:

positioning the first wiring layer in contact with the third wiring layer to align the at least one first semiconductor device with the at least one second semiconductor device; and bonding the first portion and the second portion at an interface between the first wiring layer and the third wiring layer.

16. The method of claim 1, wherein the first substrate includes a first layer of a first single crystal semiconductor material stacked on a third dielectric layer; and forming the first portion of the semiconductor apparatus includes forming the at least one first semiconductor device over the first layer of the first single crystal semiconductor material that is silicon (Si) or silicon carbide (SiC).

17. The method of claim 1, wherein the second substrate further includes a second layer of a second single crystal semiconductor material stacked on the first dielectric layer that is on the bulk substrate material; and forming the second portion of the semiconductor apparatus includes forming the at least one second semiconductor device over the second layer of the second single crystal semiconductor material that is Si, SiC, germanium (Ge), or silicone germanium (SiGe).

18. The method of claim 1, wherein the at least one first semiconductor device includes one of a NMOS device and a PMOS device;

the at least one second semiconductor device includes another one of the NMOS device and the PMOS device;

forming the first portion includes forming a first channel region in the at least one first semiconductor device by a first epitaxial growth; and formingg the second portion includes forming a second channel region in the at least one second semiconductor device by a second epitaxial growth that is different from the first epitaxial growth.

19. The method of claim 1, wherein forming the first portion of the semiconductor apparatus includes forming the first portion on the first substrate of a first wafer; and forming the second portion of the semiconductor apparatus includes forming the second portion on the second substrate of a second wafer, the second wafer being different from the first wafer.

20. The method of claim 19, wherein the at least one first semiconductor device includes a first stack of one of NMOS devices and PMOS devices stacked along the Z direction, first channel regions in the first stack being formed by a first epitaxial growth; and the at least one second semiconductor device includes a second stack of another one of the NMOS devices and the PMOS devices stacked along the Z direction, second channel regions in the second stack being formed by a second epitaxial growth that is different from the first epitaxial growth.

* * * * *

UNITED STATES PATENT AND TRADEMARK OFFICE
CERTIFICATE OF CORRECTION

PATENT NO. : 11,610,993 B2
APPLICATION NO. : 17/062142
DATED : March 21, 2023
INVENTOR(S) : Gardner et al.

It is certified that error appears in the above-identified patent and that said Letters Patent is hereby corrected as shown below:

In the Claims

In Column 33, Claim 1, Line 5, delete "hulk substrate material:" and insert -- bulk substrate material; --, therefor.

In Column 36, Claim 18, Line 39, delete "formingg" and insert -- forming --, therefor.

Signed and Sealed this
Twenty-first Day of November, 2023

Katherine Kelly Vidal
*Director of the United States Patent and Trademark Office*